(12) United States Patent
Takahashi

(10) Patent No.: US 8,310,044 B2
(45) Date of Patent: Nov. 13, 2012

(54) SEMICONDUCTOR DEVICE AND METHOD OF MANUFACTURING THE SAME

(75) Inventor: Noriyuki Takahashi, Nanae (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/962,625

(22) Filed: Dec. 7, 2010

(65) Prior Publication Data

US 2011/0133329 A1    Jun. 9, 2011

(30) Foreign Application Priority Data

Dec. 8, 2009  (JP) ................................. 2009-278214

(51) Int. Cl.
  *H01L 23/34* (2006.01)
  *H01L 21/60* (2006.01)
(52) U.S. Cl. .................. 257/712; 257/713; 257/E23.08; 257/E21.506; 438/122
(58) Field of Classification Search .................. 257/712, 257/713, E23.08, E21.506; 438/122
See application file for complete search history.

(56) References Cited

U.S. PATENT DOCUMENTS

| | | | | |
|---|---|---|---|---|
| 5,583,377 A | * | 12/1996 | Higgins, III | 257/707 |
| 5,991,156 A | * | 11/1999 | Bond et al. | 361/707 |
| 6,683,795 B1 | * | 1/2004 | Yoo | 361/816 |

FOREIGN PATENT DOCUMENTS

JP    11-163230 A    6/1999

* cited by examiner

*Primary Examiner* — Peniel M Gumedzoe
(74) *Attorney, Agent, or Firm* — Miles & Stockbridge P.C.

(57) ABSTRACT

The heat-release properties of semiconductor device are to be improved and the reliability thereof is to be improved.
The semiconductor device has a wiring substrate, a heat-releasing plate having a convex part inserted into a through-hole of the wiring substrate, a semiconductor chip mounted over the convex part of the heat-releasing plate, and a bonding wire coupling an electrode pad of the semiconductor chip with a bonding lead of the wiring substrate, and further has a sealing portion covering a portion of an upper surface of the wiring substrate, a sealing portion covering a portion of a lower surface of the wiring substrate including the semiconductor chip and the bonding wire, and a solder ball placed over a lower surface of the wiring substrate. In manufacturing the semiconductor device, the heat-releasing plate is positioned at the upper surface side of the wiring substrate such that the convex part is positioned in the through-hole, and a groove in the main surface of the convex part is forcibly widened to swage the convex part and to be fixed to the wiring substrate.

19 Claims, 64 Drawing Sheets

SEMICONDUCTOR DEVICE AND METHOD OF MANUFACTURING THE SAME

CROSS-REFERENCE TO RELATED APPLICATION

The disclosure of Japanese Patent Application No. 2009-278214 filed on Dec. 8, 2009 including the specification, drawings and abstract is incorporated herein by reference in its entirety.

BACKGROUND OF THE INVENTION

The present invention relates to a semiconductor device and a method of manufacturing thereof, and in particular, to a technology effective for a highly heat-releasing semiconductor package and a method of manufacturing thereof.

A BGA package type semiconductor device is manufactured by mounting a semiconductor chip over a wiring substrate, by coupling electrically an electrode of the semiconductor chip with a coupling terminal of the wiring substrate through the use of a bonding wire, by sealing the semiconductor chip and the bonding wire with a resin, and then by connecting a solder ball with the rear surface of the wiring substrate.

Japanese Patent Laid-Open No. 1999-163230 (Patent Document 1) describes the technology of semiconductor device in which a semiconductor chip is placed in a face-down position within an opening of the package substrate, the rear surface of the semiconductor chip and the rear surface of the package substrate are brought into contact with a thermal-conducting member, and the bonding pad over the semiconductor chip is coupled with an external terminal of the package substrate.

SUMMARY OF THE INVENTION

The study of the inventor of the present invention derived the following findings.

A semiconductor device which uses a wiring substrate having an insulation layer and mounts a semiconductor chip over the wiring substrate has lower heat-release properties than that of a semiconductor device which uses a lead frame made of metal and mounts a semiconductor chip over the lead frame.

Accordingly, as a measure against heat release from a semiconductor device using a wiring substrate, there can be considered a method of locating an external terminal (solder bump) for heat release over the mounting surface of the wiring substrate, and of releasing the heat from the semiconductor device to the mounting substrate (mounting substrate on which the semiconductor device is mounted) via the heat-releasing external terminal.

In the case of that type of semiconductor device, however, there is required, also at the side of the mounting substrate, placing a bump land (electrode pad) coupled with the heat-releasing external terminal directly thereon, which lowers the freedom of wiring layout over the mounting substrate.

Consequently, the inventor of the present invention has studied the fixing of a heat-releasing plate made of metal as the thermal-conducting member to the wiring substrate, as described in Patent Document 1, and the mounting of the semiconductor chip over the heat-releasing plate. The structure of Patent Document 1 would allow not only the improvement of the heat-release properties, but also the additional improvement of the heat-release properties by connecting other heat-releasing member (heat sink) with the heat-releasing plate after mounting the semiconductor device over the mounting substrate.

However, according to the method of attaching the heat-releasing plate to the wiring substrate as described in Patent Document 1, it was found that the heat-releasing plate is separated from the wiring substrate in some cases owing to the heat generated in mounting the semiconductor chip over the heat-releasing plate or to the effect of load. A cause of the phenomenon is the difference in the thermal expansion coefficient between the wiring substrate and the heat-releasing plate. Thermal effect causes expansion and shrinkage in each of the wiring substrate and the heat-releasing plate. Since the magnitude of expansion and of shrinkage differ in each of the wiring substrate and the heat-releasing plate, the stress is focused on the adhesion layer to cause fracture at the adhesion layer. In inserting the protruded chip-mounting part (the chip-mounting part of the heat-releasing plate) into the through-hole of the wiring substrate, a gap is preliminarily formed between the side surface of the chip-mounting part and the inside wall of the through-hole of the wiring substrate for the convenience of insertion of the heat-releasing plate into the wiring substrate, which weakens the holding force of heat-releasing plate.

The present invention has been made in view of the above circumstances and provides a technology capable of improving the heat-releasing characteristics of semiconductor device.

Furthermore, the present invention has been made in view of the above circumstances and provides a technology capable of improving the reliability of semiconductor device capable of improving the reliability of semiconductor device.

The other purposes and the new feature of the present invention will become clear from the description of the present specification and the accompanying drawings.

The following explains briefly the outline of a typical invention among the inventions disclosed in the present application.

According to a method of manufacturing semiconductor device in a typical embodiment, the heat-releasing plate is positioned over the first main surface of the wiring substrate so that the side surface of the convex part of the heat-releasing plate faces the inside wall of the through-hole of the wiring substrate, and then the groove formed in the main surface of the convex part of the heat-releasing plate is forcibly widened to bring a portion of the side surface of the convex part of the heat-releasing plate to contact with the inside wall of the through-hole of the wiring substrate, and to thereby fix the heat-releasing plate to the wiring substrate.

The following explains briefly the effect acquired by the typical invention among the inventions disclosed in the present application.

The typical embodiments can improve the heat-release properties of semiconductor device.

Furthermore, the typical embodiments can improve the reliability of semiconductor device.

DETAILED DESCRIPTION OF THE PREFERRED EMBODIMENTS

Figure 1:
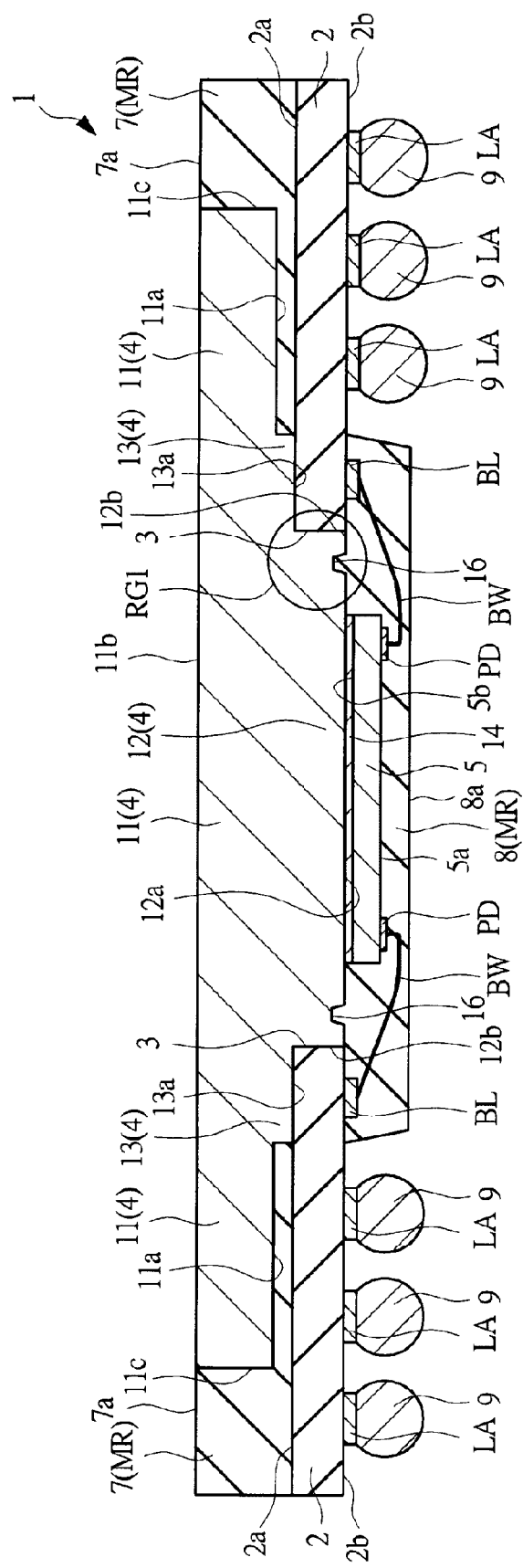
FIG. 1 is a cross-sectional view of a semiconductor device in an embodiment of the present invention.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another. In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically. Furthermore, in the following embodiments, it is needless to say that an element (including an element step etc.) is not necessarily indispensable, except for the case where it is clearly specified in particular and where it is considered to be clearly indispensable from a theoretical point of view, etc. Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

The embodiments of the present invention will be described below in detail referring to the drawings. In all the drawings for explaining embodiments, the same symbol is attached to the same member, as a principle, and the repeated explanation thereof is omitted. In the following embodiments, description about the same or similar part is not repeated, in principle, other than the case specifically required.

In order to make a drawing intelligible, hatching may not be attached even if it is a cross-sectional view, and hatching may be attached even if it is a plan view.

Embodiment 1

The semiconductor device and the method of manufacturing thereof (manufacturing process) according to an embodiment of the present invention are described below referring to the drawings.

<Structure of Semiconductor Device>

Figure 2:
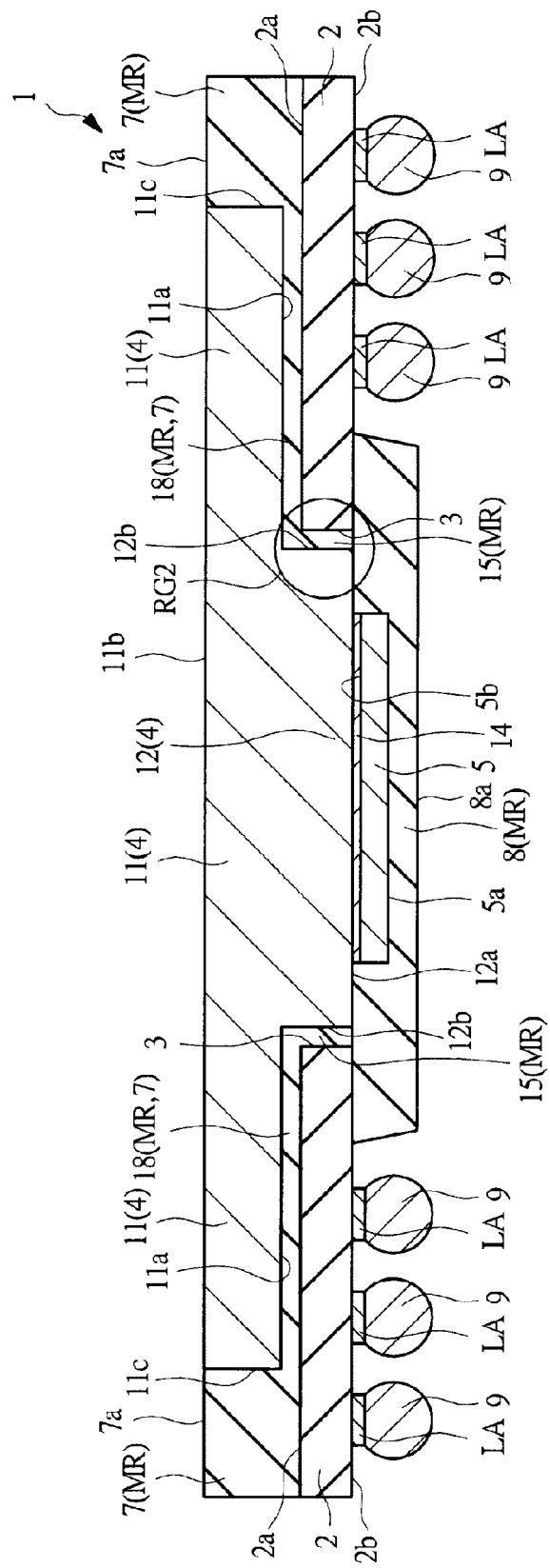
FIG. 2 is a cross-sectional view of a semiconductor device in an embodiment of the present invention.
Figure 3:
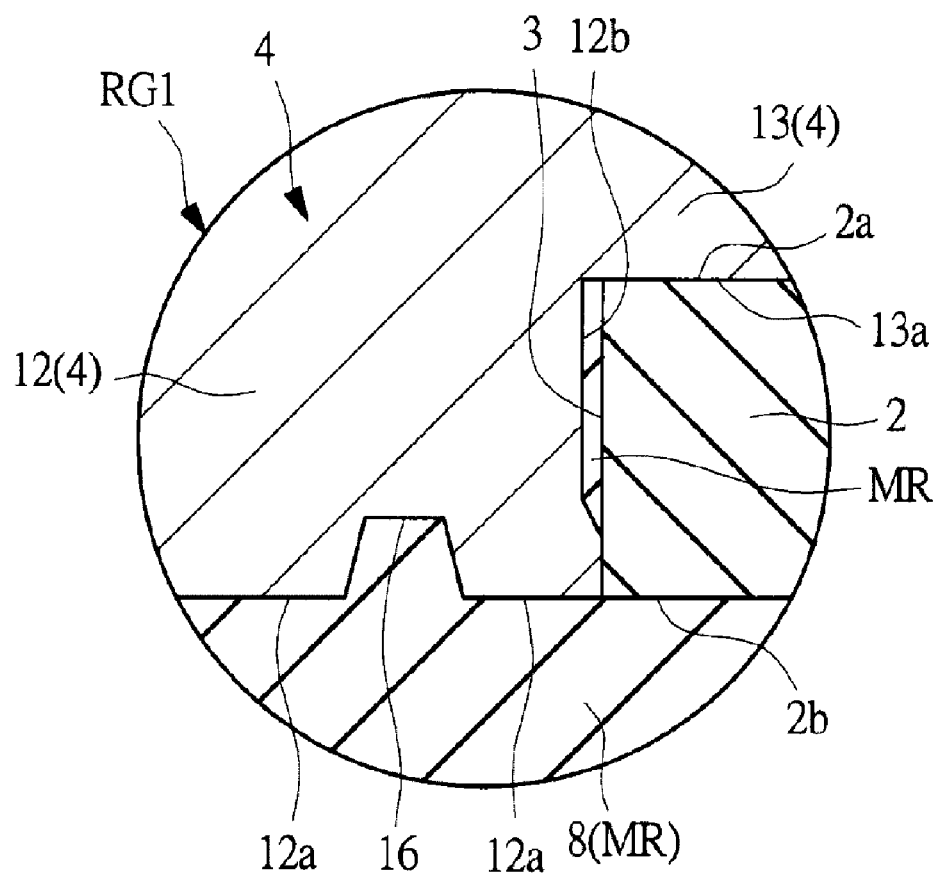
FIG. 3 is a main-part cross-sectional view of a semiconductor device in an embodiment of the present invention.
Figure 4:
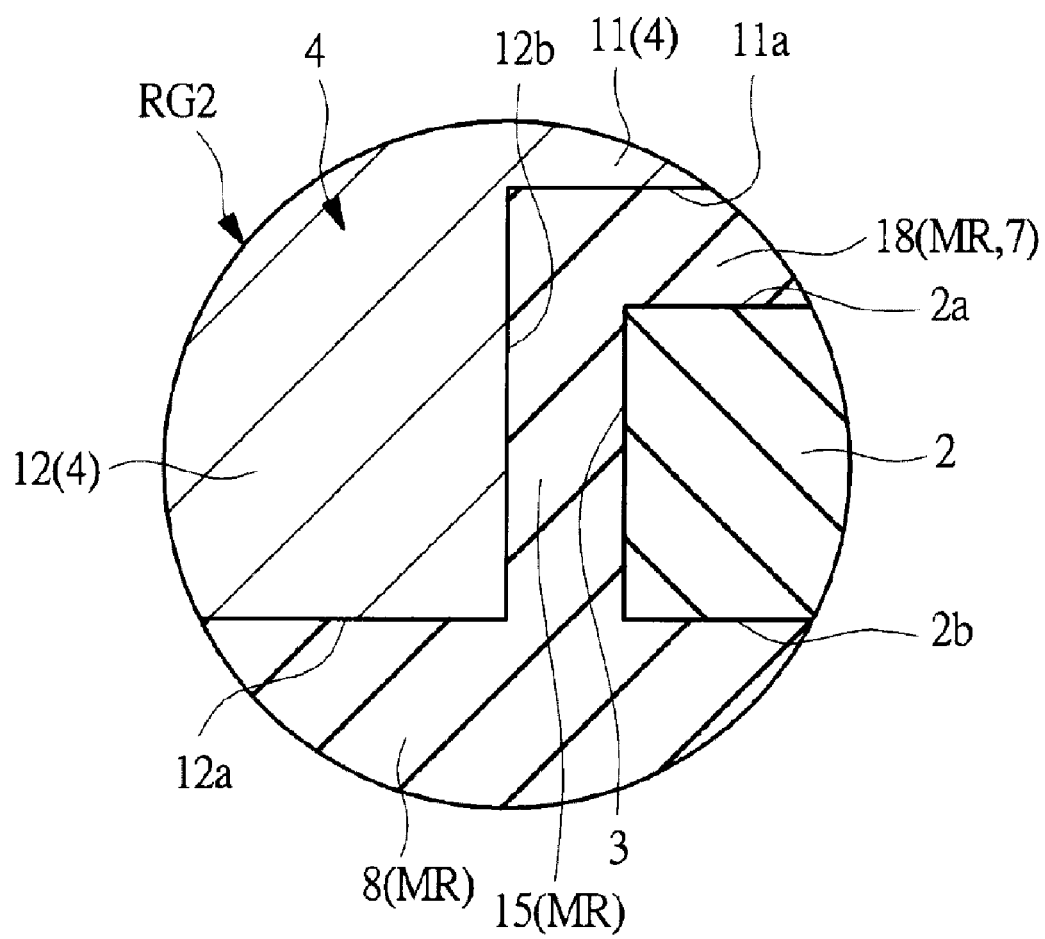
FIG. 4 is a main-part cross-sectional view of a semiconductor device in an embodiment of the present invention.
Figure 5:
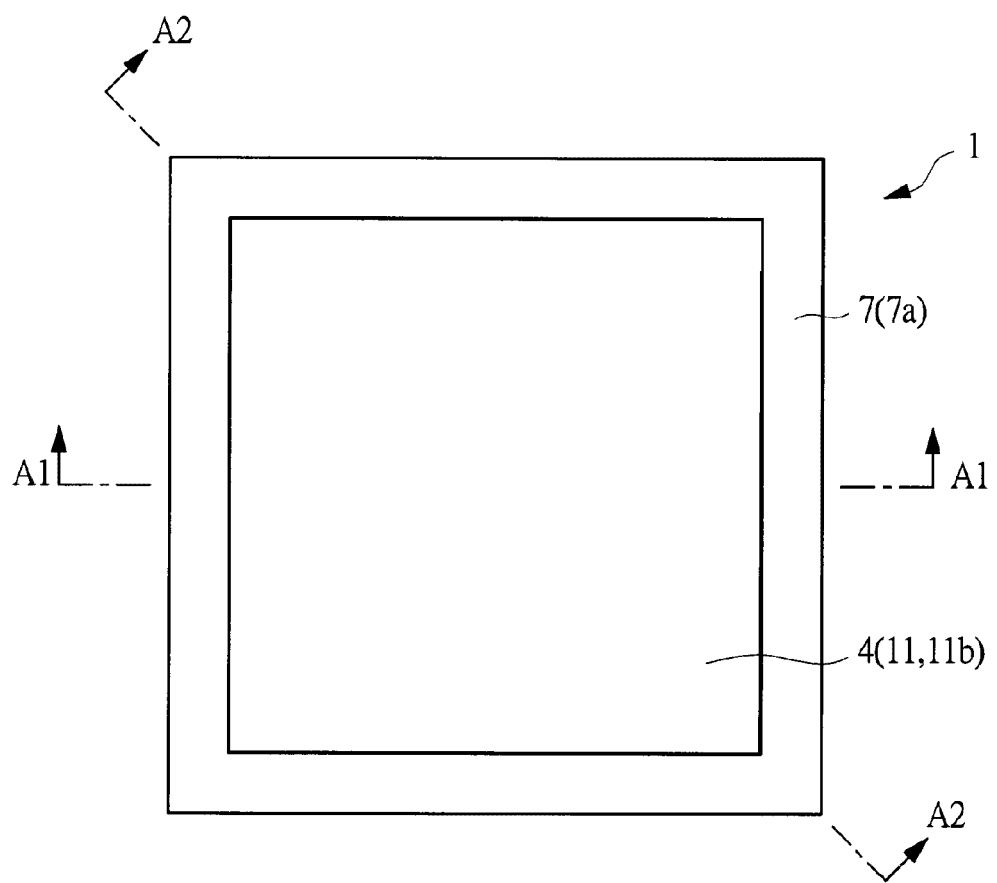
FIG. 5 is a top view of a semiconductor device in an embodiment of the present invention.
Figure 6:
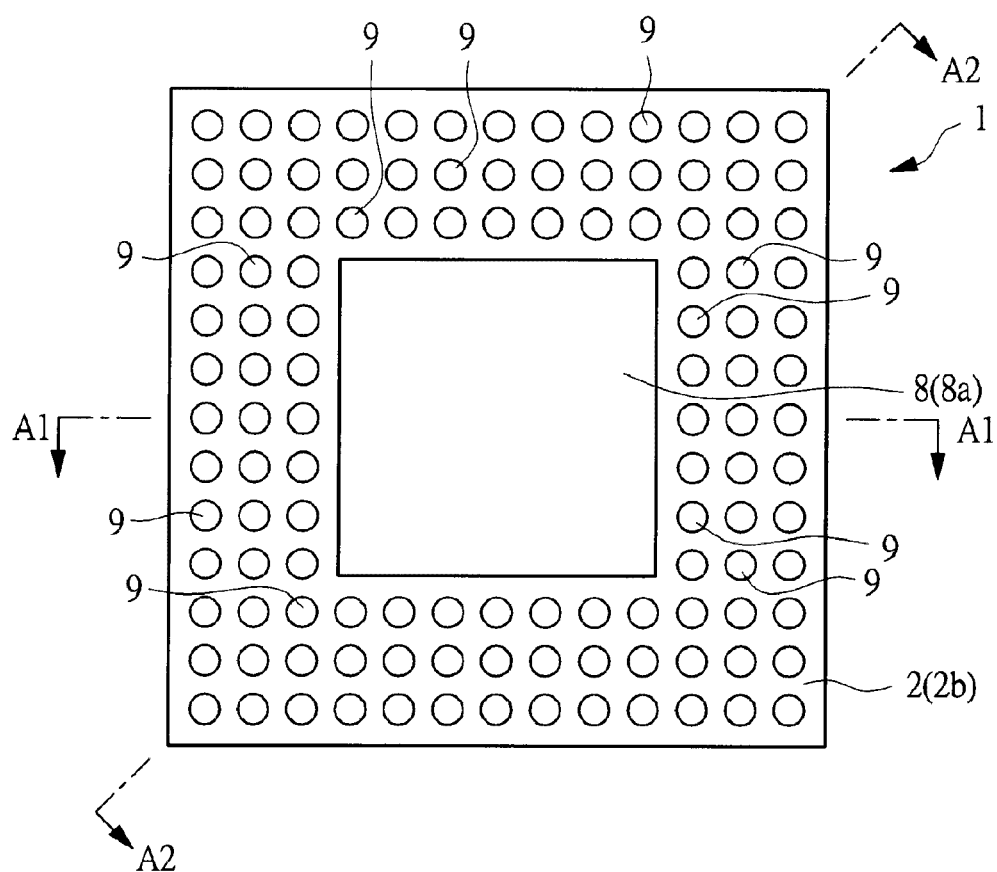
FIG. 6 is a bottom view of a semiconductor device in an embodiment of the present invention.
Figure 7:
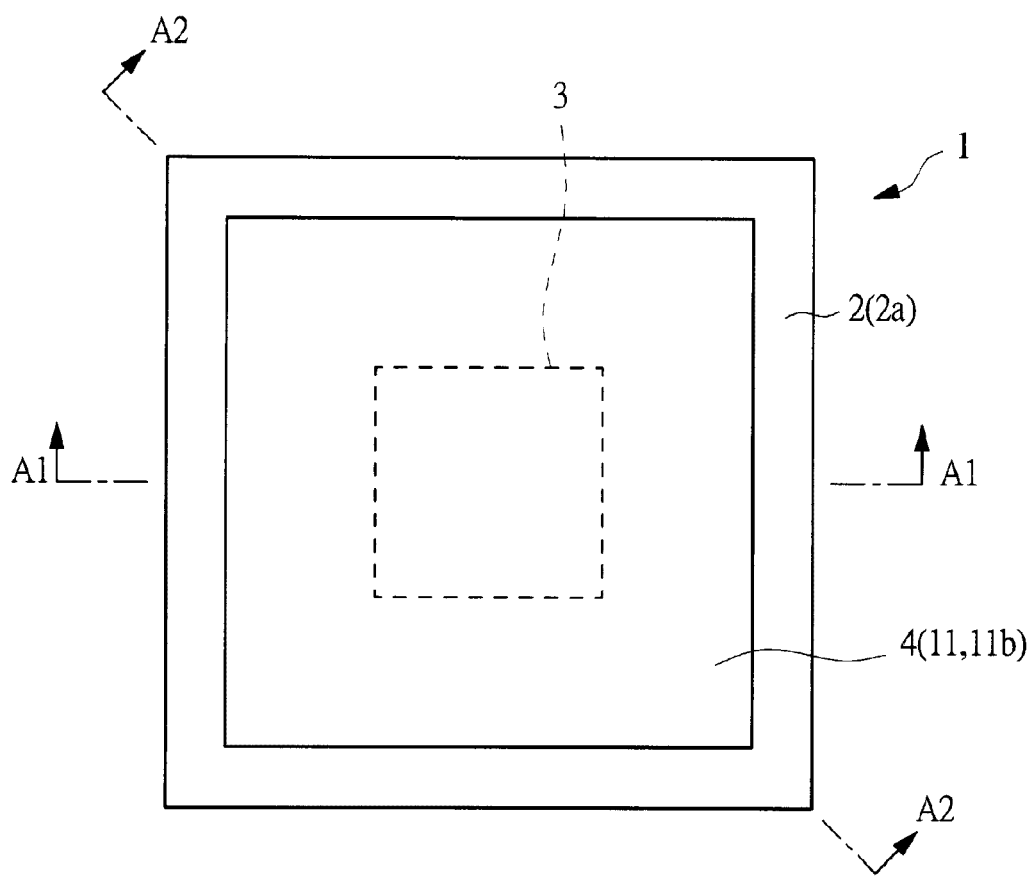
FIG. 7 is a plane perspective view (top view) of a semiconductor device in an embodiment of the present invention.
Figure 8:
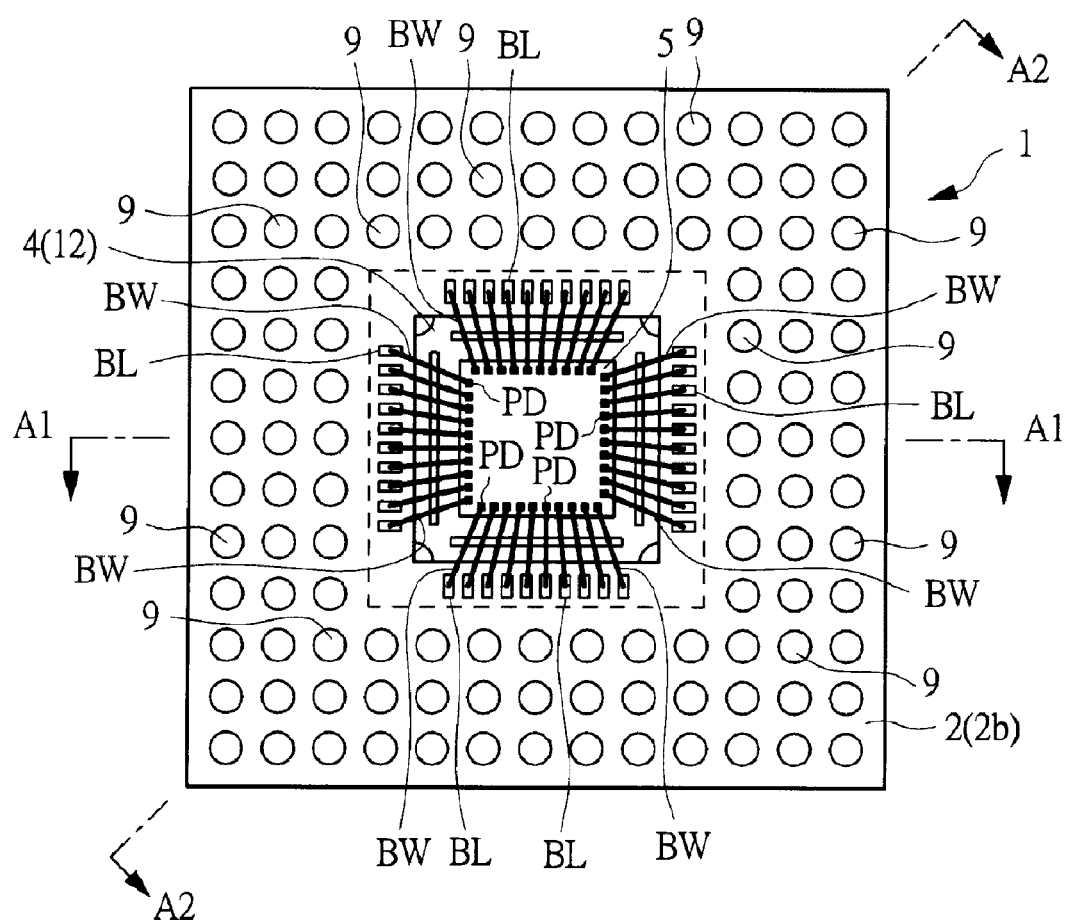
FIG. 8 is a plane perspective view (bottom view) of a semiconductor device in an embodiment of the present invention.
Figure 9:
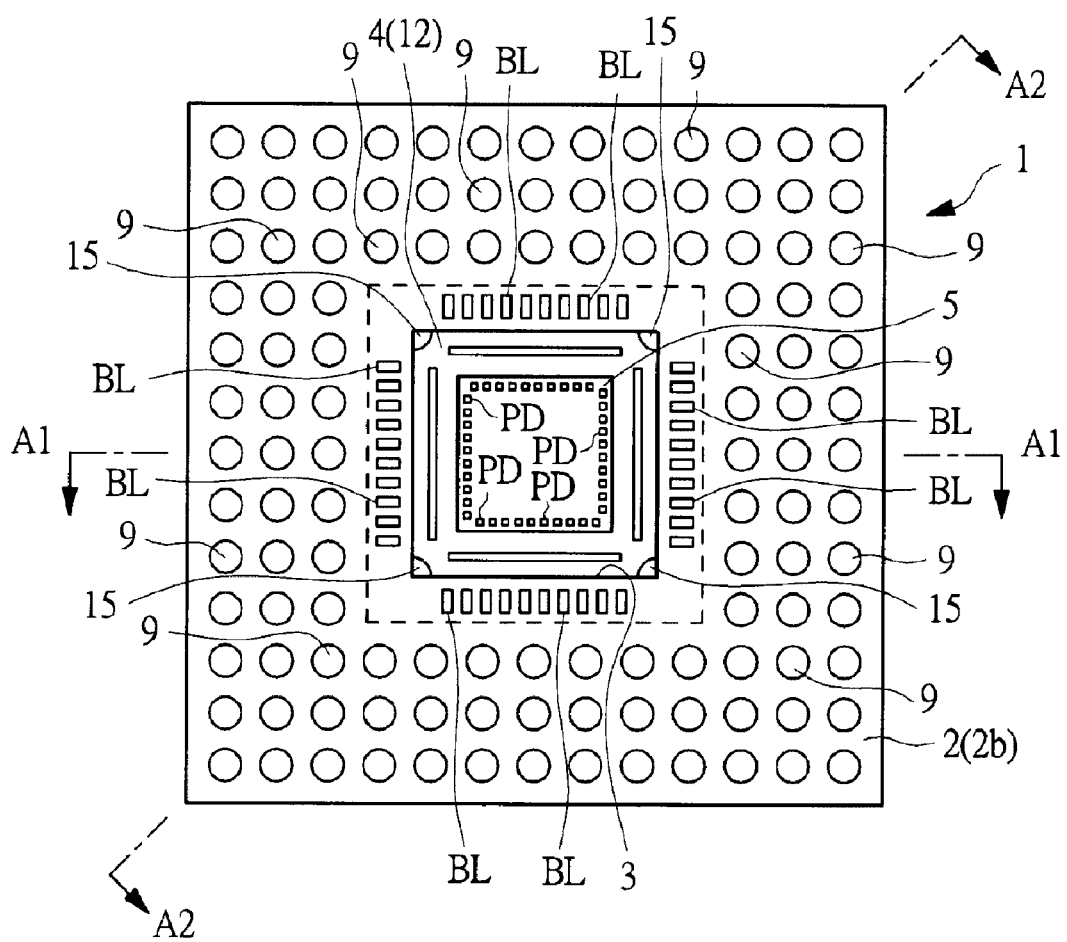
FIG. 9 is a plane perspective view (bottom view) of a semiconductor device in an embodiment of the present invention.
Figure 10:
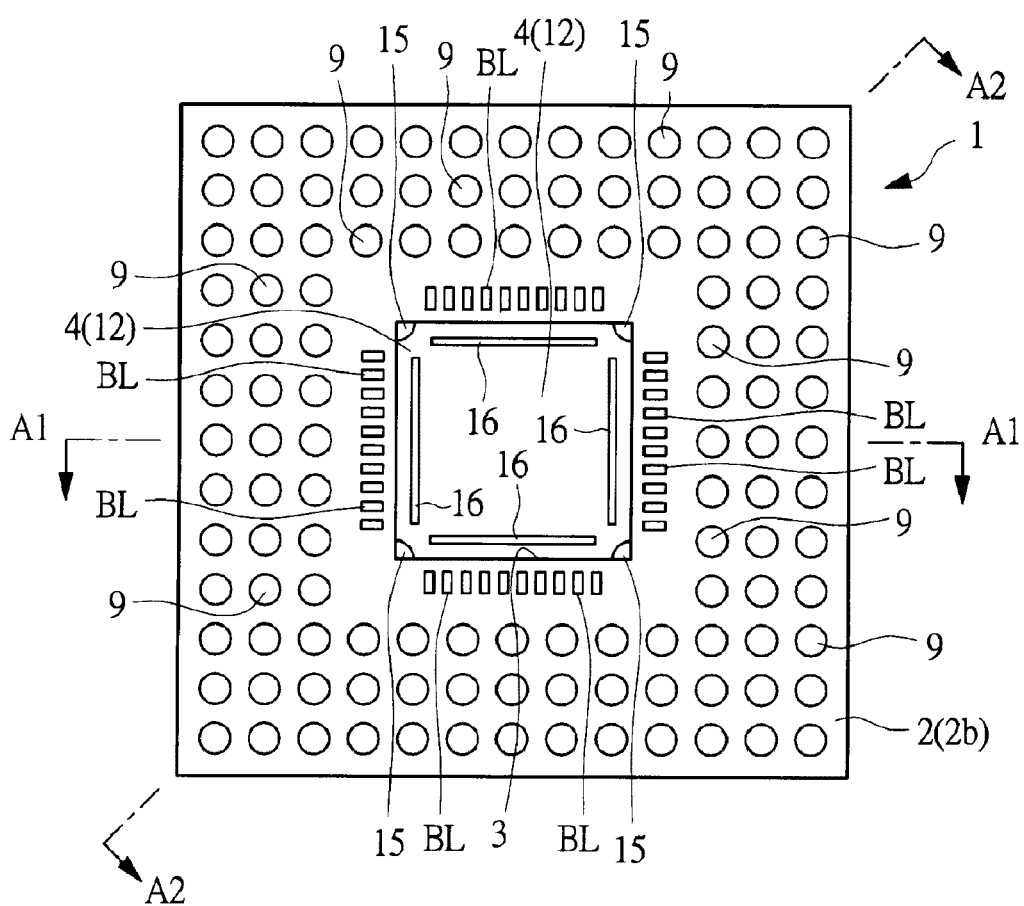
FIG. 10 is a plane perspective view (bottom view) of a semiconductor device in an embodiment of the present invention.
Figure 11:
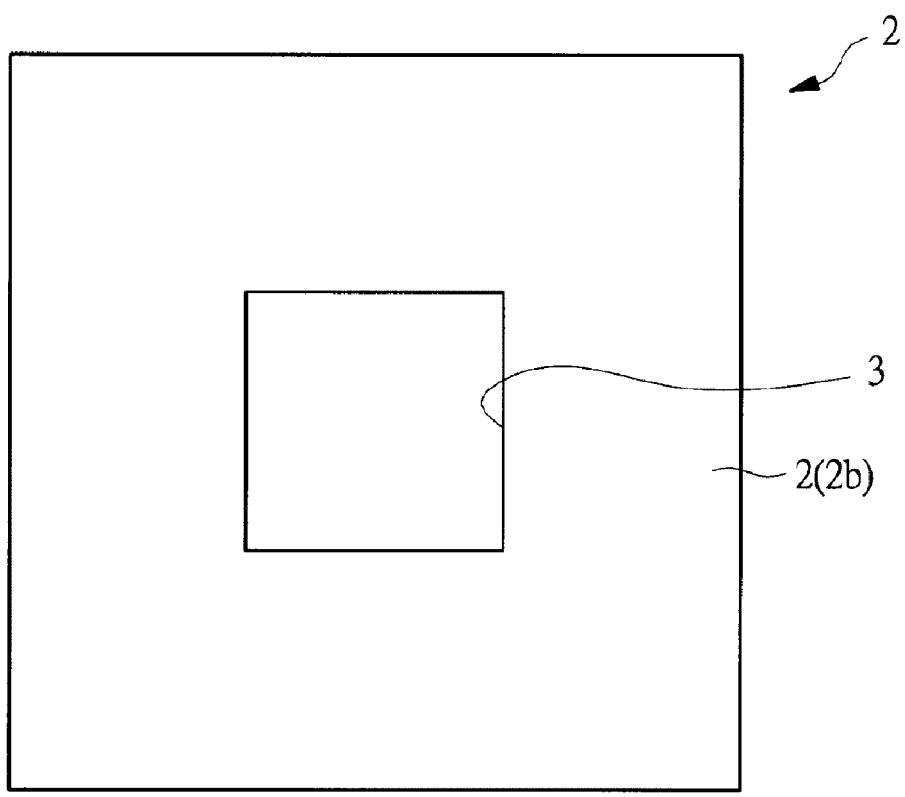
FIG. 11 is a top view of a wiring substrate used in semiconductor device in an embodiment of the present invention.
Figure 12:
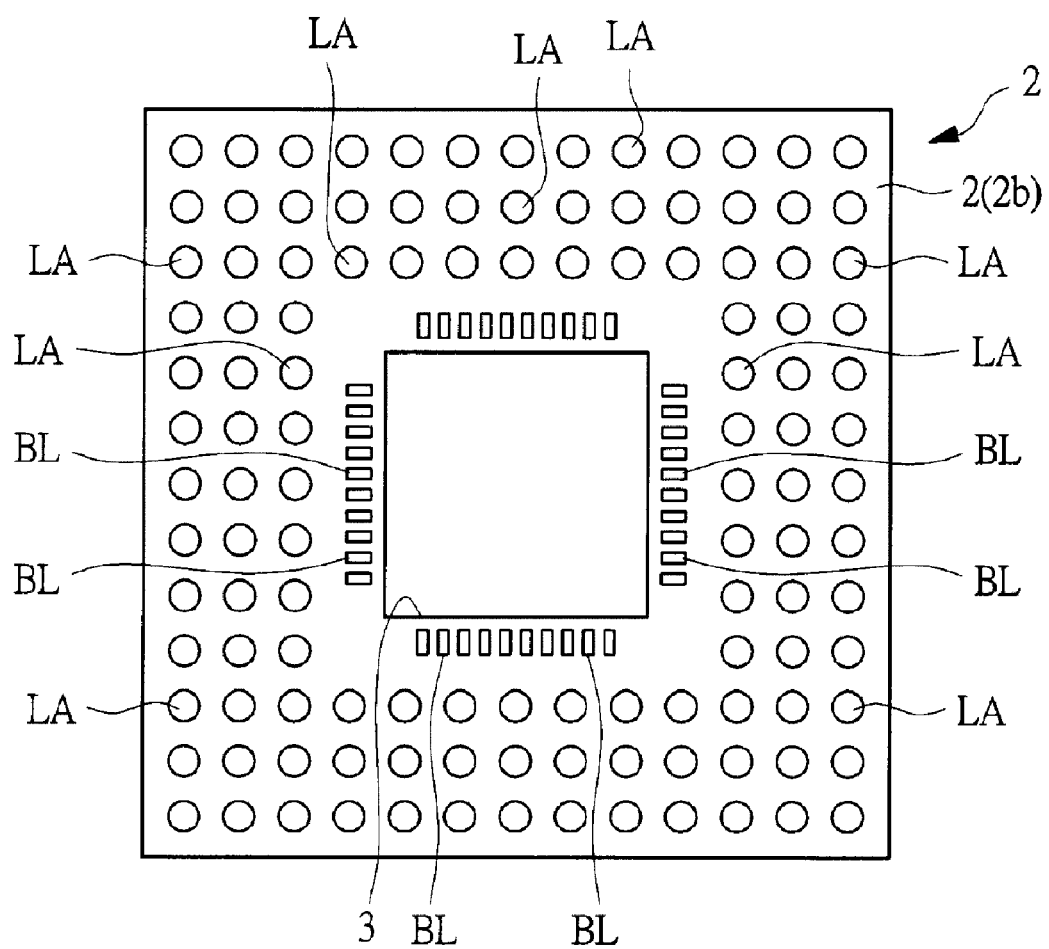
FIG. 12 is a bottom view of a wiring substrate used in semiconductor device in an embodiment of the present invention.
Figure 13:
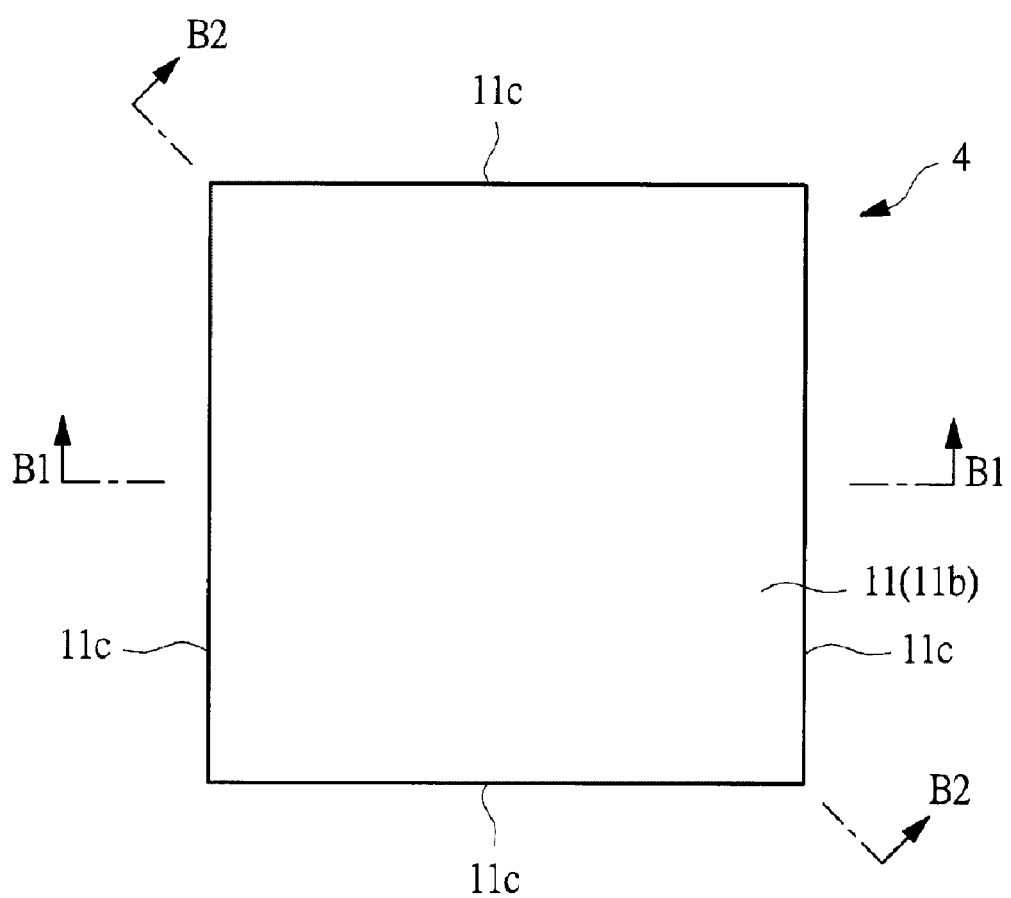
FIG. 13 is a top view of a heat-releasing plate used in semiconductor device in an embodiment of the present invention.
Figure 14:
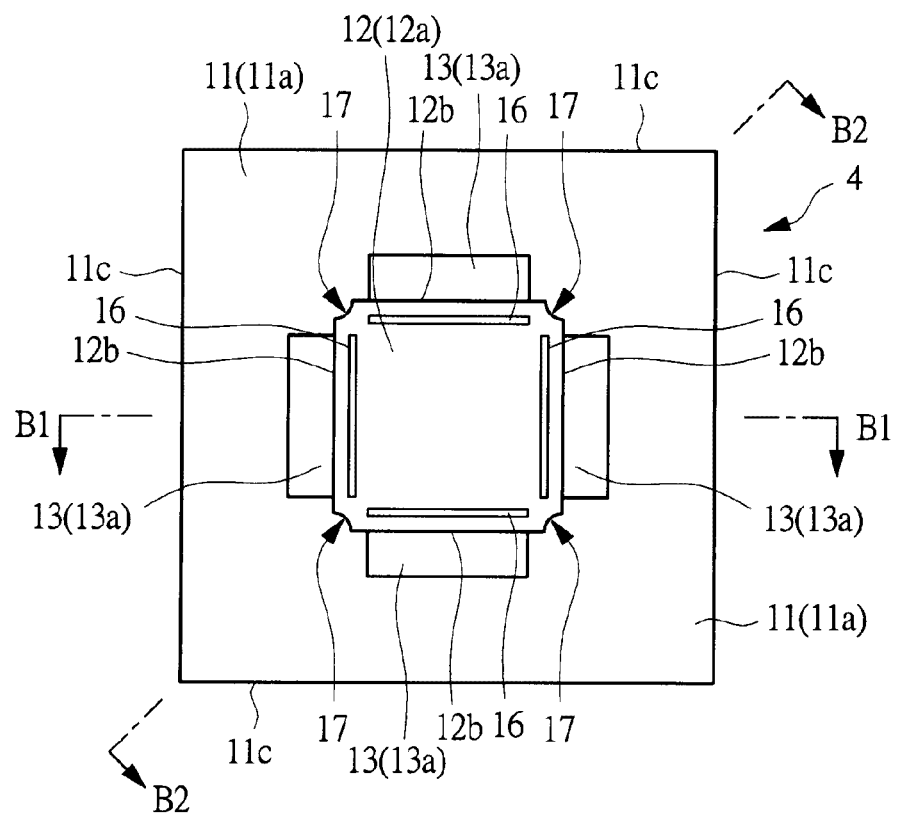
FIG. 14 is a bottom view of a heat-releasing plate used in semiconductor device in an embodiment of the present invention.
Figure 15:
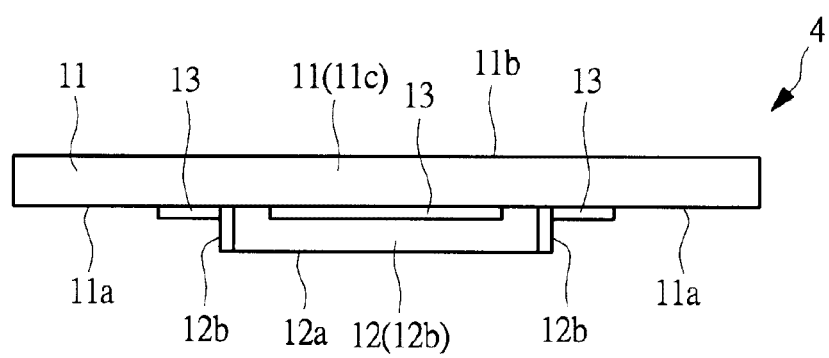
FIG. 15 is a side view of a heat-releasing plate used in semiconductor device in an embodiment of the present invention.
Figure 16:
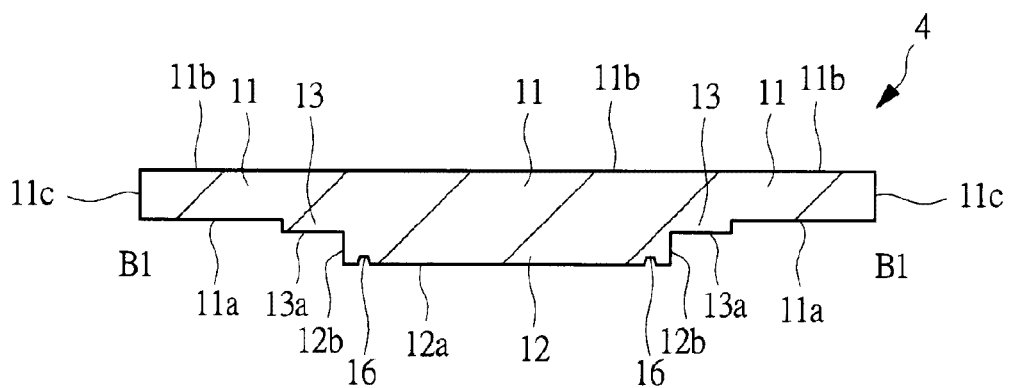
FIG. 16 is a cross-sectional view of a heat-releasing plate used in semiconductor device in an embodiment of the present invention.
Figure 17:
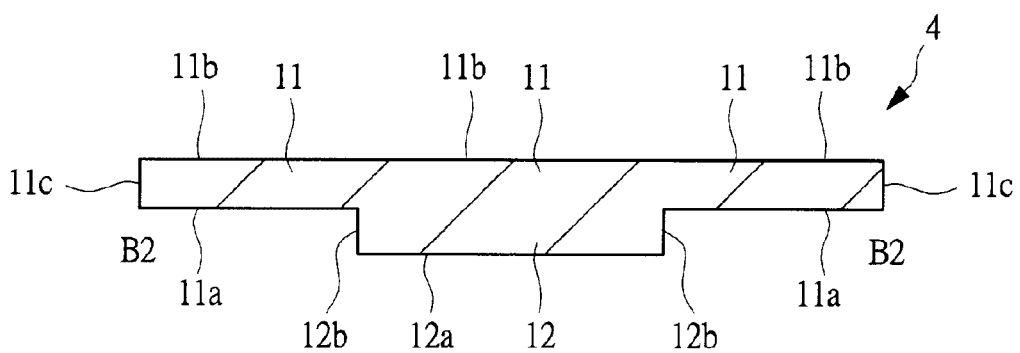
FIG. 17 is a cross-sectional view of a heat-releasing plate used in semiconductor device in an embodiment of the present invention.

FIG. 1 and FIG. 2 show cross-sectional views (side surface cross-sectional views) of a semiconductor device 1 according to an embodiment of the present invention. FIG. 3 and FIG. 4 show main-part cross-sectional views (part-enlarged cross sectional views) of the semiconductor device 1. FIG. 5 is an upper surface view (plan view) of the semiconductor device 1. FIG. 6 is a lower surface view (bottom face view, rear surface view, plan view) of the semiconductor device 1. FIG. 7 is a plane perspective view (upper surface view) of the semiconductor device 1, illustrating the upper surface side of the semiconductor device 1 when seen through a sealing portion 7. FIG. 8 is a plane perspective view (lower surface view) of the semiconductor device 1, illustrating the lower side view of the semiconductor device 1 when seen through a sealing portion 8. FIG. 9 is a plane perspective view (lower surface view) of the semiconductor device 1 in a state in which, in FIG. 8, the bonding wire BW is further removed (seen through). FIG. 10 is a plane perspective view (lower surface view) of the semiconductor device 1 in a state in which, in FIG. 9, a semiconductor chip 5 is further removed (seen through). The cross section along the A1-A1 line in FIGS. 5 to 10 almost corresponds to FIG. 1. The cross section along the A2-A2 line in FIGS. 5 to 10 almost corresponds to FIG. 2. FIG. 3 corresponds to the part-enlarged view of a region RG1 (circled) in FIG. 1. FIG. 4 corresponds to the part-enlarged view of a region RG2 (circled) in FIG. 2. FIG. 11 is an upper surface view (plan view) of a wiring substrate 2 used in the semiconductor device 1 in the embodiment 1 of the present invention. FIG. 12 is a lower surface view (plan view) of the wiring substrate 2 used in the semiconductor device 1 in the embodiment 1. FIG. 13 is an upper surface view (plan view) of a hear-releasing plate 4 used in semiconductor device 1 in the embodiment 1. FIG. 14 is a lower surface view (plan view) of the heat-releasing plate 4 used in the semiconductor device 1 in the embodiment 1. FIG. 15 is a side surface view of the heat-releasing plate 4 used in the semiconductor device in the embodiment 1. FIG. 16 and FIG. 17 are each a cross-sectional view (side surface cross-sectional view) of the heat-releasing plate 4 used in the semiconductor device 1 in the embodiment 1. The cross section along the B1-B1 line in FIGS. 13 and 14 almost corresponds to FIG. 16. The cross section along the B2-B2 line in FIGS. 13 and 14 almost corresponds to FIG. 17. However, the position of B1-B1 line in FIGS. 13 and 14 corresponds to the position of A1-A1 line in FIGS. 5 to 10, and the position of B2-B2 line in FIG. 13 and FIG. 14 corresponds to the position of A2-A2 line in FIGS. 5 to 10. Therefore FIG. 16 shows the same cross section as that of FIG. 1, and FIG. 17 shows the same cross section as that of FIG. 2. For convenience of understanding, FIG. 7 shows the position of a through-hole 3 by a broken line, which through-hole 3 is invisible behind the heat-releasing plate 4 even looking through the sealing portion 7. Similarly FIG. 8 shows the position of outer shape of the sealing portion 8 seen through, by a broken line.

The semiconductor device 1 according to the embodiment 1, given in FIGS. 1 to 10, is a semiconductor device of resin-seal type semiconductor package structure.

The semiconductor device 1 of the embodiment 1 comprises the wiring substrate 2, the heat-releasing plate 4 being inserted in a part thereof (a convex part 12) into the through-hole 3 of the wiring substrate 2, the semiconductor chip 5 being mounted over the convex part 12 of the heat-releasing plate 4, and a plurality of bonding wires BW each coupling electrically the respective electrode pads PD of the semiconductor chip 5 with the respective bonding leads BL of the wiring substrate 2. The semiconductor device 1 further comprises the sealing portion 7 covering a portion of an upper surface 2a of the wiring substrate 2, the sealing portion 8 covering a portion of a lower surface 2b of the wiring substrate 2 including the semiconductor chip 5 and the bonding wires BW, and a plurality of solder balls 9 positioned directly on the lower surface 2b of the wiring substrate 2.

The wiring substrate 2 (substrate, package substrate, wiring substrate for packaging) illustrated in FIGS. 1 to 12 has the upper surface (top surface) 2a as a main surface at one side and the lower surface (rear surface) as a main surface at opposite side to the upper surface 2a. In mounting the semiconductor device 1 over a mounting substrate 21 (described later) or the like, since the lower surface 2b side of the wiring substrate 2 becomes the mounting surface (facing the mounting substrate 21 described later), the lower surface 2b of the wiring substrate 2 can be considered as the mounting surface. The upper surface 2a and the lower surface 2b of the wiring substrate 2 are nearly in parallel each other. Near the central part of the wiring substrate 2, the through-hole 3 (hole part, opening) penetrating from the upper surface 2a to the lower surface 2b of the wiring substrate 2 is located.

The heat-releasing plate 4 (heat-releasing member, thermal-conducting member, heat-spreader) illustrated in FIGS. 1 to 10 and FIGS. 13 to 17 has an integral structure of: a base material part 11 having a main surface 11a facing the upper surface 2a of the wiring substrate 2; the convex part 12 being located at central part of the main surface 11a of the base material part 11 and protruding from the base material part 11; and a supporting part 13 being formed in the main surface 11a of the base material part 11 and contacting with the upper surface 2a of the wiring substrate 2. The heat-releasing plate 4 is positioned directly on and fixed to the upper surface 2a of the wiring substrate 2 so that the convex part 12 is positioned in the through-hole 3.

The base material part 11 (base part, flat plate part, heat-releasing part) of the heat-releasing plate 4 is in a flat plate shape, and has the main surface 11a facing the upper surface 2a of the wiring substrate 2 and a rear surface 11b which is a main surface at opposite side to the main surface 11a. The rear surface 11b of the base material part 11 is exposed from the sealing portion 7 (an upper surface 7a of the sealing portion 7) to form an exposure surface (heat-releasing surface, heat-releasing part) of the heat-releasing plate 4. The rear surface 11b of the base material part 11 can be set to be almost flat. A side surface 11c of the base material part 11 is covered with the sealing portion 7. Larger size of the base material part 11 of the heat-releasing plate 4 further increases the heat-releasing performance.

The convex part 12 (protruding part, chip-mounting part) protruding almost vertical to the main surface 11a is formed near the center of the main surface 11a of the base material part 11. The convex part 12 is positioned (inserted) in the through-hole 3 of the wiring substrate 2. Furthermore, the semiconductor chip 5 is mounted over a main surface (top surface) 12a of the convex part 12. Accordingly, the convex part 12 of the heat-releasing plate 4 can be considered as the chip-mounting part. That is, at the lower surface 2b side of the wiring substrate 2, the semiconductor chip 5 is mounted (die-bonded) over the convex part 12 of the heat-releasing plate 4 positioned in the through-hole 3 of the wiring substrate 2, and thus the semiconductor chip 5 is in a state of being located at the lower surface 2b side of the wiring substrate 2.

Since the convex part 12 is positioned in the through-hole 3 of the wiring substrate 2, the convex part 12 is located in the main surface 11a of the base material part 11 at a position overlapped in a planar view with (included) the through-hole 3 of the wiring substrate 2. On the other hand, since the supporting part 13 is positioned outside the through-hole 3 of the wiring substrate 2 to contact with the upper surface 2a of the wiring substrate 2, the supporting part 13 is located at a position not overlapped in a planar view with the through-hole 3 of the wiring substrate 2 in the main surface 11a of the base material part 11. The term "overlapped in a planar view", "not overlapped in a planar view", or "viewed planarly" refers to herein the case of being viewed (or viewed in projection) in a plane parallel to the upper surface 2a or the lower surface 2b of the wiring substrate 2.

In the semiconductor device 1, the main surface 11a of the base material part 11 of the heat-releasing plate 4 and the upper surface 2a of the wiring substrate 2 are almost parallel to each other. The convex part 12 of the heat-releasing plate 4 has the main surface 12a (chip-mounting surface) and the side surface 12b (side wall), and the main surface 12a of the convex part 12 is surrounded by the side surface 12b of the convex part 12. In other words, the side surface 12b of the convex part 12 is positioned between the main surface 12a of the convex part 12 and the main surface 11a of the base material part 11. Since the main surface 12a of the convex part 12 of the heat-releasing plate 4 is almost parallel to the main surface 11a of the base material part 11, the main surface 12a is also almost parallel to the lower surface 2b of the wiring substrate 2. Furthermore, when viewed planarly, the convex part 12 is included in a planar view in the base material part 11. The semiconductor chip 5 is adhered to be fixed to the main surface 12a of the convex part 12 via a connecting material 14 (adhesive, die-bonding material). The side surface 12b of the convex part 12 faces the inside wall of the through-hole 3 of the wiring substrate 2.

The side surface 12b of the convex part 12 is almost vertical to the main surface 11a of the base material part 11. As described later, however, the manufacturing process of the semiconductor device 1, (the process corresponding to the step S6 described later), widens forcibly a groove 16 in the convex part 12 to swage the heat-releasing plate 4 (the convex part 12 of the heat-releasing plate 4) to the wiring substrate 2 (specifically, a wiring substrate 31 described later). Consequently, as schematically illustrated in FIG. 3, a region close to the main surface 11a in the side surface 12b of the convex part 12 is deformed (inclined) toward the inside wall of the through-hole 3 of the wiring substrate 2, thus contacting with the inside wall of the through-hole 3 of the wiring substrate 2. As a result, in the stage before the step S6 of swaging described later, the entire side surface 12b of the convex part 12 of the heat-releasing plate 14 becomes almost vertical to the main surface 11a of the base material part 11, and also a region close to the main surface 11a in the side surface 12b of the convex part 12 is not deformed (not inclined), (refer to FIG. 49 described later).

The supporting part 13 located in the main surface 11a of the base material part 11 has a supporting surface 13a contacting with the upper surface 2a of the wiring substrate 2. The supporting surface 13a can be set as a flat surface. The main surface 11a of the base material part 11, the supporting surface 13a of the supporting part 13, and the main surface 12a of the convex part 12 have different height from each other. On the basis of the main surface 11a of the base material part 11, the supporting surface 13a of the supporting part 13 is at a higher position than the main surface 11a of the base material part 11, and the main surface 12a of the convex part 12 is at a much higher position than the main surface 11a of the base material part 11 and the supporting surface 13a of the supporting part 13, (herein the direction of higher height is defined as the side of the main surface 12a of the convex part 12 from the main surface 11a of the base material part 11). In other words, the supporting part 13 (the supporting surface 13a of the supporting part 13) is at a lower position than the convex part 12 (the main surface 12a of the convex part 12), and the main surface 11a of the base material part 11 (the region in which both of the convex part 12 and the supporting part 13 are not formed) is at a lower position than the supporting part 13 (the supporting surface 13a of the supporting part 13).

Consequently, the region, where the convex part 12 is positioned (inserted) in the through-hole 3 of the wiring substrate 2, the supporting surface 13a of the supporting part 13 contacts with the upper surface 2a of the wiring substrate 2, and no convex part 12 and no supporting part 13 in the main surface 11a of the base material part 11 are provided, is in a state of being apart from the upper surface 2a of the wiring substrate 2. Therefore, a gap 18 (gap part) is formed between the upper surface 2a of the wiring substrate 2 and the region having no convex part 12 and no supporting part 13 in the main surface 11a of the base material part 11, and the gap 18 is filled with a portion of the sealing portion 7 (namely, a resin material MR for the sealing portion 7).

As described above, the heat-releasing plate 4 is structured by forming integrally: the base material part 11 being positioned outside the through-hole 3 at the side of upper surface 2a of the wiring substrate 2; the convex part 12 being positioned (inserted) in the through-hole 3 of the wiring substrate 2; and the supporting part 13 contacting with the upper surface 2a of the wiring substrate 2 to separate the main surface 11a of the base material part 11 from the upper surface 2a of the wiring substrate 2, (namely, to form the gap 18 between the main surface 11a of the base material part 11 and the upper surface 2a of the wiring substrate 2).

The main surface 12a of the convex part 12 is the chip-mounting surface (the face on which the semiconductor chip 5 is mounted), and the chip-mounting surface of the heat-releasing plate 4 (in the main surface 12a of the convex part 12) is positioned in almost the same plane as the lower surface 2b of the wiring substrate 2. The structure is attained by setting the difference in elevation (the height difference) between the supporting surface 13a of the supporting part 13 and the main surface 12a of the convex part 12 to be nearly equal to the thickness of the wiring substrate 2 (or the height difference between the upper surface 2a and the lower surface 2b of the wiring substrate 2).

The heat-releasing plate 4 plays a role of conductor part (metal part) for chip-mounting and also a role of conductor part (metal part) for heat-releasing. By placing the heat-releasing plate 4 to the upper surface 2a side of the wiring substrate 2 so that the convex part 12 is positioned in the through-hole 3 of the wiring substrate 2, and by placing the semiconductor chip 5 over the convex part 12 of the heat-releasing plate 4, the heat generated from the semiconductor chip 5 during the use of the semiconductor device 1 is allowed to be transferred to the heat-releasing plate 4, and then the heat is released outside the semiconductor device 1 from the exposure part (the rear surface 11b of the base material part 11) of the heat-releasing plate 4.

Since the heat-releasing plate 4 is a member for releasing the heat generated from the semiconductor chip 5, the heat-releasing plate 4 preferably has high thermal conductivity, and the heat conduction property (thermal conductivity) of the heat-releasing plate 4 is required to be higher than each of the heat conduction properties (thermal conductivities) of at least the wiring substrate 2 and the sealing portions 7 and 8. Since the conductive material (specifically metallic material) has high thermal conductivity, the heat-releasing plate 4 is preferably made of a conductive material, and more preferably made of a metallic material. The use of metallic material such as copper (Cu) and the one composed mainly of copper (Cu) alloy for the heat-releasing plate 4 is further preferable because the heat-releasing plate 4 is provided with high thermal conductivity and is easy to be processed (formation of the heat-releasing plate 4).

The through-hole 3 of the wiring substrate 2 and the convex part 12 positioned in the through-hole 3 have almost equal cross sectional shape at a position parallel to the upper surface 2a of the wiring substrate 2, and a portion of the side surface 12b of the convex part 12 directly contacts with (adheres to) the inside wall (side wall, side surface) of the through-hole 3 of the wiring substrate 2. However, not the entire surface of the side surface 12b of the chip-mounting part 12 directly contacts with (adheres to) the inside wall of the through-hole 3 of the wiring substrate 2.

That is, there is the gap part 15 at least one position (preferably several positions) between the inside wall of the through-hole 3 of the wiring substrate 2 and the side surface 12b of the convex part 12, which gap part separates the inside wall of the through-hole 3 from the side surface 12b of the convex part 12, and penetrates (connects, passes through) from the upper surface 2a to the lower surface 2b of the wiring substrate 2. The gap part 15 is filled (fully) with a resin material which is integrally formed with the sealing portions 7 and 8.

The plane of the convex part 12 and the through-hole 3 can be set as various shapes, and a rectangular shape (near rectangle) is preferred. FIGS. 1 to 17 illustrate the case in which the planar shape of the convex part 12 and the through-hole 3 is set as a rectangle. To allow the formation of the gap part 15 described above, however, the planar shape of the convex part 12 and the planar shape of the through-hole 3 are not caused to be completely the same as each other, and the planar shape of the through-hole 3 is caused to be large in a limited region compared with the planar shape of the convex part 12, or the planar shape of the convex part 12 is caused to be small in a limited region compared with the planar shape of the through-hole 3.

For example, as illustrated in FIG. 11 and FIG. 12, the planar shape of the through-hole 3 of the wiring substrate 2 is set as a rectangle having nearly right angles at each of four corners, and in contrast, as illustrated in FIG. 14, the planar shape of the convex part 12 is set as a rectangle in which the four corners are not at right angles but to be chamfered. Alternatively, the planar shape of the through-hole 3 of the wiring substrate 2 may be set as a rectangle in which the four corners are not at right angles but to be locally widened in the angle while the planar shape of the convex part 12 may be set as a rectangle in which the four corners are nearly at right angles. The planar shape of the through-hole 3 is a shape in a plane parallel to the upper surface 2a or the lower surface 2b of the wiring substrate 2, and the planar shape of the convex part 12 corresponds to a shape in a plane parallel to the main surface 11a of the base material part 11 or the main surface 12a of the convex part 12. Structural example of FIG. 14 is described more specifically in the following. At each of the four corners given by the reference symbol 17 in FIG. 14, (four corners of the rectangle structuring the planar shape of the convex part 12), the planar shape (the shape in a plane parallel to the main surface of the convex part 12) is, for example, about a quarter of circle, and has a groove which extends from the main surface 12a of the convex part 12 to the main surface 11a of the base material part 11 along the side surface 12b of the convex part 12.

With that structure, when the convex part 12 of the heat-releasing plate 4 is positioned (inserted) in the through-hole 3 of the wiring substrate 2, the side surface 12b of the convex part 12 and the inside wall of the through-hole 3 of the wiring substrate 2 come close to each other at regions other than the regions near the four corners of the rectangle (rectangle structuring the planar shape of the convex part 12 and the through-hole 3). To the contrary, in the regions near the four corners, the side surface 12b of the convex part 12 and the inside wall of the through-hole 3 of the wiring substrate 2 are separated from each other, which creates the gap part 15 near each of the four corners of the rectangle.

The gap part 15 is formed between the side surface 12b of the convex part 12 and the inside wall of the through-hole 3 in the stage in which the convex part 12 of the heat-releasing plate 4 is placed (inserted) in the through-hole 3 for fixing (swaging) in the steps S5 and S6 described later. Before forming the sealing portions 7 and 8, the gap part 15 is empty, and is in a state of not being filled with the resin material MR. In forming the sealing portions 7 and 8, the gap part 15 functions as the flow passage of the resin material MR, and thus is filled with the resin material MR.

That is, although the detail is described later, on forming the sealing portions 7 and 8, (corresponding to the step S8 of molding described later), the resin material MR for forming the sealing portions 7 and 8 is supplied to the upper surface 2a side of the wiring substrate 2, and the resin material MR is supplied also to the lower surface 2b side of the wiring substrate 2 through the gap 8 and the gap part 15, and thus the sealing portion 7 and the sealing portion 8 are formed over the upper surface 2a and the lower surface 2b of the wiring substrate 2, respectively. To do this, each gap part 15 is formed to have a size allowing the resin material MR for forming the sealing portions 7 and 8 to flow therethrough in forming the sealing portions 7 and 8, and the gap part 15 extends continuously (penetrates) from the upper surface 2a to the lower surface 2b of the wiring substrate 2. As a result, at the upper surface 2a side of the wiring substrate 2, each gap part 15 connects with the gap 18 between the main surface 11a of the base material part 11 and the upper surface 2a of the wiring substrate 2, while at the lower surface 2b side of the wiring substrate 2, each gap part 15 connects with the sealing portion 8. Both of the sealing portion 7 and the sealing portion 8 are formed by the same resin material MR, and the same resin material MR fills (fully) the gap 18 and the gap part 15. That is, the sealing portion 7 and the sealing portion 8 are connected integrally via the resin material MR filling the gap part 15.

The groove 16 (concave part, concavity) is formed in the main surface 12a of the convex part 12 of the heat-releasing plate 4. The groove 16 is formed in peripheral area (outer peripheral area) of the main surface 12a of the convex part 12. The semiconductor chip 5 is mounted over the main surface 12a of the convex part 12 at a position closer to the center of the principal case 12a than the region in which the groove 16 is formed. That is, in the main surface 12a of the convex part 12, the groove 16 is formed at a more outer periphery side than the region in which the semiconductor chip 5 is mounted. In the main surface 12a of the convex part 12, the groove 16 is preferably formed along each side of the main surface 12a. As illustrated in FIG. 14, when the main surface 12a has a rectangular shape, the groove 16 is preferably formed along the four sides of the main surface 12a except the area near to the four corners.

At the time of manufacturing the semiconductor device 1, the groove 16 is used to swage and fix the heat-releasing plate 4 (the convex part 12 of the heat-releasing plate 4) to the wiring substrate 2. That is, at the time of manufacturing the semiconductor device 1, the convex part 12 of the heat-releasing plate 4 is inserted into the through-hole 3 of the wiring substrate 2, and then the groove 16 in the main surface 2a of the convex part 12 is widened forcibly by a jig 46 or the like (described later), and thus the heat-releasing plate 4 (the convex part 12 of the heat-releasing plate 4) and the wiring substrate 2 are swaged and fixed together. When the groove 16 in the main surface 12a of the convex part 12 is widened forcibly, a portion of the convex part 12 is widened in the horizontal direction by an amount of the volume of widened groove 16, which allows a portion of the side surface 12b of the convex part 12 to contact with (adhere to) the inside wall of the through-hole 3 of the wiring substrate 2. By the reaction force, there is generated a force to cause the inside wall of the through-hole 3 of the wiring substrate 2 to closely contact with and press a portion of the side surface 12b of the convex part 12, which thus allows swaging the heat-releasing plate 4 (the convex part 12 of the heat-releasing plate 4) and the wiring substrate 2, and allows the heat-releasing plate 4 to be fixed to the wiring substrate 2. As a result, the heat-releasing plate 4 can be fixed to the wiring substrate 2 until the sealing portions 7 and 8 are formed, which makes the manufacturing of semiconductor device 1 easy.

The semiconductor chip 5 has a planar rectangular shape (quadrangle) which crosses the thickness thereof. For example, the semiconductor chip 5 is manufactured by the steps of: forming various kinds of semiconductor elements or semiconductor integral circuits over the main surface of the semiconductor substrate (semiconductor wafer) composed of single crystal silicon and the like; performing back-grinding of the semiconductor substrate, as necessary; and then separating the semiconductor substrate into individual semiconductor chips 5 by using dicing and the like. The semiconductor chip 5 has a top surface 5a (main surface at the side of forming the semiconductor element, upper surface) and a rear surface 5b (main surface opposite to the top surface, lower surface) as the two main surfaces at opposite positions to each other. In the top surface 5a of the semiconductor chip 5, there are formed a plurality of electrode pads PD (electrodes, bonding pads, pad electrodes). Each electrode pad PD is coupled with the semiconductor element or the semiconductor integral circuit being formed inside of or in the surface layer portion of the semiconductor chip 5.

The semiconductor chip 5 is face-up-bonded to the convex part 12 of the heat-releasing part 4. The rear surface 5b of the semiconductor chip 5 is adhered and fixed to the main surface 12a of the convex part 12 of the heat-releasing plate 4 via a joining material 14 (adhesive, die-bonding material). The plane size of the through-hole 3 of the wiring substrate 2 and of the convex part 12 of the heat-releasing plate 4 is larger than the plane size of the semiconductor chip 5. The semiconductor chip 5 mounted over the convex part 12 of the heat-releasing plate 4 is positioned so as to be included horizontally of the through-hole 3 of the wiring substrate 2 and of the convex part 12 of the heat-releasing plate 4. The joining material 14 is preferably an adhesive having high thermal conductivity, and applicable ones include solder and conductive paste material (silver paste is preferred as the conductive paste material).

The wiring substrate 2 has an insulating base material layer (insulating substrate, core material) and a conductor layer (conductor pattern, conductor film pattern, wiring layer) formed directly on upper surface and lower surface of the base material layer. The wiring substrate 2 may be a substrate having a conductor layer at top and bottom of a single insulating layer (base material layer) or may be a multilayer wiring substrate (multilayer substrate) in which a plurality of insulating layers (base material layers) and a plurality of conductor layers (wiring layers) are alternately formed (laminated) and integrated across many layers. For the convenience of wiring, however, the multilayer wiring substrate is preferred. FIGS. 1 to 4 do not show the wiring layer inside (between base material layers) of the wiring substrate 2. An example of the base material layer of the wiring substrate 2 is a resin material (such as glass-epoxy resin).

According to the semiconductor device 1 of the embodiment 1, the semiconductor chip 5 is positioned at the lower surface 2b side (above the convex part 12) of the wiring substrate 2, and the external terminals (solder balls 9 in this embodiment) at the lower surface 2b side of the wiring substrate 2. Because of this structure, the upper surface 2a side of the wiring substrate 2 does not need to have the conductor layer constituting the terminals (bonding leads, bump lands) and wiring. On the other hand, at the lower surface 2b side of the wiring substrate 2, there are formed a plurality of bonding leads BL (electrode pads, coupling terminals, electrodes, bonding pads, pad electrodes) for coupling the bonding wire BW, and a plurality of bump lands LA (electrode pads, conductive lands, electrodes, land electrodes, pads, terminals) for coupling the solder balls 9 as the bump electrodes. The bonding leads BL and the bump lands LA are made up of a part of the conductor layer, which can be formed by a conductive material such as, in the embodiment 1, copper thin film prepared by plating method.

As illustrated in FIG. 12, the bonding leads BL are arranged (formed) around the through-hole 3 in the lower surface 2b of the wiring substrate 2, and the bump lands LA are arranged (formed) around the region in which the bonding leads BL are arranged in the lower surface 2b of the wiring substrate 2.

In the wiring substrate 2, the bonding leads BL and the bump lands LA are coupled with each other via the respective wiring lines of the wiring substrate 2. The type of the wiring line for coupling electrically the bonding lead BL with the bump land LA is used responding to the requirements, including the wiring layer of the lower surface 2b of the wiring substrate 2, the wiring layer of the upper surface 2a of the wiring substrate 2, the wiring layer inside the wiring substrate 2, and via-wiring line for coupling different wiring layers of the wiring substrate 2. In the same way as the bonding lead BL and the bump land LA, these wiring lines are made up of a part of the conductor layer of the wiring substrate 2. Although not shown in the drawings, there can be formed a solder resist layer (insulating layer, insulating film), as necessary, directly on the upper surface 2a and the lower surface 2b of the wiring substrate 2. In this case, in the lower surface 2b of the wiring substrate 2, the bonding lead BL and the bump land LA are exposed from the solder resist layer (opening of the solder resist layer), while the wiring line (wiring line coupling the bonding lead BL with the bump land LA) in the lower surface 2b of the wiring substrate 2 is covered by the solder resist layer. When the solder resist layer (insulating layer, insulating film) is formed directly on the upper surface 2a (31a) of the wiring substrate 2 (31), the surface of the solder resist layer (insulating layer, insulating film) can be considered as the upper surface 2a (31a) of the wiring substrate 2 (31a). The supporting surface 13a of the supporting part 13 of the heat-releasing plate 4 comes into contact with the surface of the solder resist layer (insulating layer, insulating film). When the solder resist layer (insulating layer, insulating film) is formed directly on the lower surface 2b (31b) of the wiring substrate 2, the surface of the solder resist layer (insulating layer, insulating film) can be considered as the lower surface 2b (31b) of the wiring substrate 2 (31).

Consequently, the electrode pads PD of the semiconductor chip 5 are coupled with the bonding leads BL, placed directly on the lower surface 2b of the wiring substrate 2, via the bonding wires BW, and further are coupled with the bump lands LA (and the solder balls 9 coupled with the bump lands LA), placed directly on the lower surface 2b of the wiring substrate 2, via the wiring lines of the wiring substrate 2 and the like. Each bonding wire BW (conductive wire, conductive coupling member) functions as the conductive coupling member for electrically coupling each electrode pad PD of the semiconductor chip 5 with each bonding lead BL of the wiring substrate 2. Preferably the bonding wire BW is made of a conductive wire (coupling member) such as metal thin wire including gold wire.

The bump lands LA are arranged in an array pattern directly on the lower surface 2b of the wiring substrate 2 within a region in which the sealing portions 8 are not arranged. Each bump land LA is coupled with the solder ball 9 (ball electrode, solder bump, bump electrode, protruded electrode). As a result, in the lower surface 2b of the wiring substrate 2, the solder balls 9 as the external terminals are arranged in an array pattern in the region in which the sealing portions 8 are not arranged.

The lower surface 2b of the wiring substrate 2 on which the solder balls 9 are arranged becomes the lower surface of the semiconductor device 1 and becomes the mounting surface (main surface of the side being mounted to the mounting substrate) of the semiconductor device 1. Consequently, the semiconductor device 1 of the embodiment 1 is a semiconductor of BGA (Ball Grid Array package) type. The solder ball 9 is made of a solder material and functions as the bump electrode (protruded electrode, solder bump) of the semiconductor device 1, and can function as the external terminal (terminal for external coupling) of the semiconductor device 1. Therefore, it can be said that the respective external terminals (solder balls 9 in the embodiment 1) are formed directly on the bump lands LA of the wiring substrate 2.

The sealing portions 7 and 8 (sealing resin portion, resin sealing portion, sealing resin, sealing body) are made of a resin material such as thermosetting resin material, and can contain a filler. For example, the sealing portions 7 and 8 can be prepared by using an epoxy resin containing a filler.

The sealing portion 7 is formed at the upper surface 2a side of the wiring substrate 2, while the sealing portion 8 is formed at the lower surface 2b side of the wiring substrate 2. However, the main surface 8a (the main surface distant from the lower surface 2b of the wiring substrate 2) of the sealing portion 8 is positioned at closer side to the lower surface 2b of the wiring substrate 2 than the position of the lower end of the solder ball 9 (or the end part opposite to the side coupling the bump land LA, or the front end of the solder ball 9). That is, when the semiconductor device 1 is placed directly on a flat plane, the flat plane contacts with the lower end of the solder ball 9, and does not contact with the sealing portion 8 (the main surface 8a of the sealing portion 8). The structure prevents the sealing portion 8 from interfering with the mounting of the semiconductor device 1 over the mounting substrate.

The sealing portion 8 is formed above the lower surface 2b of the wiring substrate 2 and above the main surface 12a of the convex part 12 of the heat-releasing plate 4 so that the semiconductor chip 5 and the bonding wires BW are covered. Thus the sealing portion 8 seals the semiconductor chip 5 and the bonding wires BW to protect them. In the lower surface 2b of the wiring substrate 2, the bonding leads BL are covered with the sealing portion 8. However, the bump lands LA and the solder balls 9 coupling the bump lands LA are not covered with the sealing portion 8. That is, in the lower surface 2b of the wiring substrate 2, the solder balls 9 are exposed and function as the external terminals of the semiconductor device 1.

The sealing portion 7 is formed to seal a portion of the heat-releasing plate 4 and to cover the side surface of the base material part 11 of the heat-releasing plate 4 over the upper surface 2a of the wiring substrate 2. However, the rear surface 11b of the base material part 11 of the heat-releasing plate 4 is exposed from the sealing portion 7 (the upper surface 7a of the sealing portion 7). The upper surface 7a of the sealing portion 7 and the rear surface 11b of the base material part 11 of the heat-releasing plate 4, exposed from the upper surface 7a of the sealing portion 7, can be formed in nearly flat plane. Nevertheless, it is preferable that the rear surface 11b of the base material part 11 of the heat-releasing plate 4, exposed from the upper surface 7a of the sealing portion 7, is in nearly the same plane as the upper surface 7a of the sealing portion 7, or is protruded to some extent from the upper surface 7a of the sealing portion 7. A part of the sealing portion 7 is formed in the gap 18.

As described above, the sealing portion 7 and the sealing portion 8 are integrally connected each other via the resin material MR which fills the gap part 15 between the side surface 12b of the convex part 12 of the heat-releasing plate 4 and the inside wall of the through-hole 3. Consequently, the sealing portion 7 (the sealing portion 7 includes the resin material MR in the gap 18), the sealing portion 8, and the resin in the gap part 15 are integrally formed, and they are formed by the same resin material MR.

As described above, the semiconductor device 1 of the present embodiment is a semiconductor device (semiconductor package) which mounts the semiconductor chip 5 over the convex part 12 of the heat-releasing plate 4 positioned in the through-hole 3 of the wiring substrate 2. To the lower surface 2b of the wiring substrate 2, the solder balls 9 as the external terminals are joined, and the heat-releasing plate 4 (the base material part 11 of the heat-releasing plate 4) is exposed from the sealing portion 7 of the upper surface 2a of the wiring substrate 2. The heat generated from the semiconductor chip 5 is transferred by conduction to the heat-releasing plate 4 (the convex part 12 of the heat-releasing plate 4) via the joining material 14, and the heat is released to the outside of the semiconductor device 1 from the exposed portion (the rear surface 11b of the base material part 11 of the heat-releasing plate 4) at the upper surface side (the upper surface 2a of the wiring substrate 2) of the semiconductor device 1. Owing to the structure, the embodiment 1 can improve the heat-release performance (heat-release properties) of the semiconductor device. The semiconductor device 1 of the embodiment 1 is a high-heat-releasing type semiconductor device (semiconductor package). The solder ball 9 can also contribute to the heat-release to the outside of the semiconductor device 1, though the heat-releasing effect is smaller than that of the heat-releasing plate 4.

By the close contact (adhesion) of the sealing portions 7 and 8 with (to) the wiring substrate 2 and the heat-releasing plate 4, respectively, the wiring substrate 2, the heat-releasing plate 4, and the sealing portions 7 and 8 couple together, and by filling a resin into the gap part 15 and the gap 18 integrally with the sealing portions 7 and 8, the coupling of the wiring substrate 2, the heat-releasing plate 4, and the sealing portions 7 and 8 is further strengthened.

<Mounting the Semiconductor Device>

The mounting of the semiconductor device 1 is described below.

Figure 18:
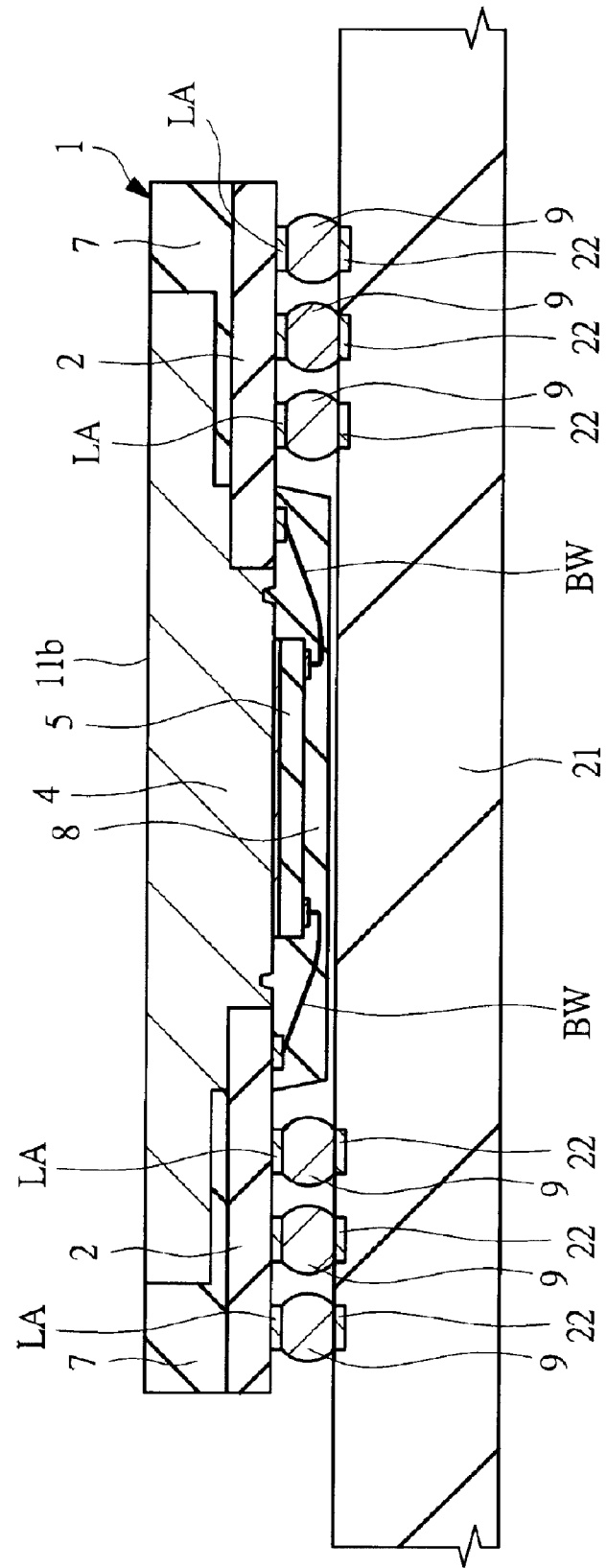
FIG. 18 illustrates amounting example of a semiconductor device, in cross-sectional view, in an embodiment of the present invention.

FIG. 18 is a cross-sectional view (side surface cross sectional view) of semiconductor device 1 in the present embodiment, illustrating an example of mounting. FIG. 18 shows the semiconductor device 1 mounted over the mounting substrate 21 (wiring substrate).

The mounting substrate 21 given in FIG. 18 is a wiring substrate (mounting substrate) for mounting the semiconductor device 1 thereon. To the upper surface as the mounting surface for mounting the semiconductor device 1 thereon, a plurality of substrate-side terminals 22 (terminals, electrodes, pad electrodes, conductive lands) for coupling the respective solder balls of the semiconductor device 1 are provided. Although FIG. 18 gives a simplified illustration of the cross-sectional structure of the mounting substrate 21, the mounting substrate 21 is preferably a multilayer wiring substrate being formed by laminating integrally a plurality of insulator layers (dielectric layers, insulating base material layers) and a plurality of wiring layers (conductor layers, conductor pattern layers). The substrate-side terminal 22 is a terminal for coupling the solder ball 9 (bump electrode) as the external terminal of the semiconductor device 1. The substrate-side terminal 22 is positioned so as to face the solder ball 9 when the semiconductor device 1 is mounted over the upper surface of the mounting substrate 21.

Mounting of the semiconductor device 1 over the mounting substrate 21 is done by supplying a solder paste (the solder paste is unified with the solder ball 9 by the solder reflow treatment) directly onto the substrate-side terminals 22 of the mounting substrate 21 by using printing method and the like, and by mounting (placing) the semiconductor device 1 over the mounting substrate 21 so that the position of the solder ball 9 of the semiconductor device 1 and the position of the substrate-side terminal 22 of the mounting substrate 21 are aligned, and then by applying solder reflow treatment.

By the above procedure, as illustrated in FIG. 18, the semiconductor device 1 is mounted (solder-mounted) over the mounting substrate 21, the semiconductor device 1 is fixed to the mounting substrate 21, and the solder balls 9 as the external terminals of the semiconductor device 1 are coupled with the substrate-side terminals 22 of the mounting substrate 21, respectively.

For the mounting case of FIG. 18, the heat generated from the semiconductor chip 5 is transferred to the heat-releasing plate 4 (the convex part 12 of the heat-releasing plate 4), and the heat is released to the outside (to air in this case) of the semiconductor device 1 from the exposed portion of the upper surface side of the semiconductor device 1 in the heat-releasing plate 4, (from the rear surface 11b of the base material part 11 of the heat-releasing plate 4). There may be the heat-release generated from the solder ball 9 to the mounting substrate 21, though the heat-releasing effect is smaller than that of the heat-releasing plate 4.

Figure 19:
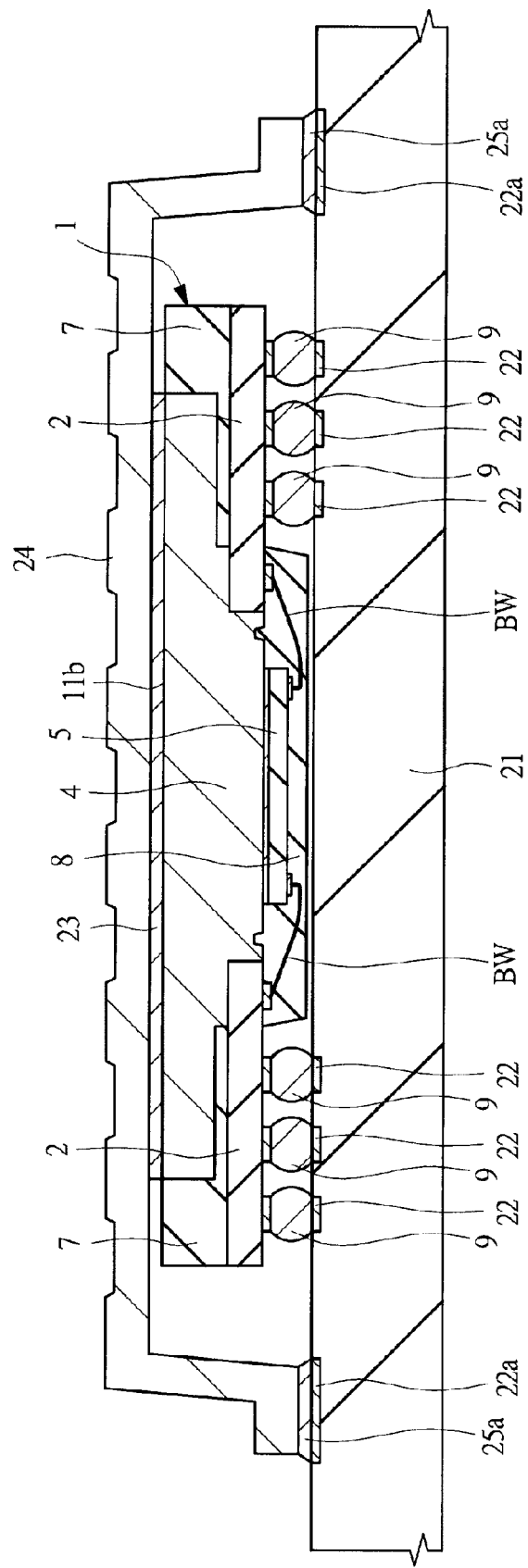
FIG. 19 illustrates another mounting example of a semiconductor device, in cross-sectional view, in an embodiment of the present invention.

FIG. 19 is a cross-sectional view (side surface cross-sectional view) of the semiconductor device 1 in the present embodiment, illustrating another example of mounting. FIG. 18 shows the semiconductor device 1 mounted over the mounting substrate 21 (wiring substrate).

The example of mounting of FIG. 19 differs from that of FIG. 18 in the following respects.

In the same way as the case of FIG. 18, the semiconductor device 1 is mounted over the mounting substrate 21, and the solder balls 9 of the semiconductor substrate 1 are coupled with the substrate-side terminals 22 of the mounting substrate 21, respectively. In FIG. 19, however, the semiconductor device 1 mounted over the mounting substrate 21 is covered with a casing 24, (or contained in the casing 24). The heat-releasing plate 4 (the rear surface 11b of the base material part 11 of the heat-releasing plate 4) being exposed at upper surface side of the semiconductor device 1 is coupled with the casing 24 via a conductive sheet 23 (adhesive). The casing 24 is a heat-releasing casing, has electric conductivity, and is preferably formed by a metallic material. A portion of the casing 24 (lead part) is coupled and fixed to a substrate-side terminal 22a of the mounting substrate 21 via a solder 25a and the like.

For the mounting example of FIG. 19, the heat generated from the semiconductor chip 5 is transferred to the heat-releasing plate 4 (the convex part 12 of the heat-releasing plate 4), and is released (conducted) to the casing 24 from the heat-releasing plate 4 via the conductive sheet 23. The heat transferred (released) from the heat-releasing plate 4 to the casing 24 is released via a passage from the casing 24 to air and via a passage from the casing 24 to the mounting substrate 21 via the solder 25a. Connecting the heat-releasing plate 4 of the semiconductor device 1 with the casing 24 further improves the heat-release properties of the semiconductor device 1.

Figure 20:
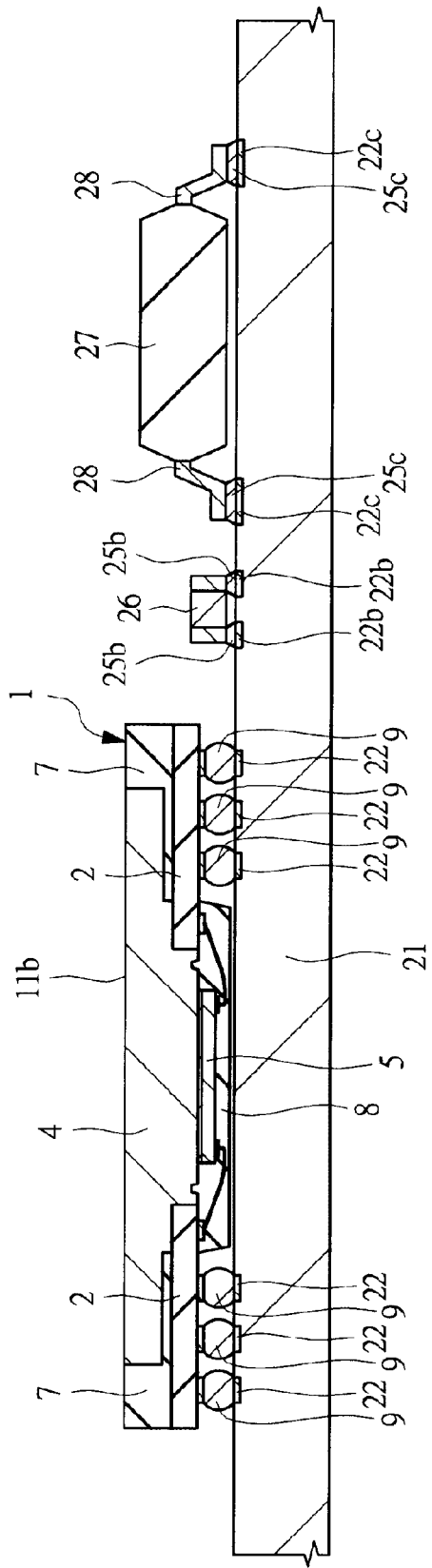
FIG. 20 illustrates a further mounting example of a semiconductor device, in cross-sectional view, in an embodiment of the present invention.

FIG. 20 is a cross-sectional view (side surface cross-sectional view) of the semiconductor device 1 in the embodiment 1, illustrating further example of mounting. FIG. 20 shows the semiconductor device 1 mounted over the mounting substrate 21 (wiring substrate).

The mounting example of FIG. 20 differs from that of FIG. 18 in the following points.

In the same way as the case of FIG. 18, the semiconductor device 1 is mounted over the mounting substrate 21, and the solder balls 9 of the semiconductor device 1 are coupled with the substrate-side terminals 22 of the mounting substrate 21, respectively. In FIG. 20, however, components other than the semiconductor device 1, such as a chip component 26 and a semiconductor device 27 (semiconductor package), are mounted over the mounting substrate 21. The chip component 26 is structured by passive components such as a chip capacitor and a chip inductor, and the like. The electrode of the chip component 26 is coupled and fixed to a substrate-side terminal 22b of the mounting substrate 21 via a solder 25b and the like. An outer lead part 28 of the semiconductor device 27 (semiconductor package) is coupled and fixed to a substrate-side terminal 22c of the mounting substrate 21 via a solder 25c and the like. The type and the number of the components to be mounted over the mounting substrate 21 can be adequately selected as necessary.

Figure 21:
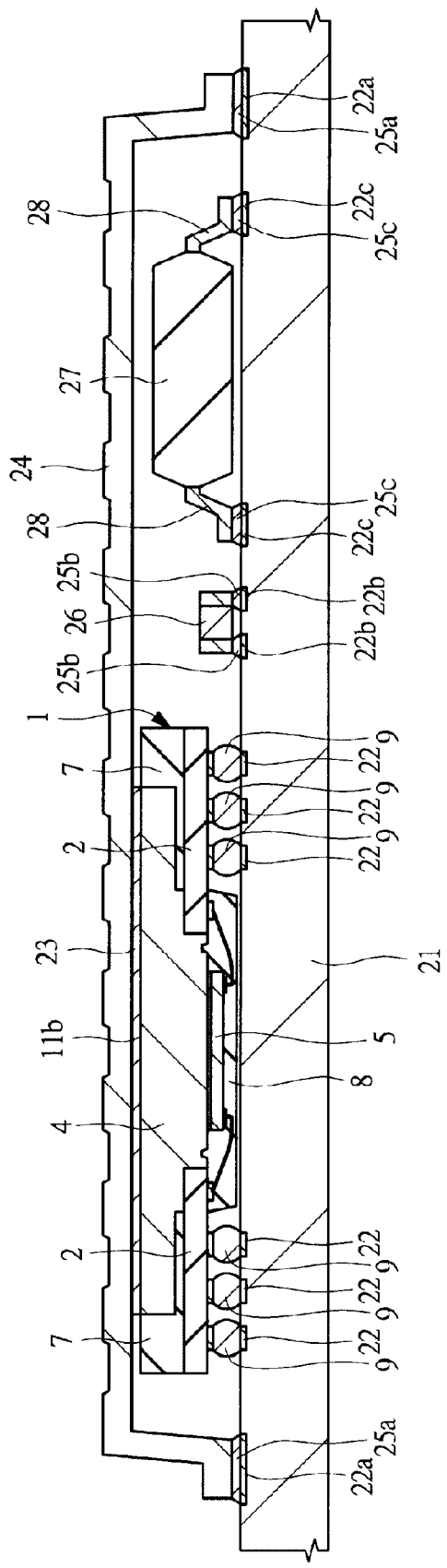
FIG. 21 illustrates a still another mounting example of a semiconductor device, in cross-sectional view, in an embodiment of the present invention.

FIG. 21 is a cross-sectional view (side surface cross-sectional view) of the semiconductor device 1 in the embodiment 1, illustrating an example of mounting. FIG. 21 shows the semiconductor device 1 mounted over the mounting substrate 21 (wiring substrate).

The mounting example of FIG. 21 differs from that of FIG. 20 in the following respects.

In the same way as the case of FIG. 20, the semiconductor device 1, the chip component 26, and the semiconductor device 27 are mounted over the mounting substrate 21. In FIG. 21, however, the semiconductor device 1, the chip component 26, and the semiconductor device 27 mounted over the mounting substrate 21 are covered with the casing 24, (or are contained in the casing 24). The heat-releasing plate 4 (the rear surface 11b of the base material part 11 of the heat-releasing plate 4) being exposed at the upper surface side of the semiconductor device 1 is coupled with the casing 24 via the conductive sheet 23. The casing 24 is a heat-releasing casing, has electric conductivity, and is preferably formed by a metallic material. A portion of the casing 24 (lead part) is coupled and fixed to the substrate-side terminal 22a of the mounting substrate 21 via the solder 25a and the like.

For the mounting example of FIG. 21, the heat generated from the semiconductor chip 5 is transferred to the heat-releasing plate 4 (the convex part 12 of the heat-releasing plate 4), and is released (transferred) to the casing 24 from the heat-releasing plate 4 via the conductive sheet 23. The heat transferred (released) from the heat-releasing plate 4 to the casing 24 is released via a passage from the casing 24 into the air and via a passage from the casing 24 to the mounting substrate 21 via the solder 25a. Connecting the heat-releasing plate 4 of the semiconductor device 1 with the casing 24 further improves the heat-release properties of the semiconductor device 1.

<Manufacturing Process of Semiconductor Device>

Figure 22:
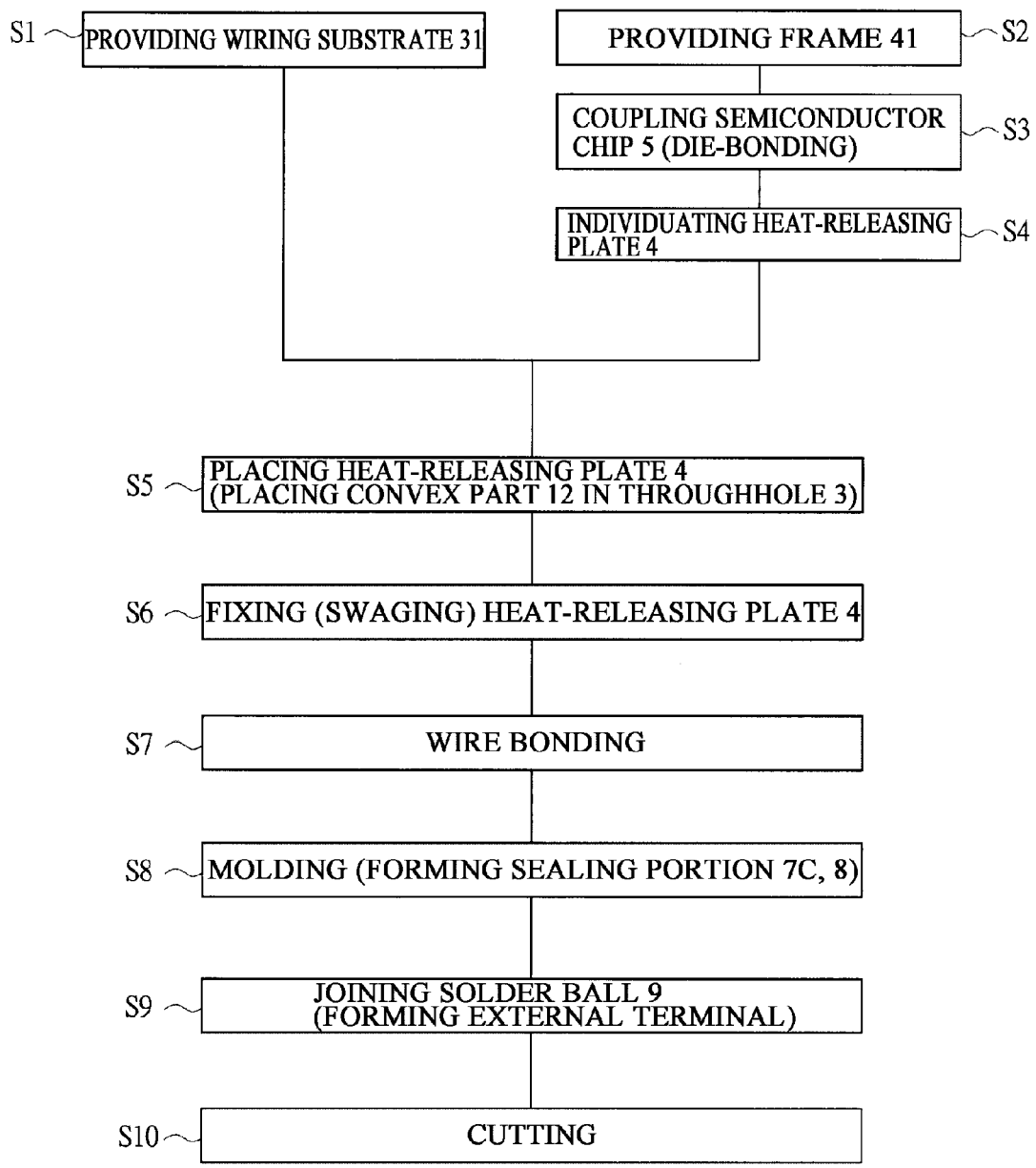
FIG. 22 illustrates a flow diagram of manufacturing process of semiconductor device in an embodiment of the present invention.

The method of manufacturing the semiconductor device 1 of the embodiment 1 is described in the following referring to the drawings. FIG. 22 illustrates the flow diagram of manufacturing process of semiconductor device 1 in the embodiment 1. FIGS. 23 to 46 are plan views or cross-sectional views of the semiconductor device 1 of the embodiment 1 during the manufacturing process.

The embodiment 1 describes the case of manufacturing the individual semiconductor device 1 by using a wiring substrate 31 (wiring substrate base body) for family molding, (or using the wiring substrate 31 directly on which a plurality of wiring substrates 2 is formed in a row or in an array pattern).

Figure 23:
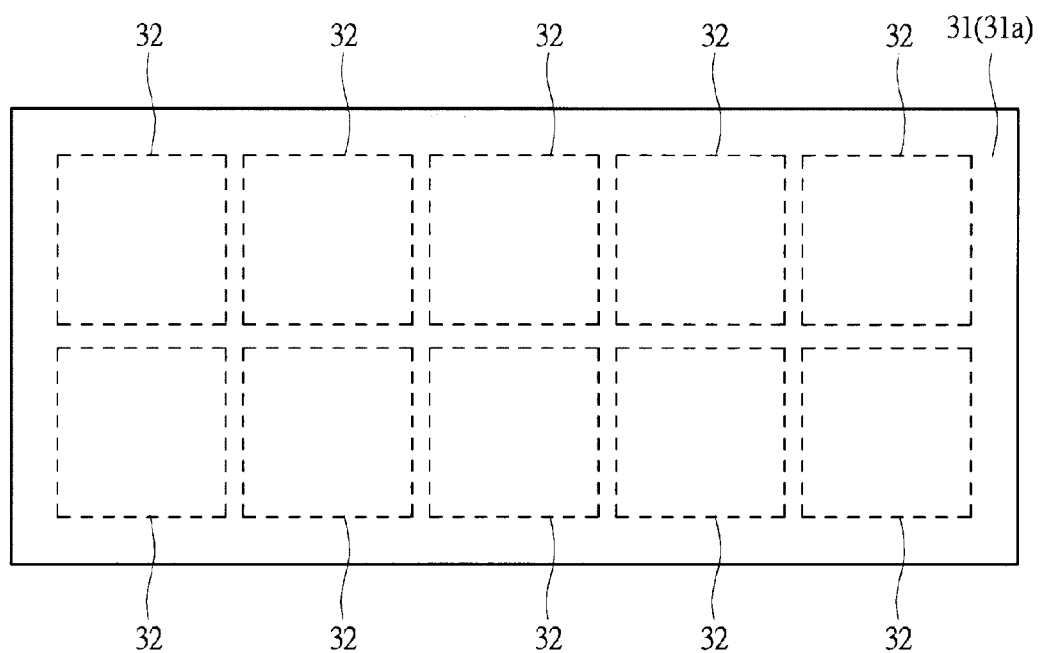
FIG. 23 is a top view (entire plan view) of a wiring substrate used in the manufacturing process of semiconductor device in an embodiment of the present invention.
Figure 24:
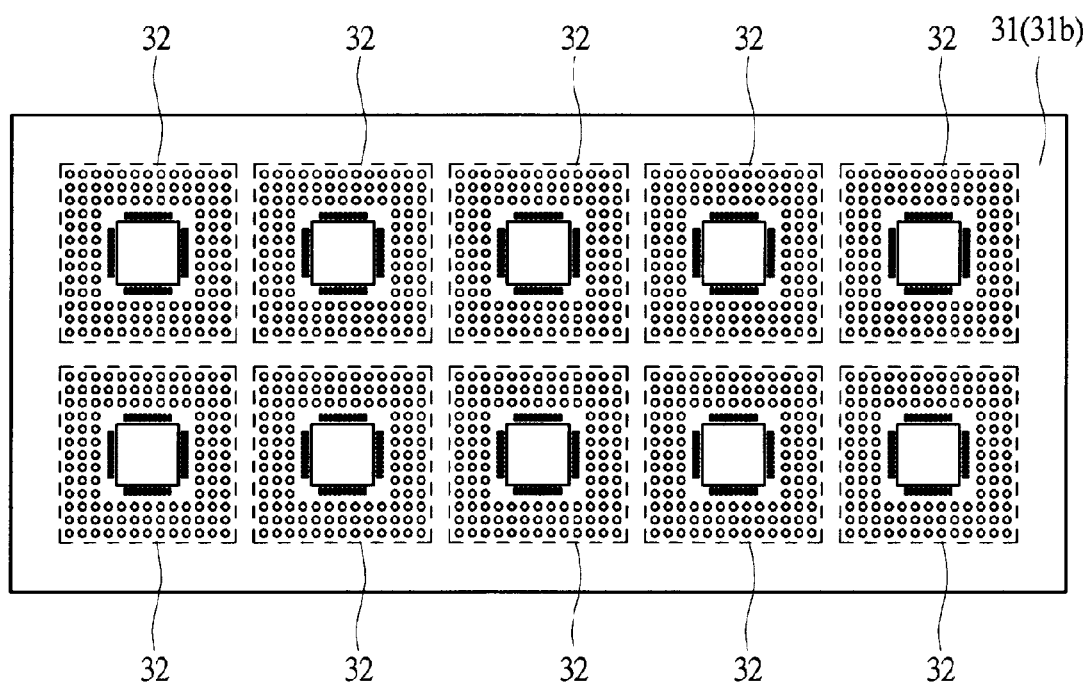
FIG. 24 is a bottom view (entire plan view) of a wiring substrate used in the manufacturing process of semiconductor device in an embodiment of the present invention.
Figure 25:
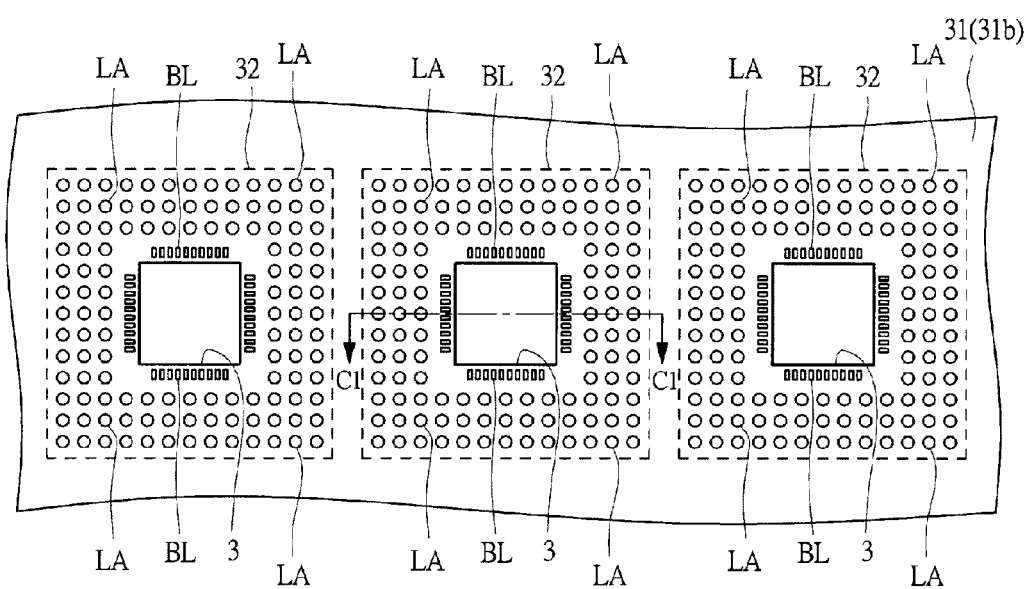
FIG. 25 is a part-enlarged plan view (bottom view) of FIG. 24.
Figure 26:
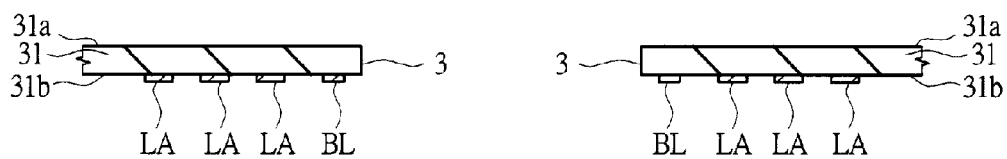
FIG. 26 is a cross-sectional view of the wiring substrate of FIG. 25.

As illustrated in FIGS. 23 to 26, the wiring substrate 31 is provided (step S1 of FIG. 22). FIG. 23 is the upper surface view of the wiring substrate 31, and FIG. 24 and FIG. 25 are the lower surface views of the wiring substrate 31. FIG. 23 shows the entire upper surface 31*a* of the wiring substrate 31, and FIG. 24 shows the entire lower surface 31*b* of the wiring substrate 31. FIG. 25 is a part-enlarged view of FIG. 24, (or three semiconductor device regions 32 in the lower surface 31*b* of the wiring substrate 31). FIG. 26 is a cross-sectional view (main-part cross sectional view) of the wiring substrate 31, giving the cross section along the C1-C1 line of FIG. 25. The position of C1-C1 line of FIG. 25 corresponds to the position of A1-A1 l line of FIGS. 5 to 10. Accordingly, FIG. 26 gives the same cross section as that of FIG. 1.

The wiring substrate 31 is the mother body of the wiring substrate 2. The wiring substrate 31 is cut in the step of cutting (described later) into individual semiconductor device regions 32 (substrate region, unit substrate region) which correspond to the wiring substrates 2 of the semiconductor device 1. The wiring substrate 31 has a structure of a row or a matrix of arranged semiconductor device regions 32, each of the semiconductor regions 32 forms each semiconductor device 1 thereon. Accordingly, the structure of each semiconductor device region 32 in the wiring substrate 31 is similar to that of the wiring substrate 2. Consequently, when the upper surface (main surface) 31*a* and the lower surface (rear surface) 31*b* of each semiconductor device region 32 of the wiring substrate 31 are enlarged, 31*a* and 31*b* are the same as FIG. 11 and FIG. 12, respectively.

Thus, the wiring substrate 31 has the upper surface (main surface) 31*a* as the main surface at one side and the lower surface (rear surface) 31*b* as the main surface at opposite side. The upper surface 31*a* of the wiring substrate 31 becomes the upper surface 2*a* of the wiring substrate 2 in succeeding step, and the lower surface 31*b* of the wiring substrate 31 becomes the lower surface 2*b* of the wiring substrate 2 in succeeding step. In each semiconductor device region 32 of the wiring substrate 31, the through-hole 3 which penetrates from the upper surface 31*a* to the lower surface 31*b* of the wiring substrate 31 is formed, and in each semiconductor device region 32 of the lower surface 31*b* of the wiring substrate 31, the bonding leads BL and the bump lands LA are formed.

In each semiconductor device region 32 of the lower surface 31*b* of the wiring substrate 31, the bonding leads BL are formed at periphery of the through-hole 3. In each semiconductor device region 32 of the lower surface 31*b* of the wiring substrate 31, the bump lands LA are formed in peripheral area of the region in which the bonding leads BL are arranged. The bonding leads BL and the bump lands LA in each semiconductor device region 32 of the lower surface 31*b* of the wiring substrate 31 are coupled with each other via wring lines of each semiconductor device region 32 of the wiring substrate 31.

In FIGS. 23 to 25, each semiconductor device region 32 is encircled by a broken line. FIG. 23 and FIG. 24 (entire plan view of the wiring substrate 31) give an example in which ten semiconductor device regions 32 in five rows and two columns is arranged to form the wiring substrate 31. The arrangement is not limited to the example, and the number of rows and columns of the semiconductor device regions 32 can be varied as necessary.

Figure 27:
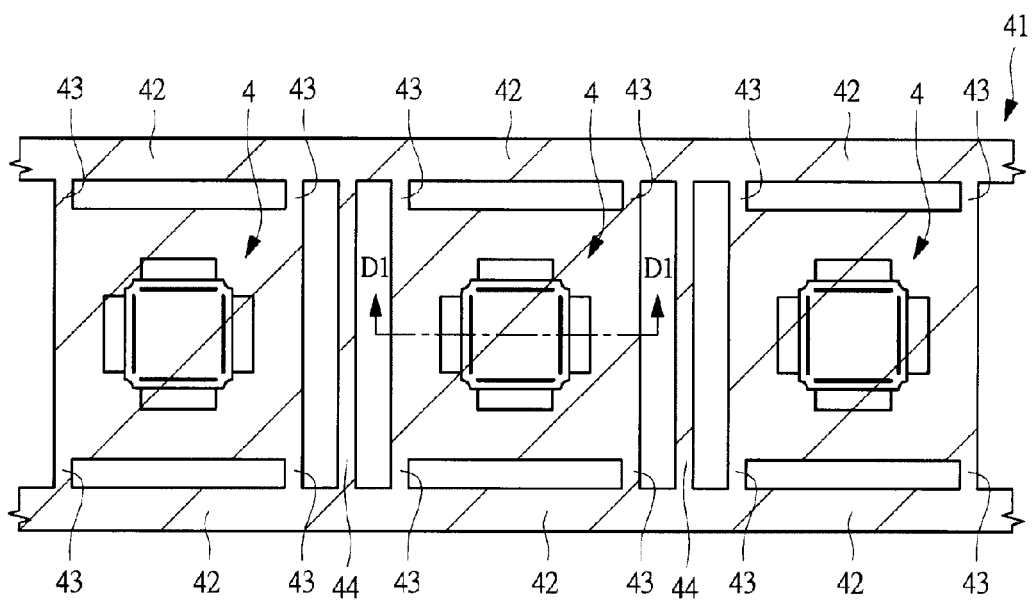
FIG. 27 is a plan view of a frame used in the process of manufacturing semiconductor device in an embodiment of the present invention.
Figure 28:
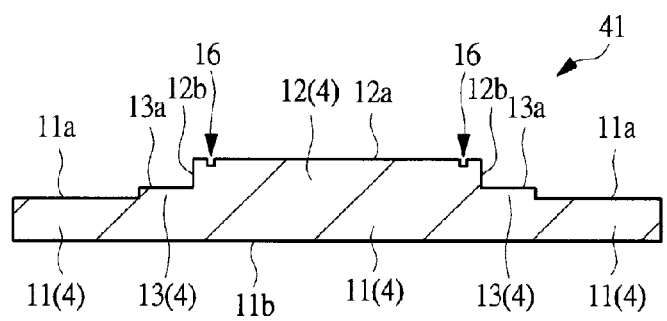
FIG. 28 is a cross-sectional view of the frame of FIG. 27.

Next, as illustrated in FIG. 27 and FIG. 28, a frame 41 for the heat-releasing plate 4 is provided, (step S2 of FIG. 22). FIG. 27 is the plan view of the frame 41 at the side of forming the convex part 12 of the heat-releasing plate 4. FIG. 28 corresponds to the cross-sectional view along the D1D1 line in FIG. 27. FIG. 27 is a plan view, which is emphasized with hatching for the convenience of recognition of the frame 41. The position of D1-D1 line in FIG. 27 corresponds to the position of A1-A1 line of FIGS. 5 to 10 and to the position of B1-B1 line of FIG. 13. FIG. 28 and FIG. 16 are upside down from each other, though FIG. 28 shows the same cross section as that of FIG. 16.

The frame 41 is configured such that a plurality of heat-releasing plates 4 is integrally joined with a frame rim 42 (rim part). That is, the heat-releasing plates 4 are arranged at a specified spacing between two frame rims 42 extending in the same direction, and the position near each of the four corners of the base material part 11 of each heat-releasing plate 4 is joined with the frame rim 42 via a joining part 43. The frame 41 can be formed by working a copper plate, for example, in a die. In the frame 41, a joining part 44 for joining the frame rims 42 together is located between adjacent heat-releasing plates 4 in order to reinforce the frame 41. If not required, the joining part 43 can be omitted. For the frame 41, the heat-releasing plate 4, the frame rim 42, the joining part 43, and the joining part 44 are integrally formed by the same material.

As described above, each heat-releasing plate 4 is composed integrally of: the base material part having the main surface 11*a* and the rear surface 11*b* at opposite side to the main surface 11*a*; the convex part 12 being located at central part of the main surface 11*a* of the base material part 11, and protruding from the main surface 11*a*; and the supporting part 13 being formed in the main surface 11*a* of the base material part 11 and being positioned at lower level than the level of the convex part 12. In the main surface 12*a* of the convex part 12, the groove 16 (concave part, concavity) is formed.

Next is the die-bonding step, where the semiconductor chip 5 is mounted to join the main surface 12*a* of the convex part 12 of each heat-releasing plate 4 of the frame 41 via the joining material 14 (step S3 of FIG. 22). The joining step (or die-bonding step) for the semiconductor chip 5 in the step S3 can be conducted by the following procedure.

Figure 29:
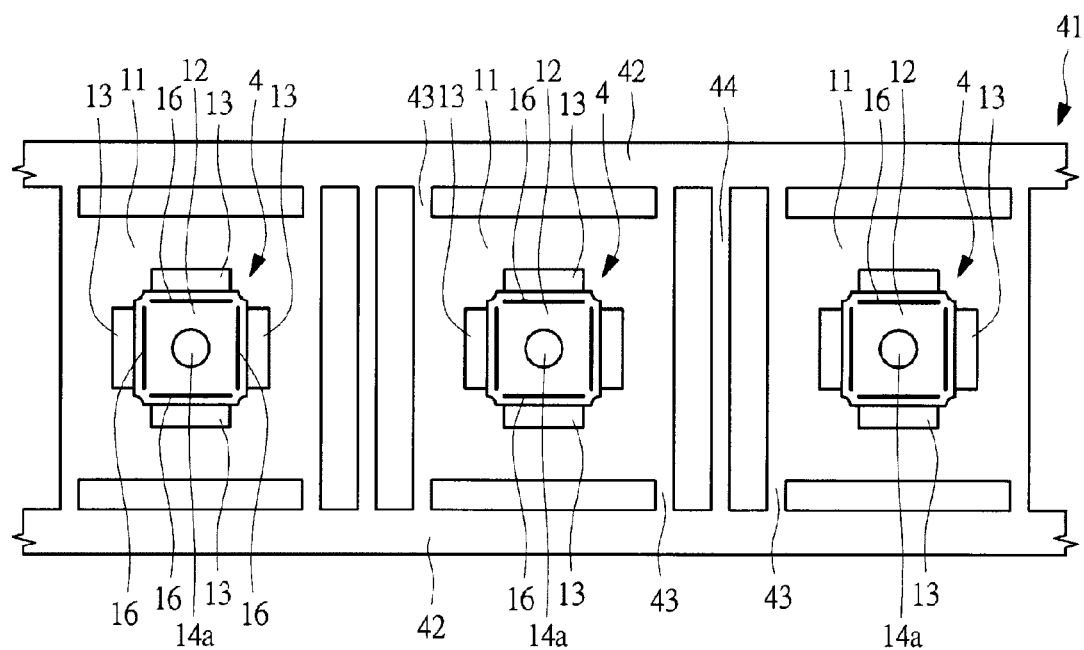
FIG. 29 is a plan view of a semiconductor device during manufacturing process in an embodiment of the present invention.
Figure 30:
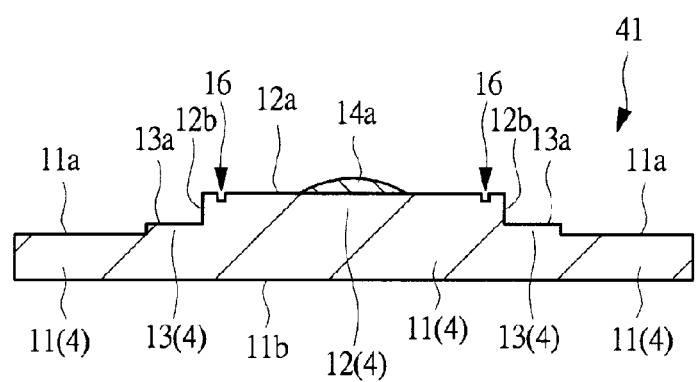
FIG. 30 is a cross-sectional view of the semiconductor device, which is the same as in FIG. 29, during manufacturing process.
Figure 31:
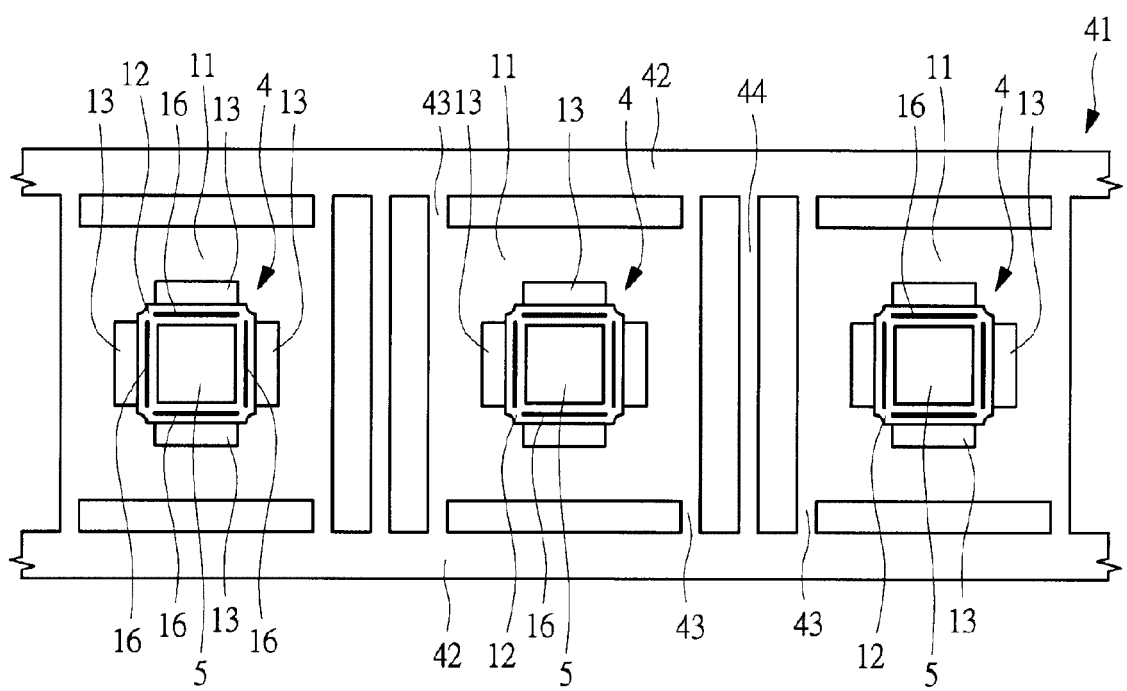
FIG. 31 is a plan view of the semiconductor device in the next step of FIG. 29, during manufacturing process.
Figure 32:
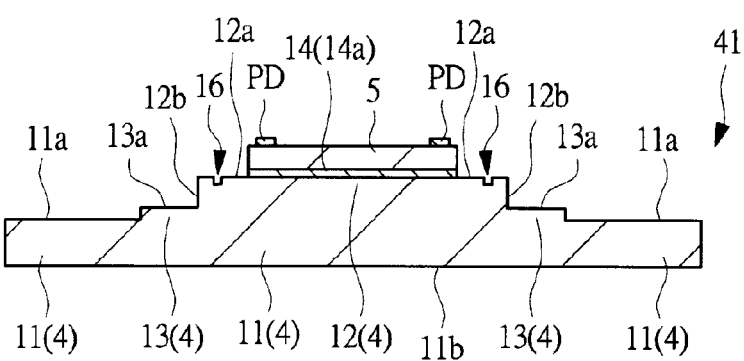
FIG. 32 is a cross-sectional view of the semiconductor device, which is the same as in FIG. 31, during manufacturing process.

As illustrated in FIG. 29 (plan view of the region same as FIG. 27) and FIG. 30 (cross-sectional view corresponding to FIG. 28), the lower surface of the frame 41 is faced upward so that the main surface 12*a* of the convex part 12 of each heat-releasing plate 4 of the frame 41 faces upward. Then a solder 14*a* is applied (placed) directly on the main surface 12*a* of the convex part 12 of each heat-releasing plate 4 of the frame 41. After that, as necessary, the solder 14*a* directly on the main surface 12*a* of the convex part 12 of each heat-releasing plate 4 of the frame 41 is agitated, and then the semiconductor chip 5 is mounted (placed) over the main surface 12*a* of the convex part 12 of each heat-releasing plate 4 of the frame 41 via the solder 14*a* as illustrated in FIG. 31 (plan view of the region the same as that of FIG. 27 and FIG. 29) and FIG. 32 (cross sectional view corresponding to FIG. 28 and FIG. 30). These steps, or the step of applying the solder 14*a* to the convex part 12 of each heat-releasing plate 4 of the frame 41, the step of agitating the solder 14*a*, and the step of mounting the semiconductor chip 5 over the convex part 12 of the heat-releasing plate 4 are executed while heating entire frame 41 including the heat-releasing plate 4, and after completing the step of mounting the semiconductor chip 5 over the convex part 12 of the heat-releasing plate 4, the frame 41 is cooled near room temperature. By the above procedure, the solder 14*a* which was in a molten state on mounting the semiconductor chip 5 is solidified. Thus solidified solder 14a is joined to fix the semiconductor chip 5 to the convex part 12 (main surface 12a of the convex part 12) of the heat-releasing plate 4. The solidified solder 14a becomes the joining material 14.

The solder 14a is preferably a high-melting point solder, and is preferably a solder having higher melting point than the solder which is used as the external terminal (the solder ball 9 in this embodiment) formed directly on the bump land LA afterward. With that type of solder 14a, there can be prevented the melting of solder 14a which joins the semiconductor chip 5 with the convex part 12 of the heat-releasing plate 4, (or the joining material 14 made of the solder 14a), even when the solder ball 9 is melted in the step S9 of connecting solder ball 9 and in the step of mounting the completed semiconductor device 1, (or the step of mounting the semiconductor device 1 over the mounting substrate 21). By the procedure, the reliability of joining the semiconductor chip 5 with the convex part 12 of the heat-releasing plate 4 is improved, which increases the thermal conduction from the semiconductor chip 5 to the heat-releasing plate 4, and which thus improves the heat-releasing performance of the semiconductor device 1.

In the step S3 of coupling the semiconductor chip 5, the semiconductor chip 5 is mounted at a position closer to the center than the region in which the groove 16 is formed, in the main surface 12a of the convex part 12 of each heat-releasing plate 4. The groove 16 formed in the main surface 12a of the convex part 12 of each heat-releasing plate 4 is prevented from adhesion of the solder 14a (joining material 14). By further locating a groove between the groove 16 and the semiconductor chip 5, the filling of the groove 16 in the main surface 12a of the convex part 12 of each heat-releasing plate 4 with the joining material 14 can more surely be prevented.

Figure 33:
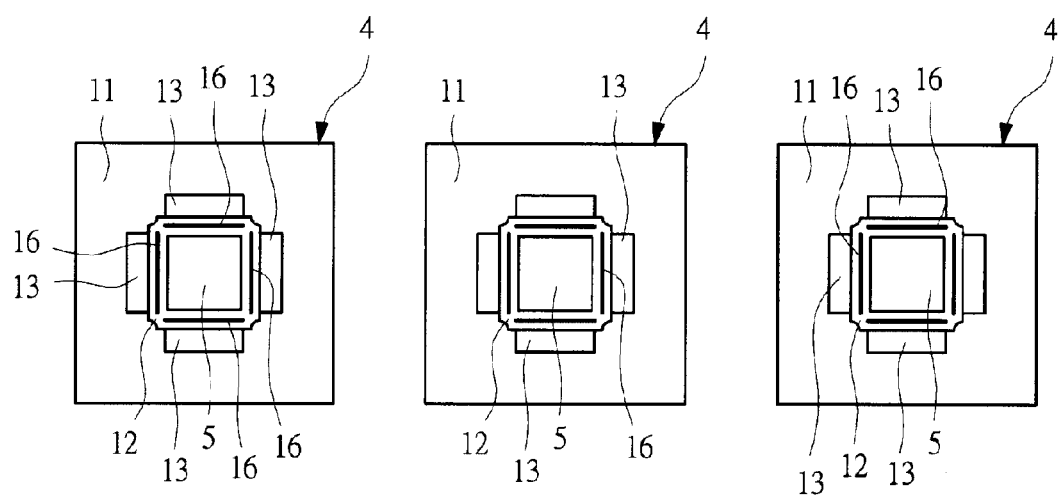
FIG. 33 is a plan view of the semiconductor device in the next step of FIG. 31, during manufacturing process.
Figure 34:
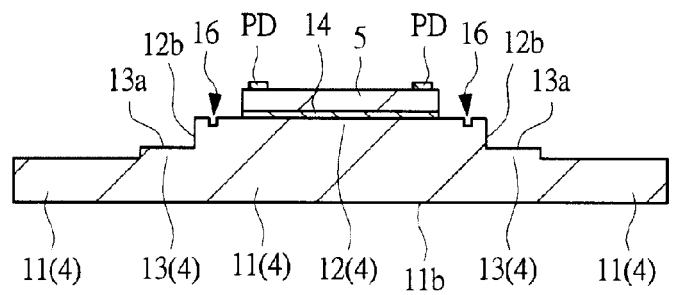
FIG. 34 is a cross-sectional view of the semiconductor device, which is the same as in FIG. 33, during manufacturing process.

Next step is to cut the frame rim 42 of the frame 41 to separate individual heat-releasing plates 4 mounting the semiconductor chips 5 thereon, (the step S4 of FIG. 22). That is, by cutting the joining part 43 between the heat-releasing plate 4 and the frame rim 42, each heat-releasing plate 4 mounting the semiconductor chip 5 thereon is separated from the frame rim 42 of the frame 41. As illustrated in FIG. 33 (plan view) and FIG. 34 (cross-sectional view corresponding to FIG. 28, FIG. 30, and FIG. 32), the individuation of the heat-releasing plate 4 mounting the semiconductor chip 5 thereon is conducted.

The embodiment 1 describes the step S3 which conducts joining the semiconductor chips 5 with the respective heat-releasing plates 4 in a state of joining the frame 41 with the heat-releasing plates 4, followed by the step S4 which conducts the individuation of the heat-releasing plates 4 mounting the semiconductor chips 5 thereon. However, another embodiment can be applied in reverse sequence of the step S3 and the step S4. When the sequential order of the step S3 and the step S4 is inversed, the applicable procedure is that, before conducting the step S3 of die-bonding, the step S4 is conducted to separate the heat-releasing plate 4 from the frame rim 42 to perform the individuation, followed by applying the step S3 of joining the semiconductor chip 5 with the main surface 12a of the convex part 12 of each heat-releasing plate 4 after the individuation via the joining material 14. Regarding the detail method of the die-bonding as the step S3, there can be applied a method almost the same as the above-described one except that the individuation of the heat-releasing plates 4 is completed in advance.

Figure 35:
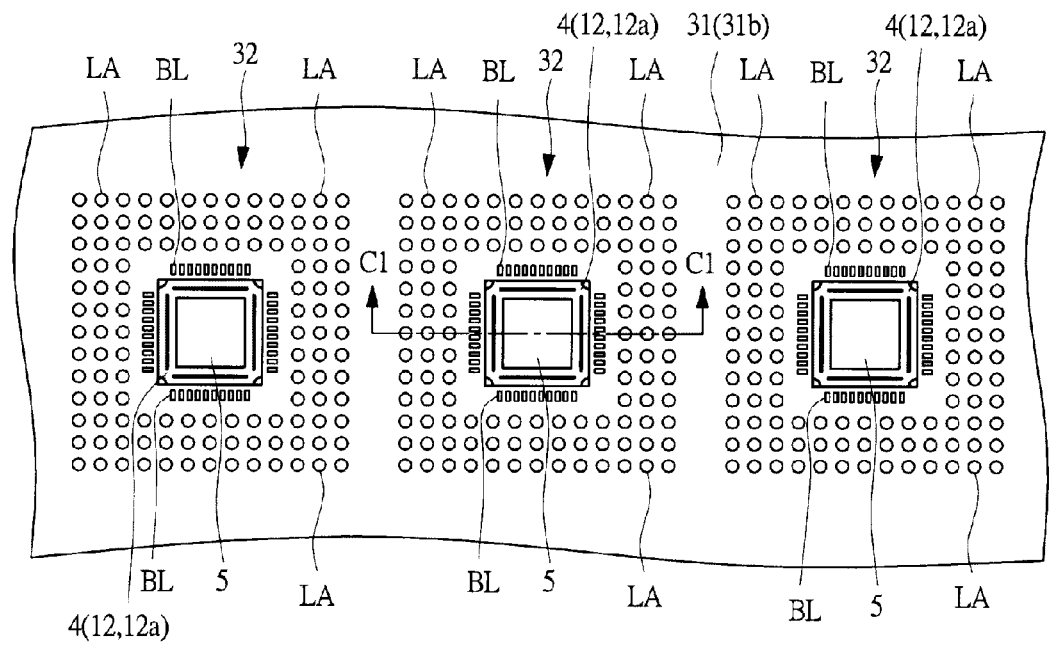
FIG. 35 is a plan view of the semiconductor device in the next step of FIG. 33, during manufacturing process.
Figure 36:
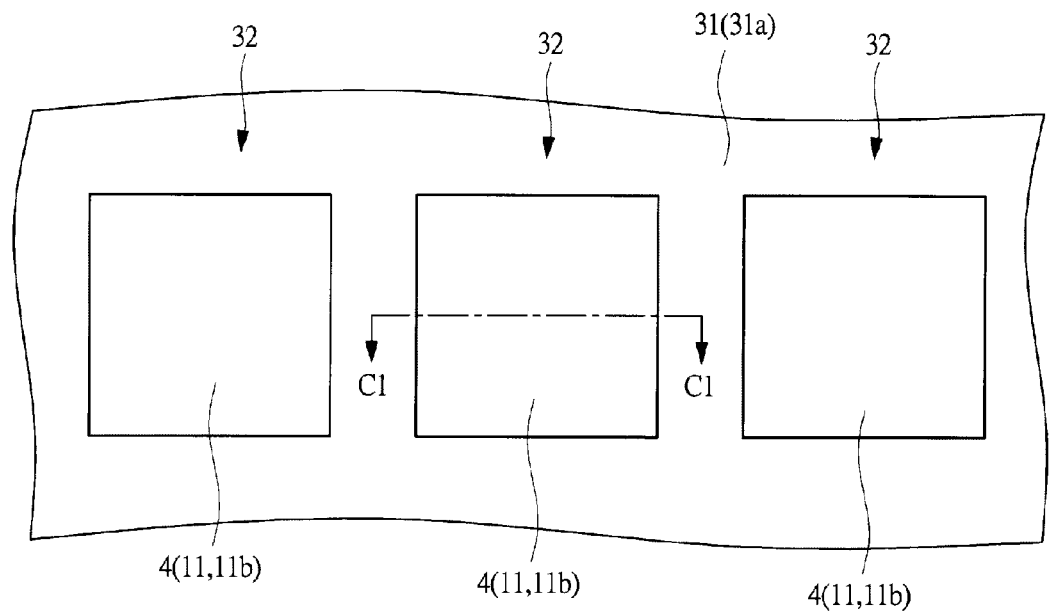
FIG. 36 is a plan view of the semiconductor device, the same as that in FIG. 35, during manufacturing process.
Figure 37:
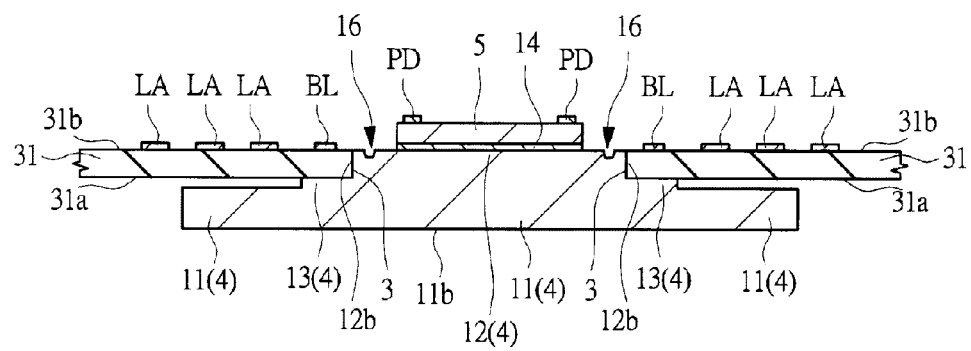
FIG. 37 is a cross-sectional view of the semiconductor device, which is the same as in FIG. 35, during manufacturing process.

Next step is to position (insert) the convex par 12 of the heat-releasing plate 4 mounting the semiconductor chip 5 thereon in the through-hole 3 of each semiconductor device region 32 of the wiring substrate 31 (the step S5 of FIG. 22), as illustrated in FIGS. 35 to 37. After that, by swaging each heat-releasing plate 4 (the convex part 12 of the heat-releasing plate 4) to the wiring substrate 31 (each through-hole 3 of the wiring substrate 31), each heat-releasing plate 4 is fixed to the wiring substrate 31, (the step S6 of FIG. 22). FIGS. 35 to 37 are the plan views illustrating the stages in which the steps S5 and S6 are completed (FIG. 35 and FIG. 36, respectively), or the cross-sectional view (FIG. 37). FIG. 35 and FIG. 36 show the same region as that of FIG. 25, (or three semiconductor device regions 32), specifically FIG. 35 shows the lower surface 31b side of the wiring substrate 31, while FIG. 36 shows the upper surface 31a side of the wiring substrate 31. FIG. 37 shows the cross-sectional view corresponding to FIG. 26, (or the cross section along C1-C1 line of FIG. 35 and FIG. 36). By conducting the steps S5 and S6, the position of C1-C1 line agrees with the position of D1-D1 line.

In the step S5 of placing the heat-releasing plate 4, the heat-releasing plate 4 is positioned to the upper surface 31a side of the wiring substrate 31 so that the main surface 11a of the base material part 11 of the heat-releasing plate 4 faces the upper surface 31a of the wiring substrate 31, so that the convex part 12 of the heat-releasing plate 4 is positioned within the through-hole 3 of the wiring substrate 31, and so that the supporting part 13 (supporting surface 13a of the supporting part 13) of the heat-releasing plate 4 contacts with the upper surface 31a of the wiring substrate 31. With the structure, there is established a state in which the convex part 12 of the heat-releasing plate 4 is inserted (located) in each through-hole 3 of the wiring substrate 31. In this state, the heat-releasing plate 4 is not fixed to the wiring substrate 31, though the side surface 12b of the convex part 12 located in the through-hole 3 faces the inside wall of the through-hole 3.

In the step S6, the groove 16 in the main surface 12a of the convex part 12 of the heat-releasing plate 4 is widened forcibly (for example, the groove 16 is forcibly widened by using a jig such as the jig 46 described later), which brings a portion of the side surface 12b of the convex part 12 into direct contact with the inside wall of the through-hole 3, and which thereby swages each heat-releasing plate 4 (the convex part 12 of the heat-releasing plate 4) to the wiring substrate 31 (each through-hole 3 of the wiring substrate 31) to fix thereto.

Before conducting the steps S5 and S6, there is a need of providing the wiring substrate 31 in the step S1. To do this, the step S1 of providing the wiring substrate 31 can be given at any of: before the step S2; simultaneous with the step S2; after the step S2 and before the step S3; simultaneous with the step S3; after the step S3 and before the step S4; simultaneous with the step S4; and after the step S4 and before the step S5.

Regarding the steps S5 and S6 of placing the heat-releasing plate 4 and of swaging (fixing) the heat-releasing plate 4, respectively, detail description is given later.

Figure 38:
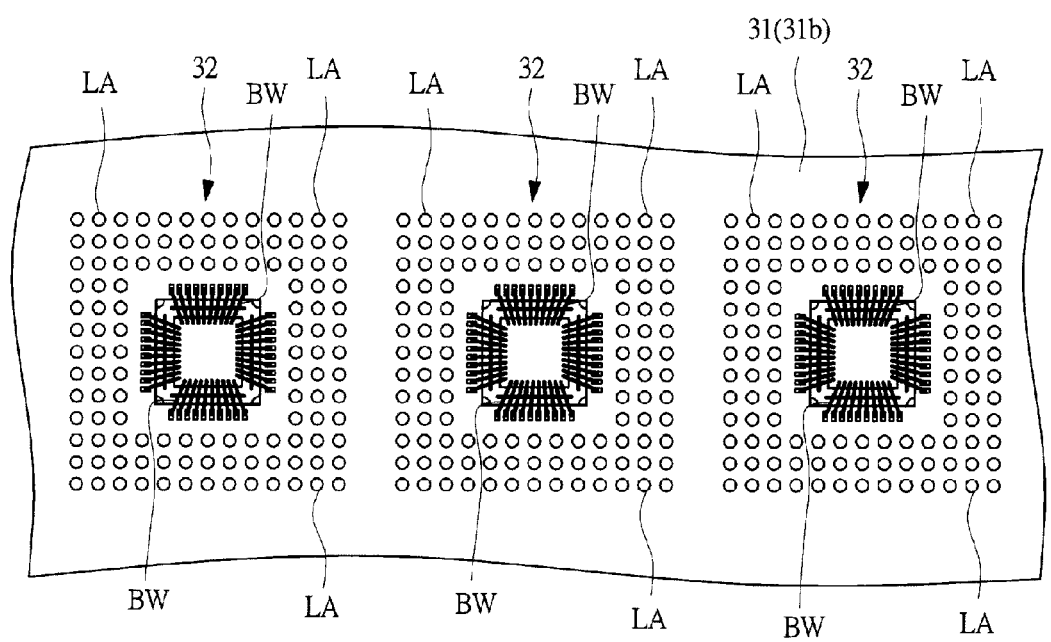
FIG. 38 is a plan view of the semiconductor device in the next step of FIG. 35, during manufacturing process.
Figure 39:
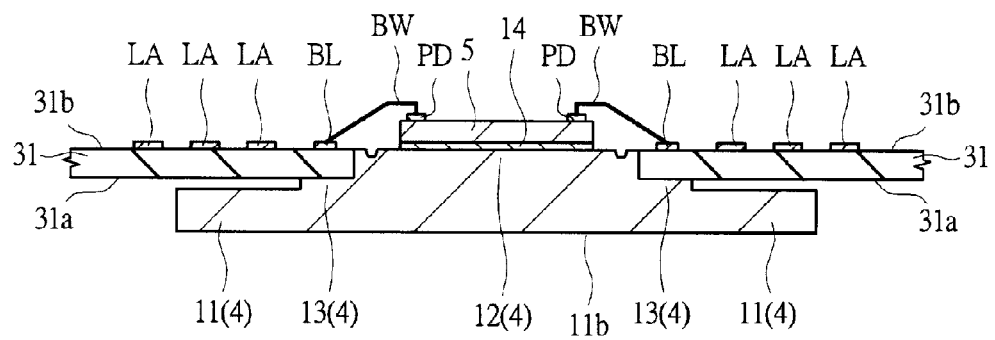
FIG. 39 is a cross-sectional view of the semiconductor device, which is the same as in FIG. 38, during manufacturing process.

Next step is, as illustrated in FIG. 38 and FIG. 39, to conduct the wire bonding to couple electrically each electrode pad PD of the semiconductor chip 5 with the corresponding bonding lead BL formed directly on the wiring substrate 31 via the bonding wire BW as the conductive coupling member (the step S7 of FIG. 22). FIG. 38 and FIG. 39 are the plan view and the cross sectional view, respectively, illustrating the stage in which the step S7 of wire bonding is completed. FIG. 38 shows the same region as that of FIG. 25 and FIG. 35 (or three semiconductor device regions 32), giving the lower surface 31b side of the wiring substrate 31. FIG. 39 shows the cross-sectional view corresponding to FIG. 37 (or the cross section at a position corresponding to the C1-C1 line).

In the step S7 of wire bonding, a plurality of bonding leads BL in each semiconductor device region 32 of the lower surface 31b of the wiring substrate 31 are coupled with the respective electrode pads PD of the semiconductor chip 5 being joined (mounted) with the convex part 12 of the heat-releasing plate 4 located in the through-hole 3 of the semiconductor device region 32 via the respective bonding wires BW (conductive joining member) in a state in which the lower surface 31b of the wiring substrate 31 faces upward.

If, different from the embodiment 1, the step S6 (the step of fixing the heat-releasing plate 4 by swaging) is eliminated, the heat-releasing plate 4 may be detached from the wiring substrate 31 in the step S7 of wire bonding and in the step S8 of molding (described later). In contrast, according to the embodiment 1, the heat-releasing plate 4 is swaged to be fixed to the wiring substrate 31 in the step S6, which can be prevented from the separation of the heat-releasing plate 4 from the wiring substrate 31 during the succeeding step S7 of wire bonding and the like (that is, before forming the sealing portions 7c and 8 in the step S8 of molding (described later)).

Figure 40:
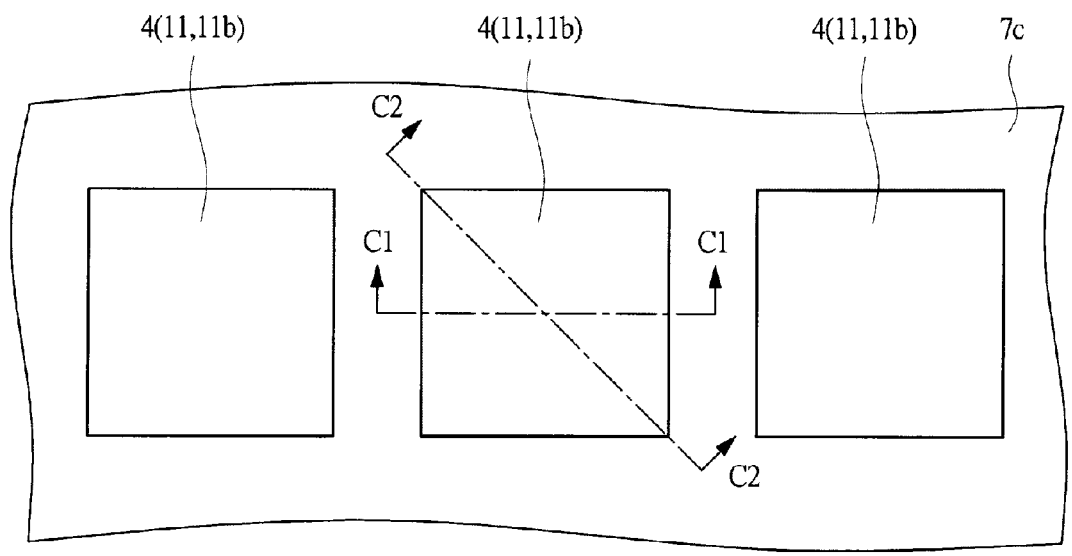
FIG. 40 is a plan view of the semiconductor device in the next step of FIG. 38, during manufacturing process.
Figure 41:
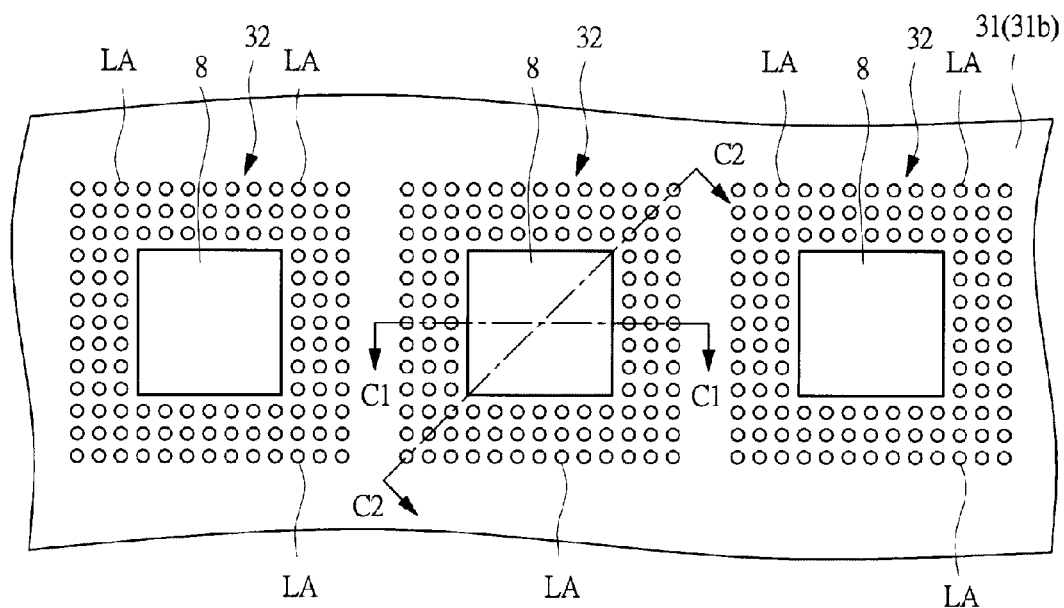
FIG. 41 is a plan view of the semiconductor device, the same as that in FIG. 40, during manufacturing process.
Figure 42:
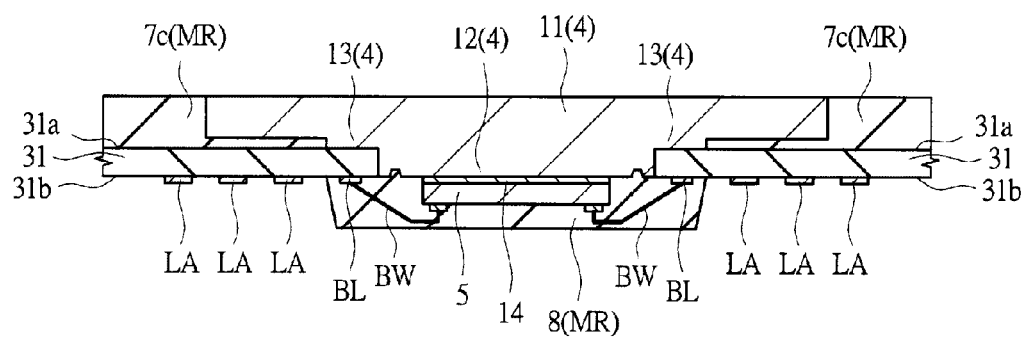
FIG. 42 is a cross-sectional view of the semiconductor device, which is the same as in FIG. 40, during manufacturing process.

After the step S7 of wire bonding, as illustrated in FIGS. 40 to 42, the step of molding (for example, the step of transfer molding) is given to conduct resin-sealing to form the sealing portions 7c and 8 (the step S8 of FIG. 22). The sealing portion 8 seals (resin-sealing) the semiconductor chip 5 and the bonding wires BW in each semiconductor device region 32 at the lower surface 31b side of the wiring substrate 31. Accordingly, the step S8 of molding can be considered as the step of resin-sealing the semiconductor chip 5 and the bonding wires BW (conductive joining member) in each semiconductor device region 32.

FIGS. 40 to 42 are the plan view (FIG. 40 and FIG. 41) and the cross-sectional view (FIG. 42) illustrating the stage in which the sealing portions 7c and 8 were formed in the step S8 of molding. FIG. 40 and FIG. 41 show the same region as that of FIG. 36 and FIG. 35 (or three semiconductor device regions 32), respectively, specifically FIG. 40 shows the upper surface 31a side (or the sealing portion 7c side) of the wiring substrate 31, while FIG. 41 shows the lower surface 31b side of the wiring substrate 31. FIG. 42 is the cross-sectional view corresponding to FIG. 37 and FIG. 39, (or the cross section along the C1-C1 line of FIG. 40 and FIG. 41). However, FIG. 37 and FIG. 39 show the state that the lower surface 3b side of the wiring substrate 31 faces upward, while FIG. 42 of cross sectional view shows the state in which the upper surface 31a side of the wiring substrate 31 faces upward.

According to the embodiment 1, the step S8 of molding forms integrally (by a single step) the sealing portion 7c at the upper surface 31a side of the wiring substrate 31 and the sealing portion 8 at the lower surface 31b side of the wiring substrate 31. The sealing portion 7c is formed so as to cover the entire semiconductor device regions 32 in the upper surface 31a of the wiring substrate 31. On the other hand, the sealing portion 8 is formed so as to cover the semiconductor chip 5 and the bonding wire BW in each of the semiconductor device regions 3 in the lower surface 31b of the wiring substrate 31. The sealing portions 8 formed on the respective semiconductor device regions 32 are separated from each other.

According to the embodiment 1, the step S8 of molding supplies the resin material MR, which is supplied to the upper surface 31a side (cavity CAV1 described later) of the wiring substrate 31, to the lower surface 31b side (cavity CAV2 described later) of the wiring substrate 31 via the gap part 15, and thus the resin material MR forms the sealing portion 7c at the upper surface 31a side of the wiring substrate 31 and the sealing portion 8 at the lower surface 31b side of the wiring substrate 31. The step S8 of molding is described in detail later.

After the convex part 12 of the heat-releasing plate 4 is swaged to be fixed to the wiring substrate 31 in the step S6, the heat-releasing plate 4 is kept fixed to the wiring substrate 31 by swaging until the step S8 of molding is conducted. The procedure can prevent the separation of heat-releasing plate 4 from the through-hole 3 of the wiring substrate 31 before forming the sealing portions 7c and 8. Once the sealing portions 7c and 8 are formed, the heat-releasing plate 4 and the wiring substrate 31 are strongly connected together by the sealing portions 7c and 8. Therefore, after the sealing portions 7c and 8 are formed, separation of the heat-releasing plate 4 from the through-hole 3 of the wiring substrate 31 is surely prevented even under a load and weight.

Figure 43:
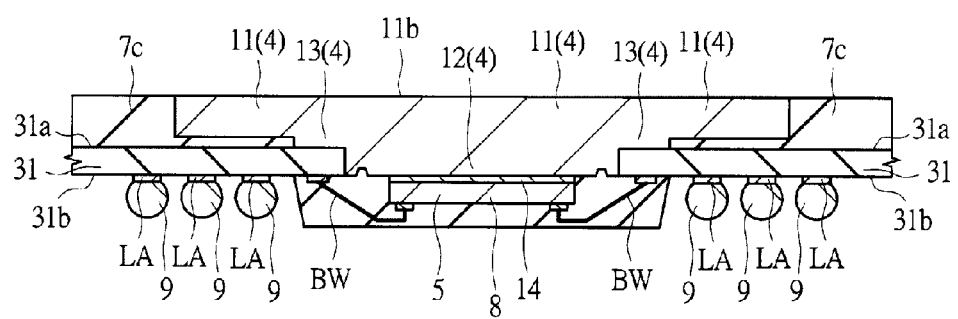
FIG. 43 is a cross-sectional view of the semiconductor device in the next step of FIG. 42, during manufacturing process.

Next, as illustrated in FIG. 43, the solder balls 9 are connected (joined) with the bump lands LA directly on the lower surface 31b of the wiring substrate 31, (the step S9 of FIG. 22), respectively. FIG. 43 is a cross-sectional view illustrating the stage in which connecting the solder balls 9 in the step S9 has been completed, showing the cross section corresponding to FIG. 37, FIG. 39, and FIG. 42, (or the cross section at the position corresponding to the C1-C1 line). The cross section of FIG. 43, however, is in the state that the upper surface 31a side of the wiring substrate 31 faces upward, similar to FIG. 42.

In the step S9 of connecting solder ball 9, the solder ball 9 and the bump land LA of the lower surface 31b of the wiring substrate 31 can be joined to couple each other by, for example, facing the lower surface 31b of the wiring substrate 31 upward, by arranging solder balls 9 directly on the respective bump lands LA of the lower surface 31b of the wiring substrate 31 to temporarily fix them together by a flux or the like, and then by performing solder reflow treatment (reflow treatment, heat treatment) to melt and re-solidify the solder. After that, as necessary, the step of rinsing makes it possible to remove the flux and the like attached to the surface of the solder ball 9. By the procedure, the step S9 forms the solder balls 9 as the external terminals of the semiconductor device 1 directly on the bump lands LA of the lower surface 31b of the wiring substrate 31, respectively. Therefore, the step S9 of connecting solder ball 9 can be considered as a step of forming the external terminals directly on the respective bump lands LA directly on the lower surface 31b of the wiring substrate 31 (or the step of forming the external terminals).

The solder ball 9 connected with the lower surface 31b of the wiring substrate 31 can be considered as the bump electrode (solder bump). The embodiment 1 describes the case of connecting the solder ball 9 as the external terminal of the semiconductor device 1 with the bump land LA. The structure, however, is not limited to the one given in the embodiment 1, and for example, the bump electrode (solder bump) as the external terminal of the semiconductor device 1 can be formed over the bump land LA by supplying the solder directly on the bump land LA by the printing method or the like, instead of the solder balls 9. The material of the external terminal (the solder ball 9 in the embodiment 1) of the semiconductor device 1 may be a lead-containing solder or a lead-free solder, and the lead-free solder is preferred.

Figure 44:
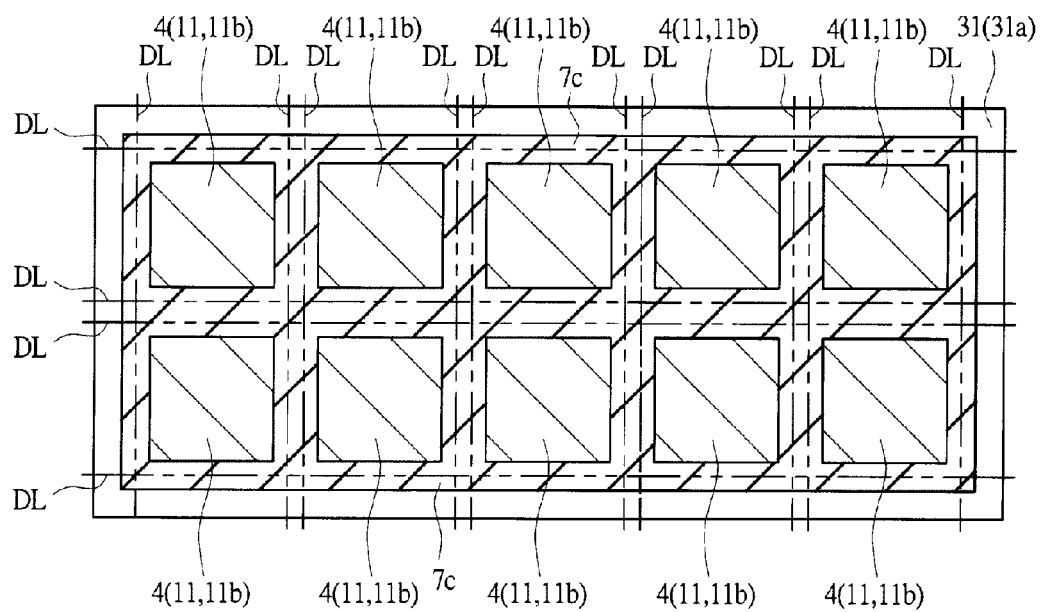
FIG. 44 illustrates a state immediately before the cutting step.
Figure 45:
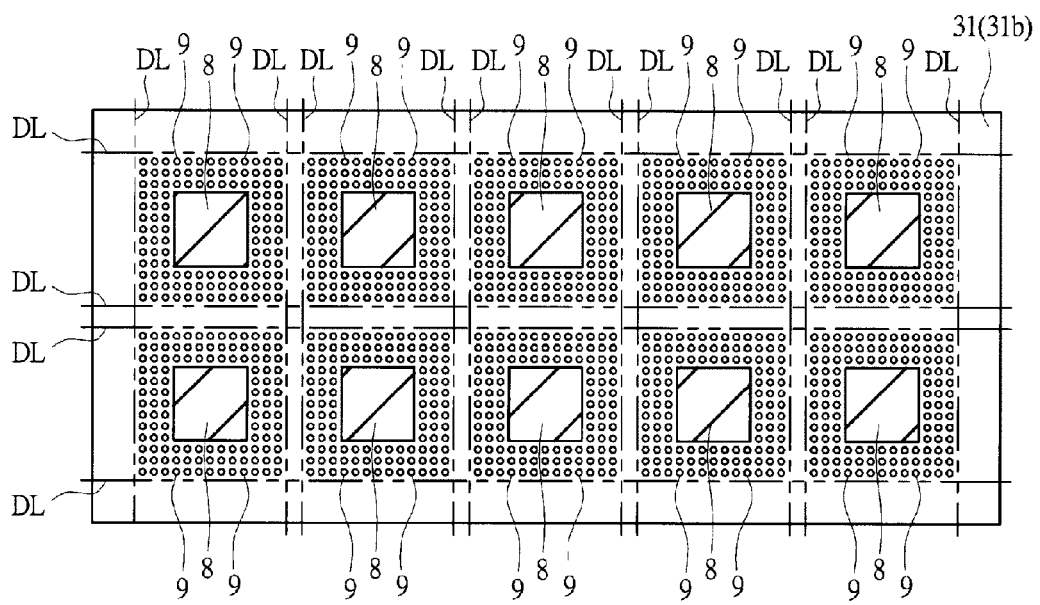
FIG. 45 illustrates a state immediately before the cutting step.

Next step is to cut (dicing) the wiring substrate 31 and the sealing portion 7c formed directly on the upper surface 31a of the wiring substrate 31 to be separated (divided) to the respective semiconductor device regions 32, (the step S10 of FIG. 22). FIG. 44 and FIG. 45 are the plan view (total plan view) illustrating the state immediately before performing the step S10 of cutting, giving the same region as that of FIG. 23 and FIG. 24, respectively, or the entire wiring substrate 31. FIG. 44 shows the upper surface 31a side of the wiring substrate 31, and FIG. 45 shows the lower surface 31b side of the wiring substrate 31. Although FIG. 44 and FIG. 45 are plan views, the sealing portions 7c and 8 are given with hatching for easy understanding, and the dicing line DL in the step S10 of cutting is given by a broken line.

In the step S10 of cutting, the wiring substrate 31 is cut together with the sealing portion 7c of the upper surface 31a of the wiring substrate 31 along the dicing line DL (cutting line, cutting position) given in FIG. 44 and FIG. 45. As can be seen in comparison of FIG. 44 and FIG. 23 and of FIG. 45 and FIG. 24, the dicing line DL extends along the outer periphery of the semiconductor device region 32. That is, the step S10 of cutting separates the wiring substrate 31 and the sealing portion 7c in the supper surface 31a of the wiring substrate 31 into the respective semiconductor device regions 32. Furthermore, since the sealing portion 8 is not formed at the boundary of the semiconductor device regions 32 (or at the dicing line DL), the sealing portion 8 is not cut in the step S10 of cutting.

Figure 46:
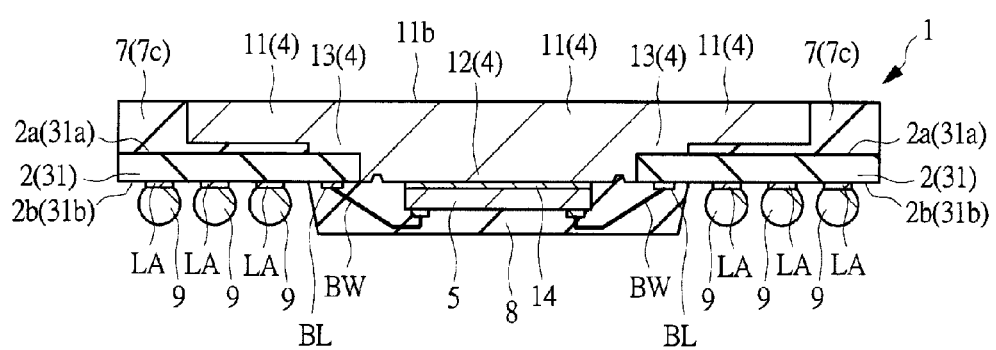
FIG. 46 is a cross-sectional view of the semiconductor device in the next step of FIG. 43, during manufacturing process.

By the step S10 of cutting and individuating, the semiconductor device 1 shown in FIG. 46, (or the semiconductor device 1 shown in FIGS. 1 to 10), can be manufactured. FIG. 46 shows the cross section, the same as that of FIG. 1. The wiring substrate 31 which is cut (divided) to the respective semiconductor device regions 32 corresponds to the wiring substrate 2, and the sealing portion 7c which is cut (divided) to the respective semiconductor device regions 32 corresponds to the sealing portion 7. The upper surface 31a of the wiring substrate 31 corresponds to the upper surface 2a of the wiring substrate 2, and the lower surface 31b of the wiring substrate 31 corresponds to the lower surface 2b of the wiring substrate 2.

<Fixing the Heat-Releasing Plate to the Wiring Substrate>

The above steps S5 and S6 of placing the heat-releasing plate 4 and of fixing (swaging) the heat-releasing plate 4, respectively, will be described below in more detail.

Figure 47:
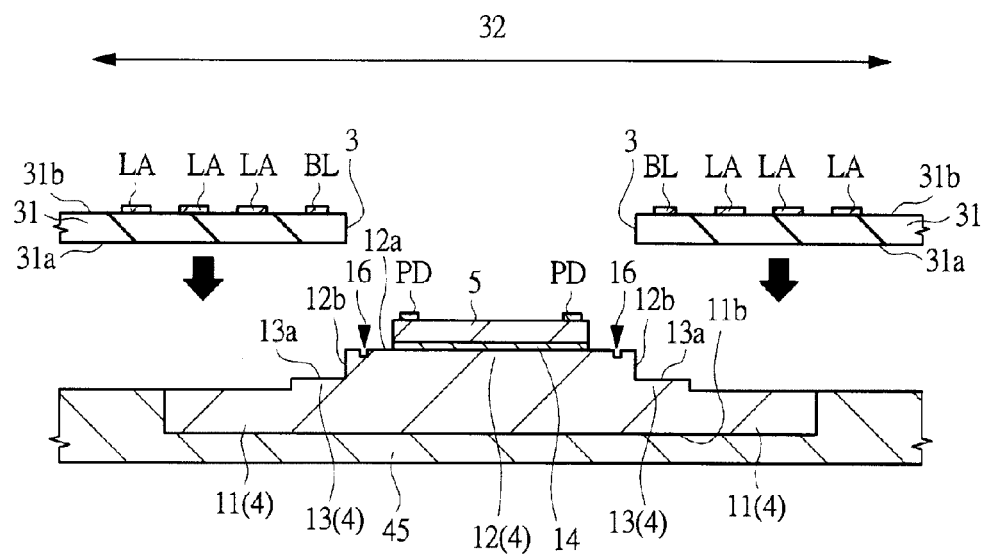
FIG. 47 illustrates the step of positioning heat-releasing plate 4 and the step of fixing (swaging) thereof in the steps S5 and S6, respectively.
Figure 48:
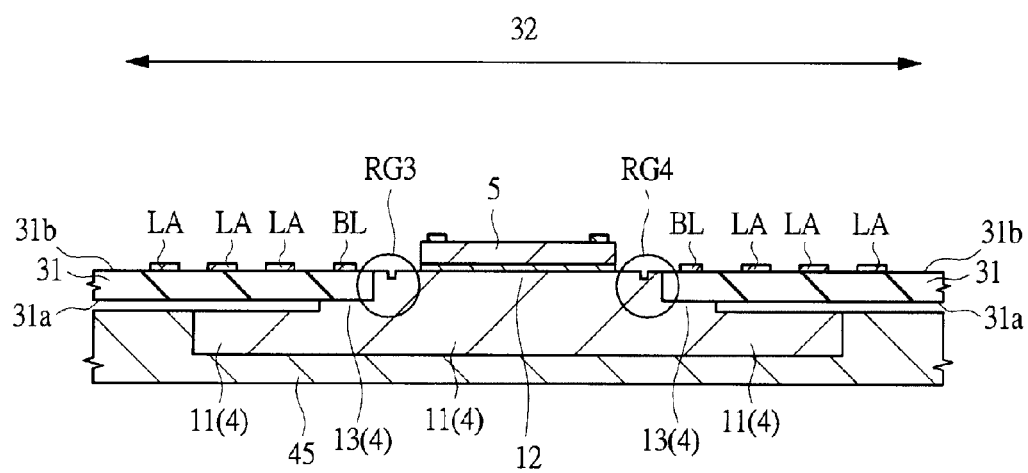
FIG. 48 illustrates the step of positioning heat-releasing plate 4 and the step of fixing (swaging) thereof in the steps S5 and S6, respectively.
Figure 49:
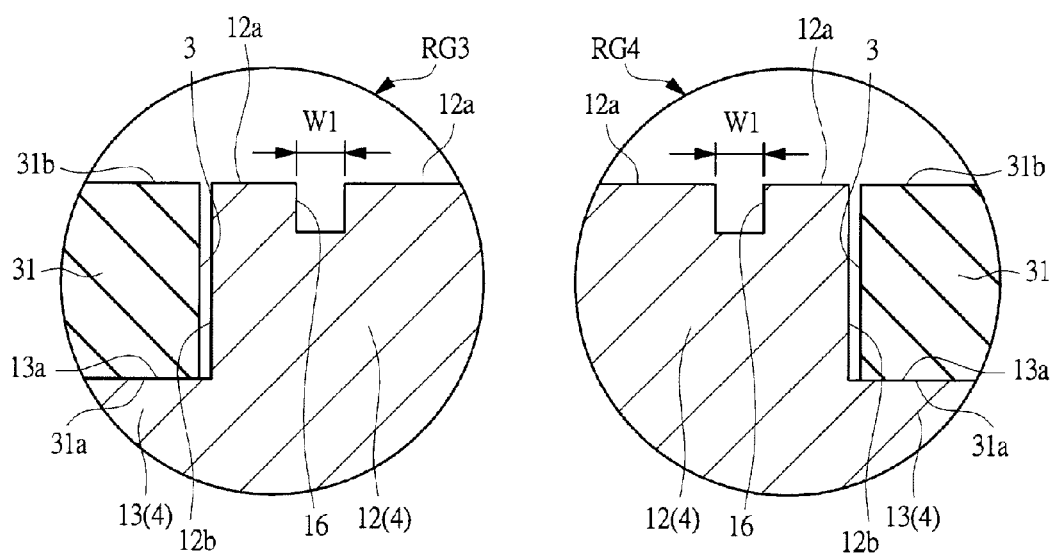
FIG. 49 illustrates the step of positioning heat-releasing plate 4 and the step of fixing (swaging) thereof in the steps S5 and S6, respectively.

The specific procedure of the steps S5 and S6 of placing the heat-releasing plate 4 and of fixing (swaging) the heat-releasing plate 4, respectively, will be described below referring to FIGS. 47 to 55. FIGS. 47 to 55 illustrate the steps S5 and S6 of placing the heat-releasing plate 4 and of fixing (swaging) the heat-releasing plate 4, respectively. FIG. 47, FIG. 48, FIG. 50, FIG. 51, FIG. 53, and FIG. 55 show the cross section corresponding to FIG. 37, (or the cross section at a position corresponding to the C1-C1 line and the D1-D1 line, respectively). FIG. 49 corresponds to the part-enlarged view of regions RG3 and RG4 encircled by the circle in FIG. 48, FIG. 52 corresponds to the part-enlarged view of the regions RG3 and RG4 encircled by the circle in FIG. 51, and FIG. 54 corresponds to the part-enlarged view of the regions RG3 and RG4 encircled by the circle in FIG. 53.

First, the heat-releasing plates 4 corresponding to the quantity of semiconductor device regions 32 constituting the wiring substrate 31 are arranged so that the main surface 12a of the convex part 12 faces upward. The arrangement is given so that the heat-releasing plates 4 correspond to the arrangement of the semiconductor device regions 32 in the wiring substrate 31. These heat-releasing plates 4 are set to be the state given in FIG. 47 on a tray, a carrier 45, or the like. The tray or the carrier 45 may have a structure in which the respective heat-releasing plates 4 are capable of being positioned and arranged so that each convex part 12 of the heat-releasing plates 4 allows inserting into the respective through-holes 3 of the wiring substrate 31 at a time. The tray or the carrier 45 on which the heat-releasing plates 4 are arranged, is put (placed) on a stage (table, working table) (not shown). FIG. 47, FIG. 48 and the like show the region corresponding to a single semiconductor device region 32. As described above, however, a plurality of heat-releasing plates 4 is arranged on the tray or the carrier in practice.

The wiring substrate 31 is positioned above the heat-releasing plates 4 so as the upper surface 31a of the wiring substrate 31 to face the convex part 12 of the heat-releasing plate 4, and the wiring substrate 31 is moved (descended) toward the heat-releasing plates 4 (in the arrow direction of FIG. 47), and then the convex parts 12 of the heat-releasing plates 4 are inserted into (pushed in) the respective through-holes 3 of the semiconductor device regions 32 of the wiring substrate 31, as illustrated in FIG. 48.

As illustrated in FIG. 47, it is preferable that the wiring substrate 31 is moved in a state of fixing the heat-releasing plates 4, (for example, fixing to the tray or the carrier 45), to insert the convex part 12 of each heat-releasing plate 4 into each through-hole 3 of the wiring substrate 31. Alternatively, the heat-releasing plate 4 may be moved in a state of fixing the wiring substrate 31, and each convex part 12 of the heat-releasing plate 4 may be inserted into each through-hole 3 of the wiring substrate 31. That is, the step S5 inserts the convex part 12 of each heat-releasing plate 4 into each through-hole 3 of the wiring substrate 31 by moving the relative position between the wiring substrate 31 and the heat-releasing plates 4. That is to say, the step S5 inserts the convex part 12 of the heat-releasing plate 4 mounting the semiconductor chip 5 thereon into the through-hole 3 of the wiring substrate 31 from the side of upper surface 31a of the wiring substrate 31 (from the side corresponding to the upper surface 2a of the wiring substrate 2).

As described above, the heat-releasing plate 4 is composed of the base material part 11, the convex part 12, and the supporting part 13. In the step S5, the convex part 12 is placed (inserted, contained) in the through-hole 3 of the wiring substrate 31, the base material part 11 is positioned at the upper surface 31a side of the wiring substrate 31, and the supporting surface 13a of the supporting part 13 contacts with the upper surface 31a of the wiring substrate 31.

As can be seen in FIGS. 47 to 49, the inside wall of the through-hole 3 of the wiring substrate 31 is nearly vertical to the upper surface 31a and the lower surface 31b of the wiring substrate 31, and the side surface 12b of the convex part 12 of the heat-releasing plate 4 is nearly vertical to the main surface 12a of the convex part 12 of the heat-releasing plate 4, to the main surface 11a of the base material part 11, and to the supporting surface 13a of the supporting part 13. The cross-sectional shape of the convex part 12 of the heat-releasing plate 4 (the shape of cross section nearly parallel to the main surface 12a of the base material part 12 of the heat-releasing plate 4 and to the supporting surface 13a of the supporting part 13), is set to be equivalent with or to be slightly smaller than the cross-sectional shape of the through-hole 3 of the wiring substrate 31 (the shape of cross section nearly parallel to the upper surface 31a and the lower surface 31b of the wiring substrate 31), and slightly smaller cross-sectional shape is preferred. By setting the cross sectional shape of the convex part 12 of the heat-releasing plate 4 to be slightly smaller than the cross-sectional shape of the through-hole 3 of the wiring substrate 31, the step S5 of inserting the convex part 12 of the heat-releasing plate 4 into the through-hole 3 of the wiring substrate 31 is easily conducted.

The step S5 establishes the state in which the convex part 12 of the heat-releasing plate 4 is inserted (positioned) into each through-hole 3 of the wiring substrate 31. At this stage, however, the heat-releasing plate 4 is not fixed to the wiring substrate 31. In the step S6, the groove 16 in the main surface 12a of the convex part 12 of each heat-releasing plate 4 is widened forcibly, to thereby swage each heat-releasing plate 4 (the convex part 12 of the heat-releasing plate 4) and to be fixed to the wiring substrate 31 (each through-hole 3 of the wiring substrate 31). The procedure is given by forcibly widening the groove 16 in the main surface 12a of the convex part 12 of the heat-releasing plate 4 by using a jig such as the jig 46 (swaging jig).

The above procedure will be described in more detail in the following. The swaging jig 46 positioned above the main surface 12a of the convex part 12 of the heat-releasing plate 4 is moved (descended) in the arrow direction in FIG. 50 toward the groove 16 (or in the direction of nearly vertical to the main surface 12a of the convex part 12 of the heat-releasing plate 4 and in the direction toward the main surface 12a), which thus causes the jig 46 to hit the groove 16 with a front end part 47 of the jig 46, as illustrated in FIG. 51. In other words, the front end part 47 of the jig 46 is pressed against (pushed into) the groove 16 so that the front end part 47 of the jig 46 overlays the groove 16.

Figure 50:
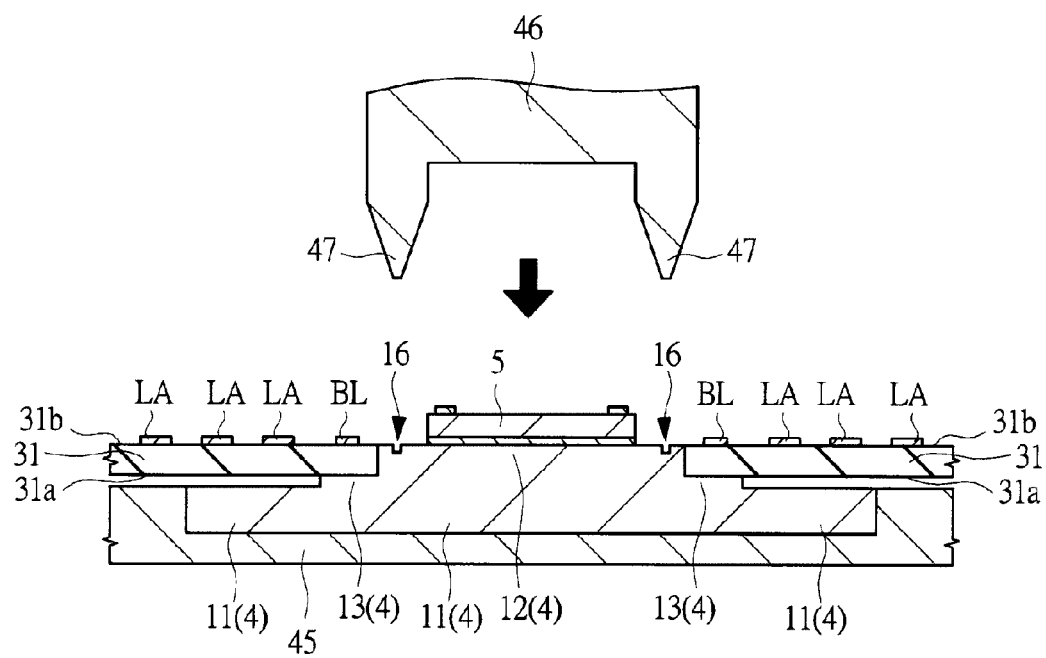
FIG. 50 illustrates the step of positioning heat-releasing plate 4 and the step of fixing (swaging) thereof in the steps S5 and S6, respectively.
Figure 51:
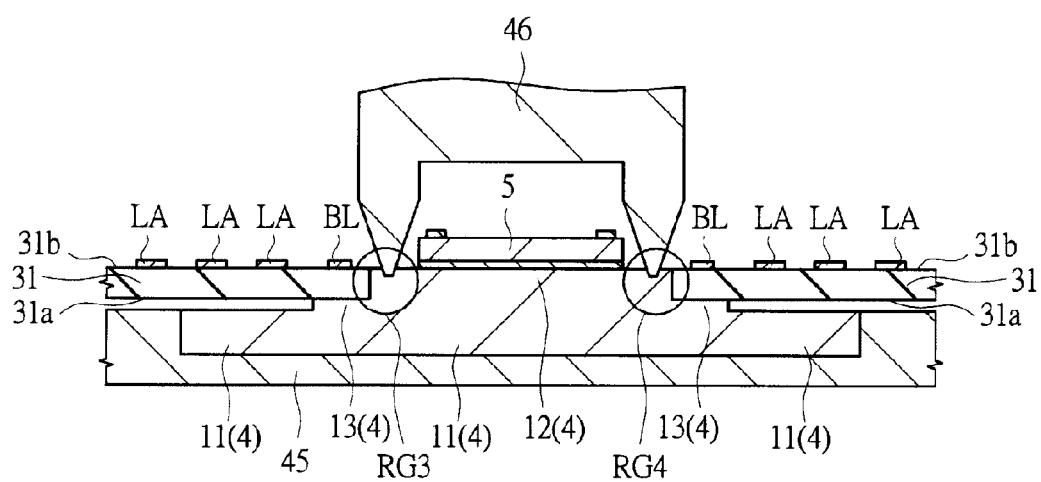
FIG. 51 illustrates the step of positioning heat-releasing plate 4 and the step of fixing (swaging) thereof in the steps S5 and S6, respectively.
Figure 52:
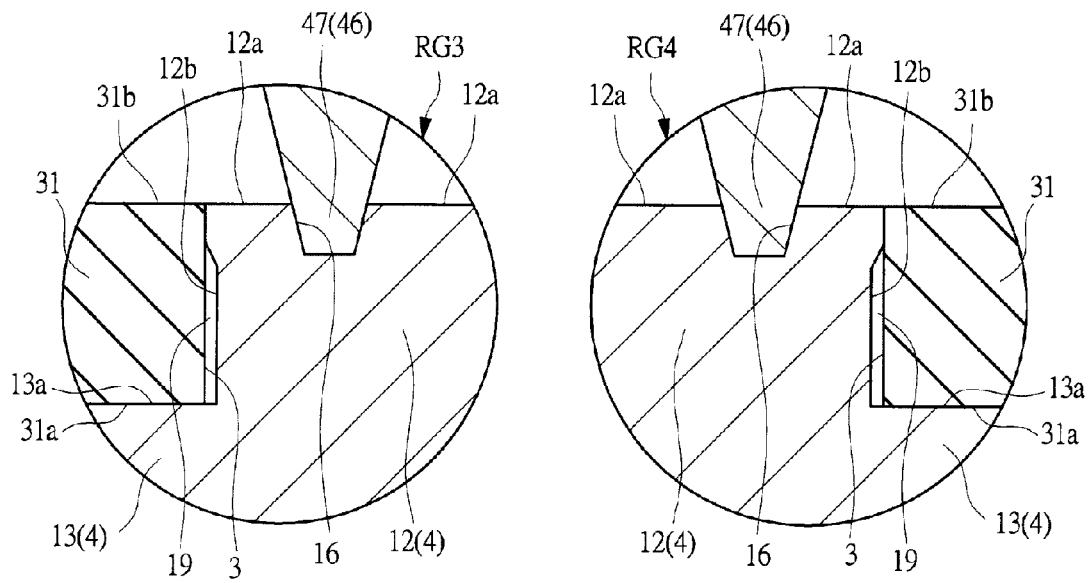
FIG. 52 illustrates the step of positioning heat-releasing plate 4 and the step of fixing (swaging) thereof in the steps S5 and S6, respectively.

In this state, the front end part 47 of the jig 46 has a taper shape thinning toward the tip, viewed in the cross section vertical to the extending direction of the groove 16, (cross sectional view of FIGS. 50 to 52). The tip of the front end part 47 of the jig 46 has a width equivalent to or slightly smaller than the width W1 of the groove 16 (the width in the direction vertical to the extending direction of the groove 16, and the opening width of the main surface 12a side of the convex part 12). The width W1 is shown in FIG. 49. Since, however, the front end part 47 of the jig 46 has a tapered shape, as illustrated in FIG. 51 and FIG. 52, when the tip of the front end part 47 of the jig 46 reaches the bottom of the groove 16, the front end part 47 of the jig 46 has a larger size than the width W1 of the groove 16 at the position of the main surface 12a of the convex part 12 of the heat-releasing plate 4.

Therefore, when the front end part 47 of the jig 46 hits the groove 16, (when the front end part 47 of the jig 46 is pressed against the groove 16), as illustrated in FIG. 52, the groove 16 is forcibly widened by the front end part 47 of the jig 46, (or the width W1 widens at upper part of the groove 16). When the groove 16 is widened forcibly, a portion of the convex part 12 is widened in the horizontal direction (in the direction parallel with the main surface 12a of the convex part 12) by an amount of the volume of widened groove, which allows a portion of the side surface 12b of the convex part 12 (upper part of the side surface 12b) of the heat-releasing plate 4 to directly contact and adhere to the inside wall face of the through-hole 3 of the wiring substrate 31. By the reaction force, there is generated a force to cause the inside wall of the through-hole 3 of the wiring substrate 31 to closely contact with and press a portion of the side surface 12b of the convex part 12, thus tightening the side surface 12b of the convex part 12 of the heat-releasing plate 4 by the inside wall of the through-hole of the wiring substrate 31, and allows swaging the heat-releasing plate 4 (the convex part 12 of the heat-releasing plate 4) to the wiring substrate 31 to fix the heat-releasing plate 4 to the wiring substrate 31.

Figure 53:
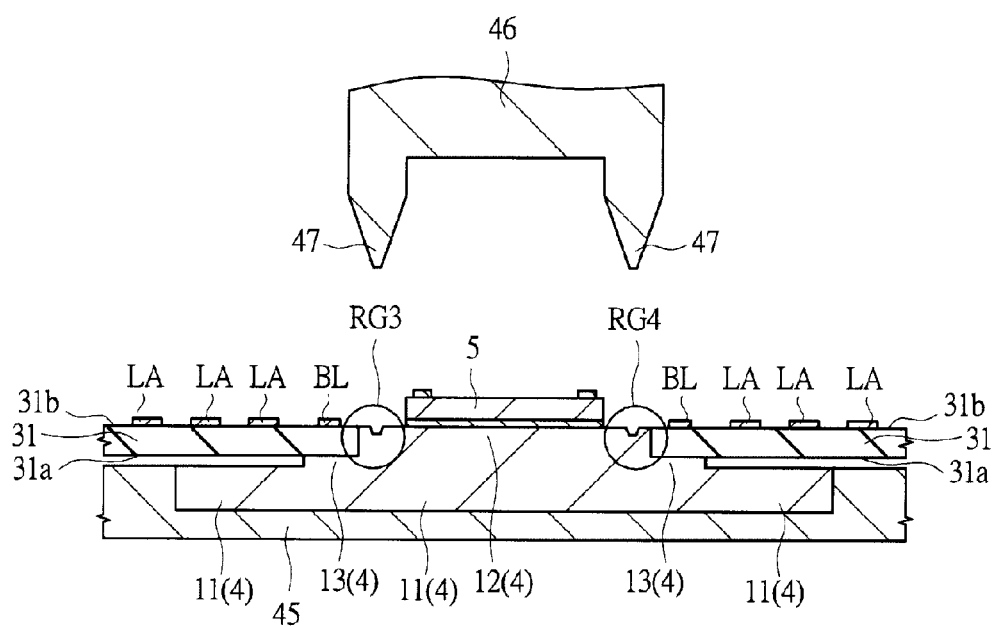
FIG. 53 illustrates the step of positioning heat-releasing plate 4 and the step of fixing (swaging) thereof in the steps S5 and S6, respectively.
Figure 54:
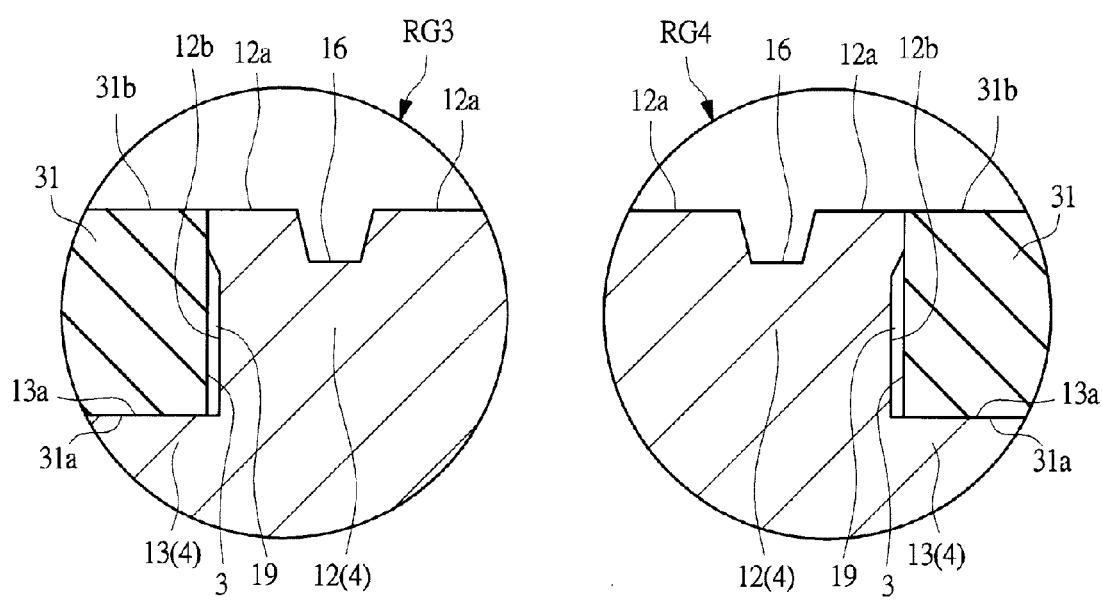
FIG. 54 illustrates the step of positioning heat-releasing plate 4 and the step of fixing (swaging) thereof in the steps S5 and S6, respectively.

By pressing the front end part 47 of the jig 46 against the groove 16, the grove 16 in the main surface 12a of the convex part 12 of the heat-releasing plate 4 is forcibly widened, and as illustrated in FIG. 53, the jig 46 is ascended to separate from the convex part 12 of the heat-releasing plate 4. As a result, although the front end part 47 of the jig 46 becomes apart from the groove 16, as illustrated in FIG. 54, a portion of the side surface 12b (upper part of the side surface 12b) of the convex part 12 of the heat-releasing plate 4 directly contacts with the inside wall face of the through-hole 13 of the wiring substrate 31, thus maintaining the adhered state. That is, the state in which the heat-releasing plate 4 (the convex part 12 of the heat-releasing plate 4) was swaged and fixed to the wiring substrate 31, is maintained.

The shape and the like of the jig 46 can be varied if only the groove 16 in the principal plane 12a of the convex part 12 of the heat-releasing plate 4 can be widened forcibly, and the heat-releasing plate 4 (the convex part 12 of the heat-releasing plate 4) can be swaged (fixed) to the wiring substrate 31.

Figure 55:
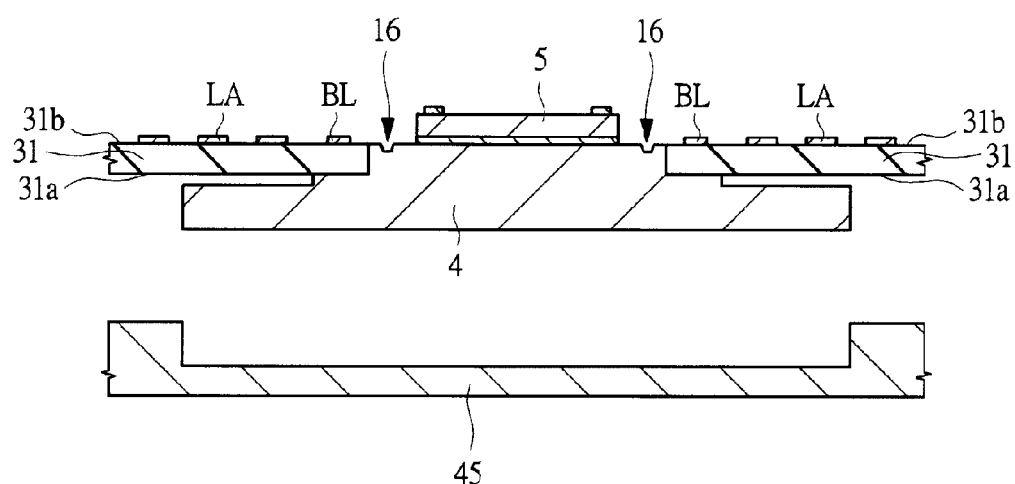
FIG. 55 illustrates the step of positioning heat-releasing plate 4 and the step of fixing (swaging) thereof in the steps S5 and S6, respectively.

After the step S6 of swaging the heat-releasing plate (the convex part 12 of the heat-releasing plate 4) to be fixed to the wiring substrate 31, as illustrated in FIG. 55, the heat-releasing plates 4 fixed (swaged) to the wiring substrate 3 are detached (removed) from the tray or the carrier 45. To do this, the tray or the carrier 45 may be formed for easily detaching (removing) the heat-releasing plate 4 therefrom. After that, the wiring substrate 31 to which the heat-releasing plates 4 are fixed (swaged) is sent to succeeding step (the step S7 of wire bonding in the embodiment 1).

According to the embodiment 1, the step S6 of swaging the heat-releasing plate 4 to be fixed to the wiring substrate 31 can prevent the separation of the heat-releasing plate 4 from the wiring substrate 31 before forming the sealing portions 7c and 8 in the next step.

The groove 16 formed in the main surface 12a of the convex part 12 of the heat-releasing plate 4 is for swaging the heat-releasing plate 4 (the convex part 12 of the heat-releasing plate 4) to be fixed to the wiring substrate 31 (the through-hole 3 of the wiring substrate 31) by forcibly widening the groove 16 by using the jig 46. To do this, as illustrated in FIGS. 8 to 10 and FIG. 14, the groove 16 is preferably formed at peripheral area of the main surface 12a of the convex part 12 of the heat-releasing plate 4. In addition, it is preferable that, in the main surface 12a of the convex part 12 of the heat-releasing plate 4, the groove 16 is formed along each of the two sides facing each other, and it is more preferable that, in the main surface 12a of the convex part 12 of the heat-releasing plate 4, the groove 16 is formed along each of the four sides. With the structure, in forcibly widening the groove 16 with the jig 46, a portion of the side surface 12b of the convex part 12 is brought into direct contact with the inside wall of the through-hole 3 of the wiring substrate 31, which allows surely swaging of the heat-releasing plate 4 to be fixed to the wiring substrate. In other words, the supporting surface 13a of the supporting part 13 of the heat-releasing plate 4 and the side surface 12b of the convex part 12 of the heat-releasing plate 4 can sandwich a portion of the wiring substrate 31 therebetween.

Different from the embodiment 1, if the groove 16 is formed only in a region in which the semiconductor chip 5 is mounted (a region overlapped in a planar view with the mounted semiconductor chip 5) in the main surface 12a of the convex part 12 of the heat-releasing plate 4, and if the groove 16 is not formed in a region other than the region in which the semiconductor chip 5 is mounted, the step S6 cannot forcibly widen the groove 16 in the main surface 12a of the convex part 12 by the jig 16 hindered by the semiconductor chip 5.

To the contrary, according to the embodiment 1, in the main surface 12a of the convex part 12 of the heat-releasing plate 4, the groove 16 for swaging is formed in a region other than the region in which the semiconductor chip 5 is mounted (the region overlapped in a planar view with the mounted semiconductor chip 5), and preferably the groove 16 is formed in the peripheral area of the region in which the semiconductor chip 5 is mounted. By the structure, the step S6 allows forcibly widening the groove 16 in the main surface 12a of the convex part 12 by the jig 46 without interference of the semiconductor chip 5 mounted over the convex part 12, thus allowing the heat-releasing plate 4 to be swaged and fixed to the wiring substrate 31. The region in which the semiconductor chip 5 is mounted corresponds to the region being covered with the semiconductor chip 5 in the main surface 12*a* of the convex part 12 after mounting the semiconductor chip 5. Accordingly, the step S3 of mounting the semiconductor chip 5 mounts the semiconductor chip 5 at a position more close to the center than the region in which the groove 16 is formed, in the main surface 12*a* of the convex part 12 of the heat-releasing plate 4.

The outer size of the convex part 12 of the heat-releasing plate 4 is preferably smaller than the inner size of the through-hole 3 of the wiring substrate 31 in order to prevent the problem of crack generation in the wiring substrate 31 in inserting the convex part 12 of the heat-releasing plate 4 into the through-hole 3 caused by the contact of a portion of the convex part 12 of the heat-releasing plate 4 with the wiring substrate 31. Sole insertion of the convex part 12 of the heat-releasing plate 4 into the through-hole 3 of the wiring substrate 31 cannot fix the heat-releasing plate 4 to the wiring substrate 31. According to the embodiment 1, however, since the step S6 forcibly widens the groove 16 in the main surface 12*a* of the convex part 12 of the heat-releasing plate 4, the portion near the front end part of the convex part 12 (a portion in the vicinity of the main surface 12*a* in the side surface 12*b*) extends in the horizontal direction (the direction parallel with the main surface 12*a* of the convex part 12) to locally enlarge the outer size, which makes a portion of the side surface 12*b* of the convex part 12 of the heat-releasing plate 4 directly contact to adhere to the inside wall face of the through-hole 3 of the wiring substrate 31. Therefore, this allows surely swaging of the heat-releasing plate 4 (the convex part 12 of the heat-releasing plate 4) to be fixed to the wiring substrate 31.

After the step S5 of placing (inserting) the convex part 12 of the heat-releasing plate 4 in the through-hole 3 of the wiring substrate 31, the gap part 15 is formed between the side surface 12*b* of the convex part 12 of the heat-releasing plate 4 and the inside wall of the through-hole 3 of the wiring substrate 31, and the gap part 18 is formed between the main surface 11*a* of the base material part 11 of the heat-releasing plate 4 (the region in which neither convex part 12 nor supporting part 13 is formed) and the upper surface 31*a* of the wiring substrate 31. The state is fixed in the step S6. Before the step S8 of molding, the gap part 15 and the gap 18 are empty, not filled with the resin material MR. The specific structure of the gap part 15 and the gap 18 is the same as the one described before except that the resin material MR is not filled in that stage (before injecting the resin material MR into the cavity of dies 51 and 52, described later).

<Step of Molding>

The step S8 of molding is described in more detail in the following.

According to the embodiment 1, the step S8 of molding forms the sealing portion 7*c* at the upper surface 31*a* side of the wiring substrate 31 and the sealing portion 8 at the lower surface 31*b* side thereof at a time. The specific procedure of the step S8 of molding is described below referring to FIGS. 56 to 67.

Figure 56:
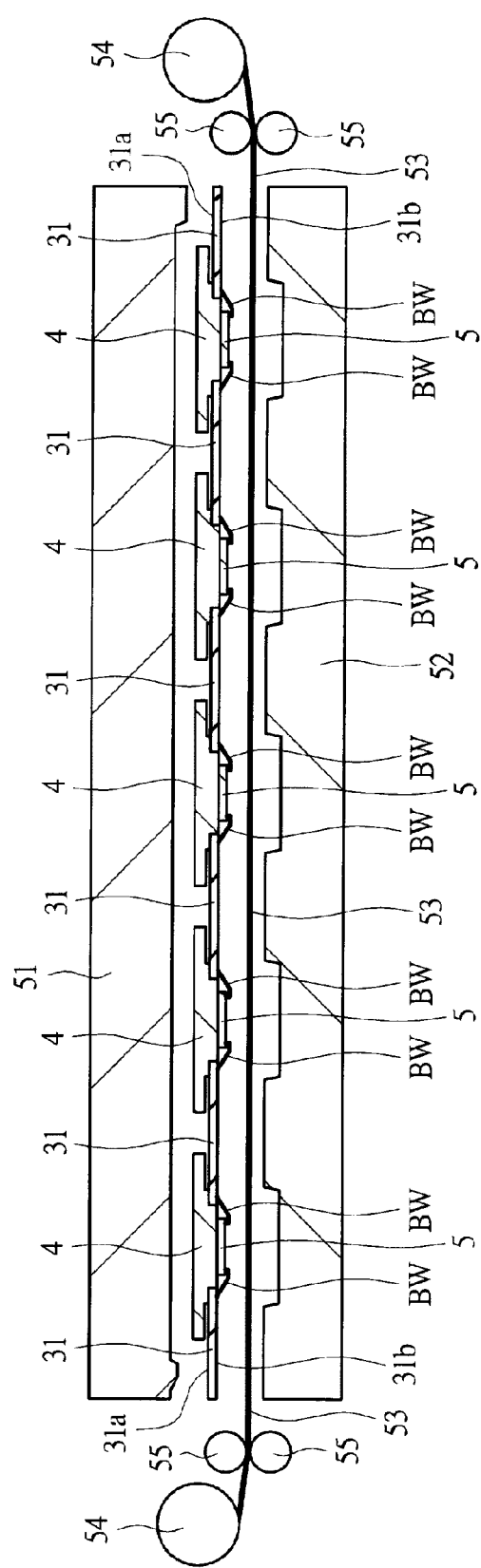
FIG. 56 illustrates the step of molding.
Figure 57:
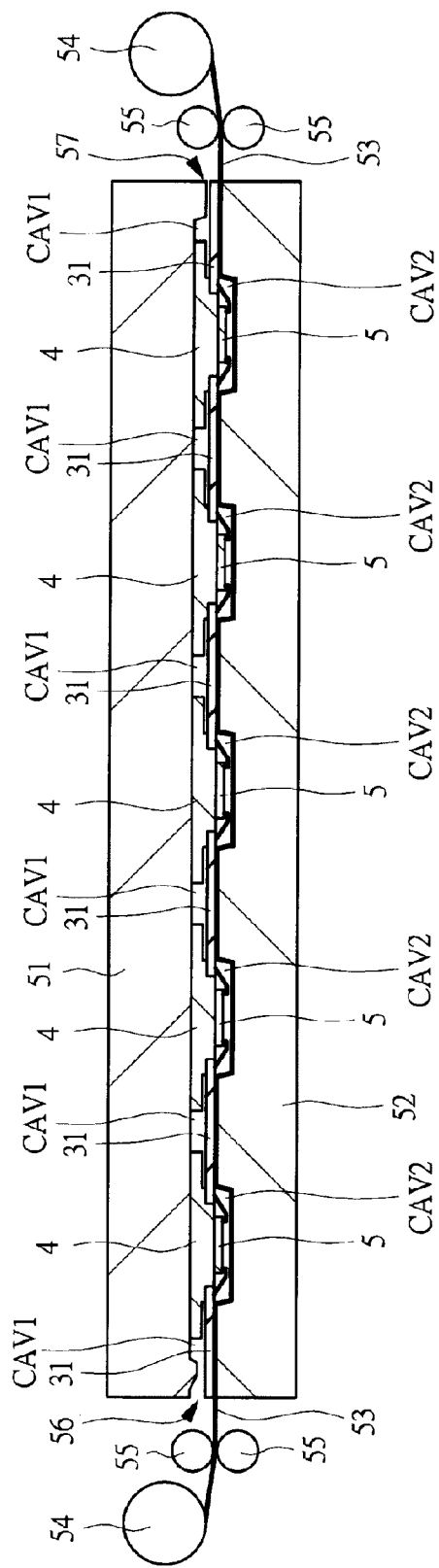
FIG. 57 illustrates the step of molding.
Figure 58:
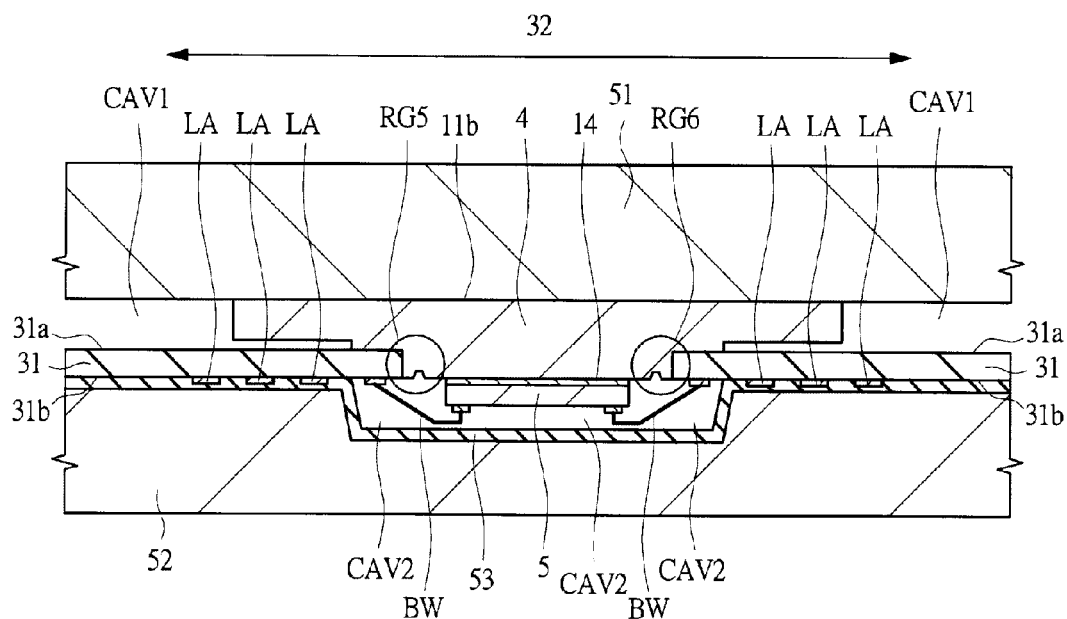
FIG. 58 illustrates the step of molding.
Figure 59:
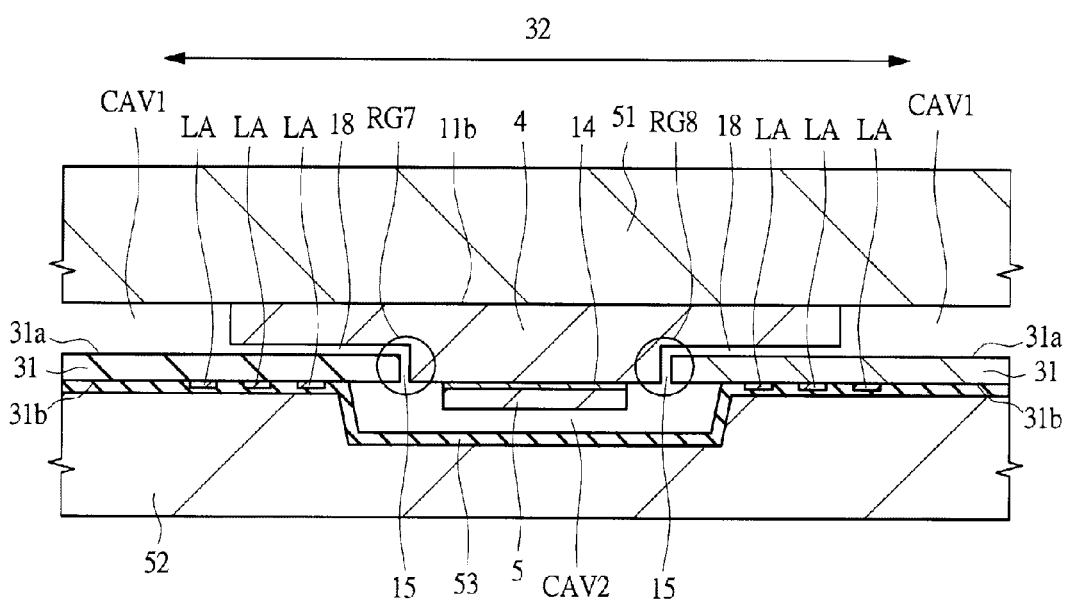
FIG. 59 illustrates the step of molding.
Figure 60:
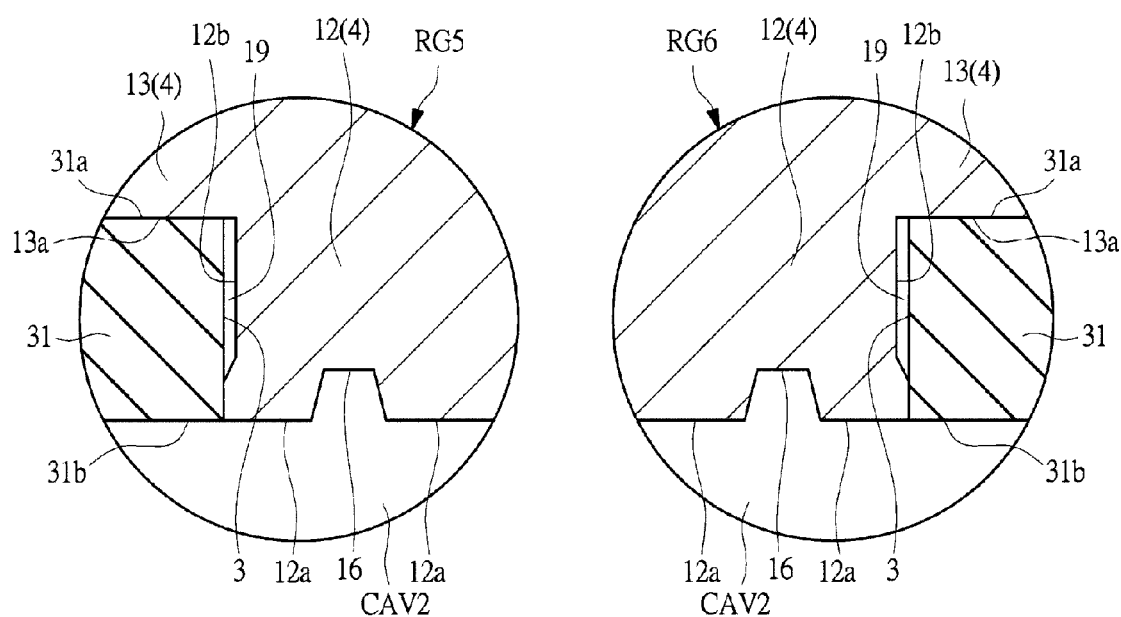
FIG. 60 illustrates the step of molding.

FIGS. 56 to 67 illustrate the step S8 of molding. FIG. 56 is a cross-sectional view (entire cross-sectional view) schematically illustrating the stage before the wiring substrate 31 is clamped by the dies 51 and 42. FIG. 57 is a cross-sectional view (entire cross-sectional view) schematically illustrating the stage after the wiring substrate 31 was clamped by the dies 51 and 52. FIGS. 58 to 61 are main-part cross-sectional views of the wiring substrate 31 in the state after the wiring substrate 31 was clamped by the dies 51 and 52. FIG. 58 and FIG. 59 show the cross section of a region almost corresponding to a single semiconductor device region 32. FIG. 58 shows the cross section, the same as that in FIG. 1, FIG. 39, and FIG. 42, (or the cross section at the position corresponding to the above A1-A1 line and the C1-C1 line in FIG. 40 and FIG. 41), and FIG. 59 shows the cross section, the same as that in FIG. 2, (or the cross section at the position corresponding to the above A2-A2 line and the C2-C2 line in FIG. 40 and FIG. 41). FIG. 60 corresponds to the part-enlarged view of regions RG5 and RG6, encircled by a circle in FIG. 58, and FIG. 61 corresponds to the part-enlarged view of regions RG7 and RG8 encircled by a circle in FIG. 59. The region RG6 corresponds to the regions RG1 and RG3, the region RG5 corresponds to the region RG4, and the region RG8 corresponds to the region RG2.

In the step S8 of molding, the wiring substrate 31 in which the steps S1 to S7 are completed and the heat-releasing plate 4 is in a state of being fixed (swaged), is positioned between the die 51 as the upper die and the die 52 as the lower die, as illustrated in FIG. 56. As illustrated in FIGS. 57 to 59, the wiring substrate 31 is clamped (fixed) from above and beneath thereof by using the dies 51 and 52. In this state, the wiring substrate 31 is sandwiched between the dies 51 and 52 so that the upper surface 31*a* of the wiring substrate 31 faces upward to face the die (upper die) 51, and so that the lower surface 31*b* of the wiring substrate 31 faces downward to face the die (lower die) 52.

As seen in FIGS. 56 to 59, in clamping the wiring substrate 31 between the dies 51 and 52, it is preferable that a sheet 53 (film, laminate) is set to be in a state of being attached to the upper surface of the die (lower die) 52, (the main surface at the side facing the die 51 and the wiring substrate 31) by, for example, suction or other means, to thereby position the sheet 53 between the die (lower die) 52 and lower surface 31*b* of the wiring substrate 31 for avoiding direct contact of the die 52 with the lower surface 31*b*. The sheet 53 has elasticity larger than that of the die (lower die) 52, and also has heat resistance to endure the temperature of molding step. For example, the sheet 53 can be formed by a resin sheet such as polyimide resin sheet. The use of the sheet 53 prevents the contact of the bump lands LA in each semiconductor device region 32 on the lower surface 31*b* of the wiring substrate 31 with the die 52, though the bump lands LA contact with the sheet 53. Accordingly, the bump lands LA over the lower surface 31*b* of the wiring substrate 31 can be prevented from being damaged by the die 52 having high rigidity. The sheet 53 can be rolled and unrolled by rollers 54 and 55.

When the wiring substrate 31 is clamped between the dies 51 and 52, as illustrated in FIGS. 57 to 62, the cavity CAV1 is formed between the upper surface 31*a* of the wiring substrate 31 and the die (upper die) 51, while the cavity CAV2 is formed between the lower surface 31*b* of the wiring substrate 31 and the die (lower die) 52. The cavity CAV1 is a cavity (a hollow space) for forming the sealing portion 7*c*, and the cavity CAV2 is a cavity (a hollow space) for forming the sealing portion 8. Since the sealing portion 7*c* is divided at each semiconductor device region 32 in succeeding step to become the sealing portion 7, the cavity CAV1 can be considered as the one for forming the sealing portion 7.

The cavity CAV2 is formed between the lower surface 31*b* of the wiring substrate 31 and the die (lower die) 52. When, however, the sheet 53 is applied, the cavity CAV2 is formed between the sheet 53 located along the upper surface of the die (lower die) 52 and the lower surface 31*b* of the wiring substrate 31.

The cavity CAV2 which is formed between the lower surface 31b of the wiring substrate 31 and the die (lower die) 52 is provided one by one for each of the semiconductor device regions 32 in the lower surface 31b of the wiring substrate 31. That is, one cavity CAV2 is formed for one semiconductor device region 32.

Meanwhile, the cavity CAV1 formed between the upper surface 31a of the wiring substrate 31 and the die (upper die) 51 is positioned so as to include the entire semiconductor device regions 32 over the upper surface 31a of the wiring substrate 31. That is, one cavity CAV1 is formed for the pluralities of semiconductor device regions 32. However, the rear surface 11b of the base material part 11 of the heat-releasing plate 4 contacts with the lower surface of the die (upper die) 51.

Figure 62:
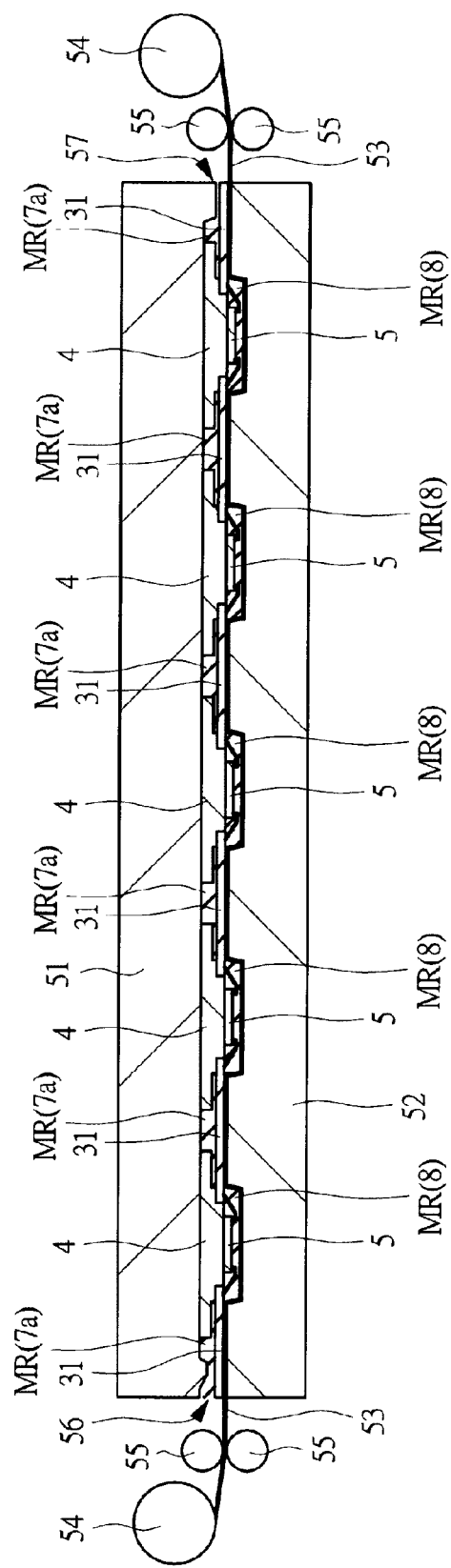
FIG. 62 illustrates the step of molding.

After clamping the wiring substrate 31 between the dies 51 and 52, the resin material MR for forming the sealing portions 7c and 8 is injected (supplied) to the cavity CAV1 which is formed between the upper surface 31a of the wiring substrate 31 and the die (upper die) 51 from a resin gate (resin gate opening, resin injection opening), as illustrated in FIG. 62. The resin gate 56 is positioned at a side of the cavity CAV1, and the dies 51 and 52 are the molding dies of side gate type.

Figure 63:
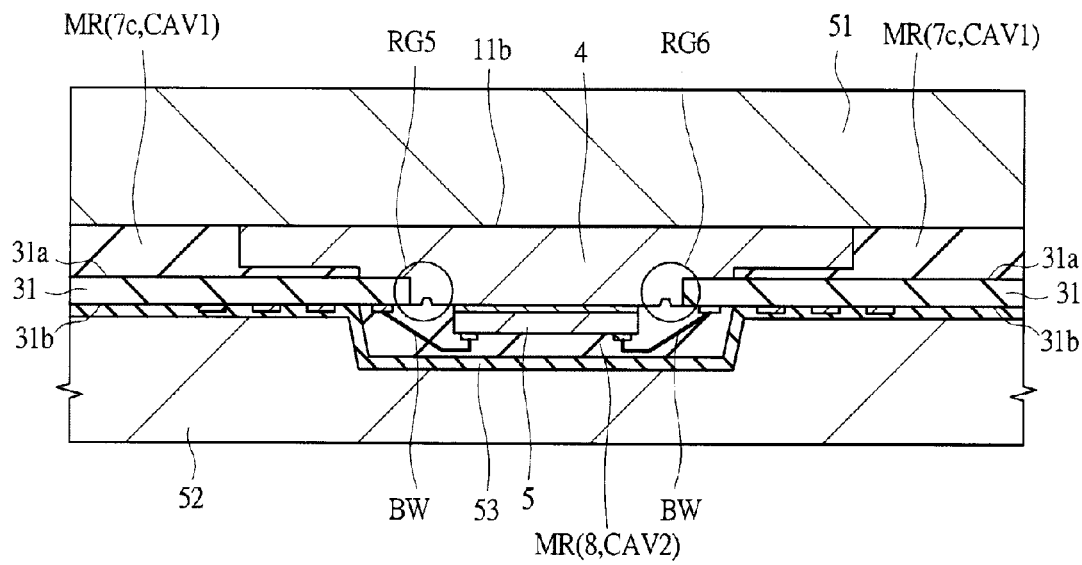
FIG. 63 illustrates the step of molding.
Figure 64:
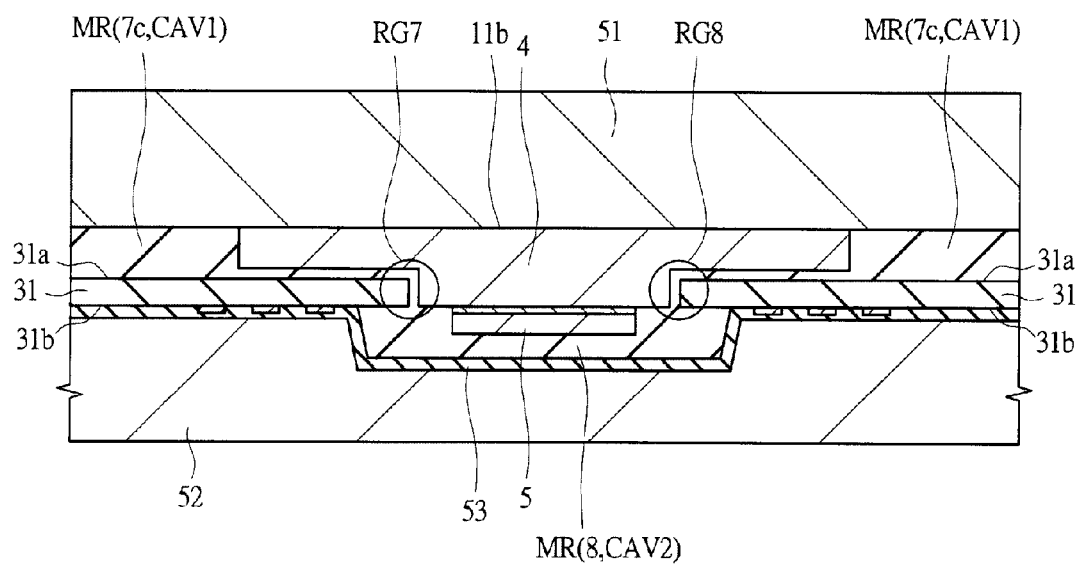
FIG. 64 illustrates the step of molding.
Figure 65:
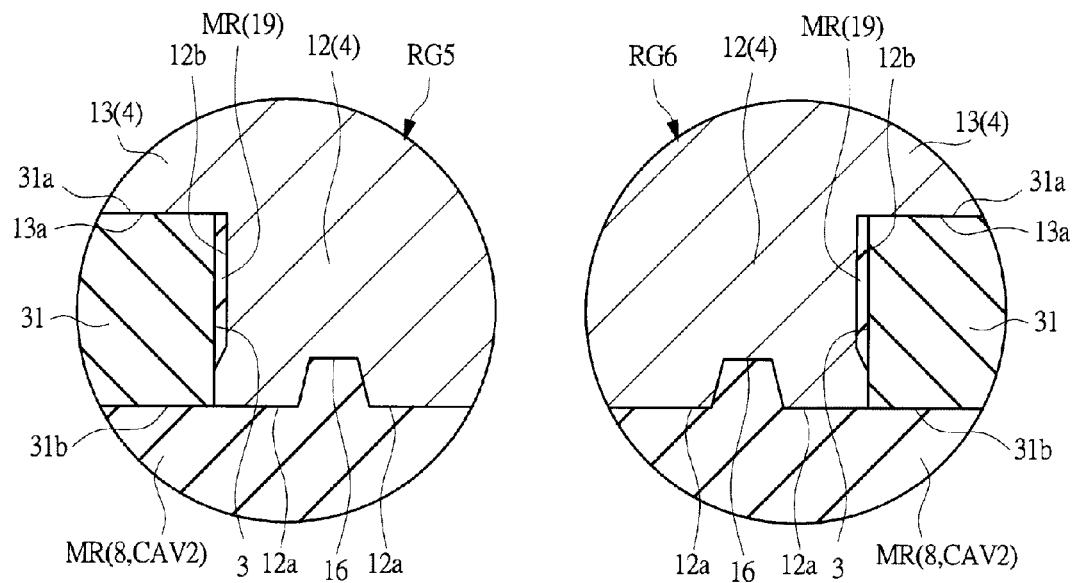
FIG. 65 illustrates the step of molding.
Figure 66:
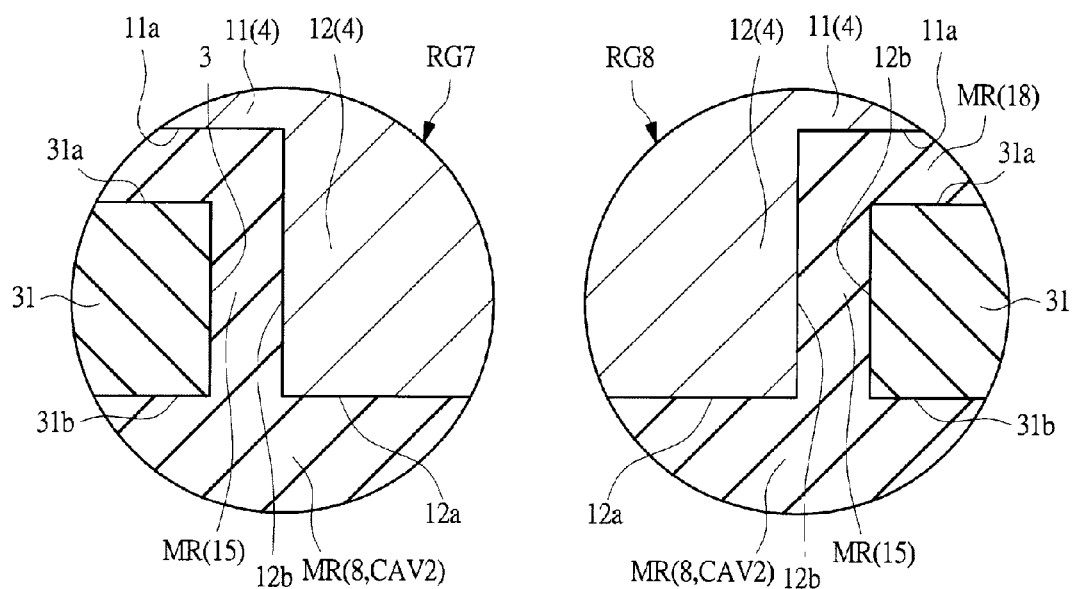
FIG. 66 illustrates the step of molding.

FIG. 62 is a cross-sectional view (entire cross sectional view) schematically illustrating the state (stage) after injecting the resin material MR into the cavity of the dies 51 and 52. FIGS. 63 to 66 are the main-part cross-sectional views illustrating the state (stage) after injecting the resin material MR into the cavity of the dies 51 and 52. FIG. 63 shows the cross section, the same as that in FIG. 58, (or the cross section at the position corresponding to the above A1-A1 line and the C1-C1 line in FIG. 40 and FIG. 41), and FIG. 64 shows the cross section, the same as that in FIG. 59, (or the cross section at the position corresponding to the above A2-A2 line and the C2-C2 line in FIG. 40 and FIG. 41). Since FIG. 65 shows the same cross section as that of FIG. 60, and FIG. 66 shows the same cross section as that of FIG. 61, FIG. 65 corresponds to the part-enlarged view of the regions RG5 and RG6, encircled by a circle in FIG. 63, and FIG. 66 corresponds to the part-enlarged view of the regions RG7 and RG8 encircled by a circle in FIG. 64.

Figure 61:
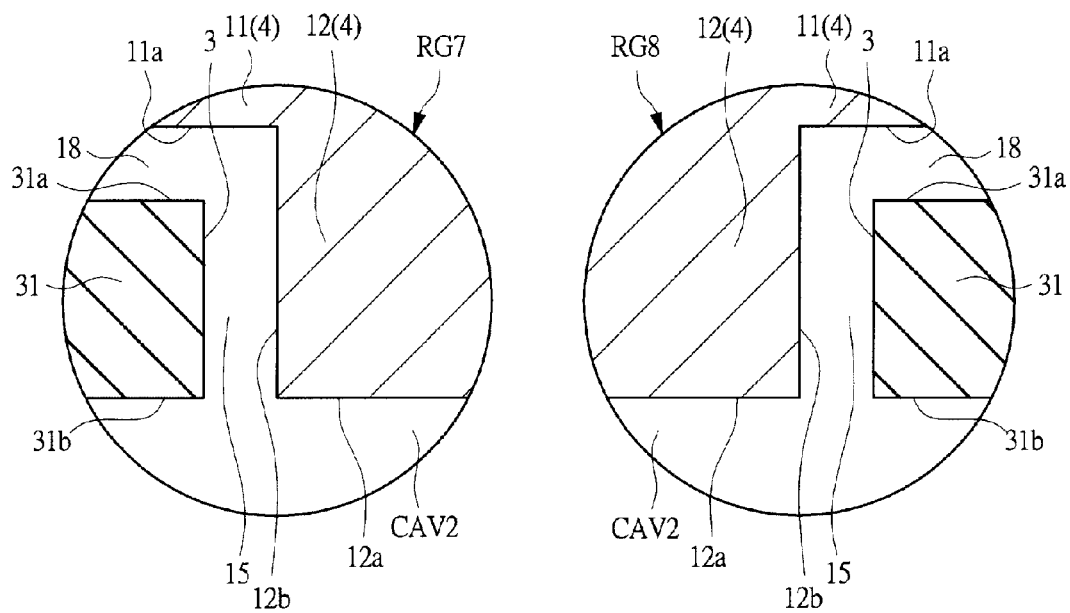
FIG. 61 illustrates the step of molding.

As illustrated in FIG. 59 and FIG. 61, there is at least one gap part 15 (preferably several gap parts at several positions) between the inside wall of each through-hole 3 of the wiring substrate 31 and the side surface 12b of the convex part 12 of the heat-releasing plate 4 being inserted into the through-hole 3, which gap part 15 separates the inside wall of the through-hole 3 from the side surface 12b of the convex part 12, and extends (connects, penetrates) from the upper surface 31a to the lower surface 31b of the wiring substrate 31. As for the heat-releasing plate 4, since the supporting surface 13a of the supporting part 13 contacts with the upper surface 31a of the wiring substrate 31, the gap 18 is formed between the main surface 11a (a region in which neither convex part nor supporting part 13 is formed) of the supporting part 11 of the heat-releasing plate 4 and the upper surface 31a of the wiring substrate 31. The gap part 15 and the gap 18 are formed in the step S5 at the stage of inserting the convex part 12 of the heat-releasing plate 4 into each through-hole 3 of the wiring substrate 31. The state is fixed in the step S6. After that, the gap part 15 and the gap 18 are maintained as cavity until before, in the step S8 of molding, the resin material MR is injected from the resin gate 56.

Consequently, when the wiring substrate 31 is clamped between the dies 51 and 52, the cavity CAV1 formed between the upper surface 31a of the wiring substrate 31 and the die 51 and the cavity CAV2 formed between the lower surface 31b of the wiring substrate 31 and the die 52 become connected each other via the gap 18 between the main surface 11a of the base material part 11 of the heat-releasing plate 4 and the upper surface 31a of the wiring substrate 31, and via the gap part 15 between the side surface 12b of the convex part 12 of the heat-releasing plate 4 and the inside wall of the through-hole 3.

Since the cavity CAV1 and the cavity CAV2 are connected each other by the gap 18 and the gap part 15, the resin material MR injected into the cavity CAV1 from the region gate 56 spreads over the entire cavity CAV1 to fill the entire cavity CAV1, and the injected resin material MR further enters (flows in) the cavity CAV2 formed between the lower surface 31b of the wiring substrate 31 and the die (lower die) 52 through the gap 18 and the gap part 15. That is, the gap 18 and the gap part 15 function as the flow passage of the resin material MR. By injecting the resin material MR from the resin gate 56 into the cavity CAV1, the resin material MR can fill not only the cavity CAV1 but also the cavity CAV2. In addition, the cavity CAV1 becomes a state in which the resin material MR fills also the gap 18 between the main surface 11a of the base material part 11 of the heat-releasing plate 4 and the upper surface 31a of the wiring substrate 31, (the state of being filled with the resin material MR). Also the gap part 15 becomes the state of being filled with the resin material MR (the state being full of resin material MR).

The air in the cavity CAV1 and the cavity CAV2 is removed (vented) from an air vent 57 (air-vent opening, gas-vent, gas-discharge opening) during the filling of the cavity CAV1 and the cavity CAV2 with the resin material MR. The resin gate 56 and the air vent 57 are formed at the side of die 51 as the upper die, or between the upper surface 31a of the wiring substrate 31 and the die (upper die) 51.

The applied resin material MR is made of, for example, a thermosetting resin, and can contain a filler and the like. For example, the resin material MR can be prepared by using an epoxy resin containing a filler and the like. The flowability of the resin material MR injected into the cavity CAV1 may be adjusted so as to allow injecting thereof also into the cavity CAV2 through the gap 18 and the gap part 15.

When the resin material MR contains filler, the gap 18 and the gap part 15 preferably have a size so as to allow the filler in the resin material MR to pass therethrough. With that size, feeding the resin material MR containing the filler to the cavity CAV1 allows introducing the resin material MR containing the filler to the cavity CAV2 via the gap 18 and the gap part 15. By the procedure, the composition (or the content of the filler) of the resin material MR in the cavity CAV1 becomes almost equal to the composition (or the content of the filler) of the resin material MR in the cavity CAV2, and thus the composition (or the content of the filler) becomes almost equal to that of the sealing portion 7c (7) and the sealing portion 8.

After filling the cavity CAV1 and the cavity CAV2 with the resin material MR, the resin material MR in the cavity CAV1 and the cavity CAV2 is hardened by heating or the like. The resin material MR in the cavity CAV1 is hardened to become the sealing portion 7c, while the resin material MR in the cavity CAV2 is hardened to become the sealing portion 8, and thus the gap part 15 becomes also filled with the hardened resin material MR. Also the gap 18 is filled with the hardened resin material MR, and the resin material MR filling the gap 18 also constitutes a portion of the sealing portion 7c. After that, the dies 51 and 52 are released to take out the wiring substrate 31 on which the sealing portions 7c and 8 are formed.

The sealing portion 7c is formed so as to cover the entire semiconductor device regions 32 of the upper surface 31a of the wiring substrate 31. However, the rear surface 11b of the base material part 11 of each heat-releasing plate 4 is exposed from the upper surface of the sealing portion 7c. If resin burrs are formed in the rear surface 11b of the base material part 11 of each heat-releasing plate 4, a deburring step may be conducted after the step S8 of molding.

On the other hand, in each semiconductor device region 32 of the lower surface 31b of the wiring substrate 31, no sealing portion 8 is formed over the region in which the bump lands LA are arranged, and the sealing portion 8 is formed at a position closer to the center than the region in which the bump lands LA are arranged. As a result, in each semiconductor device region 32 of the lower surface 31b of the wiring substrate 31, the sealing portion 8 is formed so as to cover the semiconductor chip 5, the main surface 12a of the convex part 12 of the heat-releasing plate 4, the bonding wire BW, and the bonding lead BL, and so as not to cover the bump land LA.

<Main Characteristics>

According to the embodiment 1, the use of the heat-releasing plate 4 improves the heat-release properties of the semiconductor device. In manufacturing the semiconductor device, if the heat-releasing plate 4 is not fixed to the wiring substrate 31, the heat-releasing plate 4 may be separated from the wiring substrate 31 in the step of wire-bonding, the step of molding, or during transfer between steps. Therefore, in manufacturing the semiconductor device, the heat-releasing plate 4 is required to be fixed to the wiring substrate 31.

The embodiment 1 does not make use of an adhesive to fix the heat-releasing plate 4 to the wiring substrate 31, and applies swaging to fix the heat-releasing plate 4 to the wiring substrate 31. That is, in the step S6, the groove 16 in the main surface 12a of the convex part 12 of the heat-releasing plate 4 is forcibly widened to bring a portion of the side surface 12a of the convex part 12 into direct contact with the inside wall of the through-hole 3 of the wiring substrate 31, thus to swage the heat-releasing plate 4 to be fixed to the wiring substrate 31.

Different from the embodiment 1, if an adhesive is used for fixing the heat-releasing plate 4 to the wiring substrate 3, varied size (inner size) of the through-hole 3 of the wiring substrate 31 and varied size (outer size) of the convex part 12 of the heat-releasing plate 4 result in insufficient volume or excessive volume of an adhesive, which may fail in attaining fixation of the heat-releasing plate 4. In addition, the adhesive for fixing the heat-releasing plate 4 overflows at peripheral area of the through-hole 3 onto the lower surface 31b of the wiring substrate 31 to be attached to the bonding lead BL, which may cause poor wire bonding. When the fixation is carried out by an adhesive, on inserting the convex part 12 of the heat-releasing plate 4 into the through-hole 3 of the wiring substrate 31, the holding force of the heat-releasing plate 4 may be lowered because a gap is formed between the side surface 12b of the convex part 12 and the inside wall of the through-hole 3 for securing the easiness of insertion of the heat-releasing plate 4. These non-preferable conditions deteriorate the reliability of semiconductor device.

In contrast, since the embodiment 1 swages (fixes) the heat-releasing plate 4 to the wiring substrate 31 by forcibly widening the groove 16 in the convex part 12, the heat-releasing plate 4 is easily fixed even if the size (inner size) of the through-hole 3 of the wiring substrate 31 and the size (outer size) of the convex part 12 of the heat-releasing plate 4 are slightly varied. Furthermore, since no adhesive for fixing the heat-releasing plate 4 is used, the adhesive does not adhere to the bonding lead BL, which can prevent the occurrence of poor wire bonding. In addition, the dimensional accuracy (clearance) of the through-hole 3 of the wiring substrate 31 and of the convex part 12 of the heat-releasing plate 4 can be set to be a lower level than the case of using the adhesive for fixing the heat-releasing plate 4, which can decrease the manufacturing cost of the semiconductor device.

Since the embodiment 1 swages (fixes) the heat-releasing plate 4 to be fixed to the wiring substrate 31 by forcibly widening the groove 16 in the convex part 12 of the heat-releasing plate 4, as illustrated in FIG. 54 and FIG. 60, a region close to the main surface 11a, in the side surface 12b of the convex part 12, contacts with the inside wall of the through-hole 3 of the wiring substrate 31. However, in a region close to the main material part 11, there is a slight gap 19 from the inside wall of the through-hole 3 of the wiring substrate 31. That is, the side surface 12b of the convex part 12 except for the gap part 15 has a region (a region close to the main surface 12a) contacting with the inside wall of the through-hole 3 of the wiring substrate 31 and a region not contacting therewith. As a result, in the step S8 of molding, the resin material MR also fills the gap 19 between the side surface 12b of the convex part 12 of the heat-releasing plate 4 and the inside wall of the through-hole 3, as illustrated in FIG. 65. That is, the resin material MR also fills between the portion not directly contacting with the inside wall of the through-hole 3 and the inside wall of the through-hole 3, in the side surface 12b of the convex part 12 of the heat-releasing plate 4. The filling of the resin material MR in the gap 19 is attained by introducing the resin material MR from the gap 18 and the gap part 18 into the gap 19. Accordingly, when the step S8 of molding is conducted to form the sealing portions 7c and 8, a portion (a region close to the main surface 12a) of the side surface 12b of the convex part 12 of the heat-releasing plate 4, except for the gap part 15, contacts with the inside wall of the through-hole 3 of the wiring substrate 31, while other portions are in a state in which the hardened resin material MR exists between the portion and the inside wall of the through-hole 3 of the wiring substrate 31. The state is maintained also in the manufactured semiconductor device 1. The gap 19 can be smaller than the size of the gap 18 and the gap part 15, and the filler in the resin material MR cannot pass therethrough.

As described above, the embodiment 1 forcibly widens the groove 16 in the convex part 12 of the heat-releasing plate 4 to swage (fix) the heat-releasing plate 4 to the wiring substrate 31. Accordingly, the entire surface of the side surface 12b of the convex part 12 of the heat-releasing plate 4 does not contact with the inside wall of the through-hole 3, and the resin material MR enters (fills) the gap 19 to improve the adhesion of the heat-releasing plate 4 with the wiring substrate 2 (31). Consequently, the manufactured semiconductor device 1 can improve the close contact (adhesion) between the heat-releasing plate 4 and the wiring substrate 2, which allows the heat-releasing plate 4 to be firmly fixed to the wiring substrate 2 and the sealing portions 7 and 8. Therefore, the reliability of the semiconductor device 1 can be improved.

The step S7 of wire bonding is conducted in a state in which the lower surface 31b of the wiring substrate 31 faces upward. The step S8 of molding is conducted in a state in which the upper surface 31a of the wiring substrate 31 faces upward. Therefore, the wiring substrate 31 is upside down between the step S7 and the step S8. Since the embodiment 1 swages (fixes) the heat-releasing plate 4 to the wiring substrate 31 by forcibly widening the groove 16 in the convex part 12 of the heat-releasing plate 4, the heat-releasing plate 4 can be prevented from separating from the wiring substrate 31 even when the step S8 of molding is conducted in a state in which the upper surface 31a of the wiring substrate 31 faces upward by inverting the surface of the wiring substrate 31 up and down between the step S7 and the step S8. As a result, the manufacturing process of the semiconductor device can be surely executed.

Furthermore, the embodiment 1 positions the semiconductor chip 5 at the side of lower surface 2b of the wiring substrate 2 as the main surface for forming the external coupling terminal (solder ball 9 in the embodiment 1). Accordingly, there is a need of forming the sealing portion 8 at the side of lower surface 2b (31b) of the wiring substrate 2 (31). However, the sealing portion 8 shall not be formed above the bump land LA as the terminal for forming the external terminal. To do this, it is necessary to form the sealing portion 8 at the side of lower surface 2b (31b) of the wiring substrate 2 (31) relative to each of the semiconductor device regions 32.

According to the embodiment 1, consequently, in the step S8 of molding, the resin material MR supplied to the upper surface 31a side (or the cavity CAV1) of the wiring substrate 31 is also supplied to the lower surface 31b side (or the cavity CAV2) of the wiring substrate 31 via the gap part 15 (and the gap 18), to thereby form the sealing portion 7c at the upper surface 31a side of the wiring substrate 31 and the sealing portion 8 at the lower surface 31b side of the wiring substrate 31. The structure allows easy and adequate formation of the sealing portion 8 at the lower surface 31b side of the wiring substrate 31 without covering the bump land LA. In addition, since both the sealing portion 7c at the upper surface 31a side of the wiring substrate 31 and the sealing portion 8 at the lower surface 31b side of the wiring substrate 31 can be formed at a time, the number of steps for manufacturing the semiconductor device can be suppressed.

Since the sealing portion 7 at the upper surface 2a side of the wiring substrate 2 and the sealing portion 8 at the lower surface 2b side of the wiring substrate 2 are connected together via the resin material MR which fills the gap part 15, the separation of the sealing portions 7 and 8 (separation from the wiring substrate 2) in the semiconductor device 1 can be suppressed or prevented, and thus the reliability of the semiconductor device is further improved.

In supplying the resin material MR fed to the upper surface 31a side (the cavity CAV1 of the upper surface 31a) of the wiring substrate 31 to the lower surface 31b side (the cavity CAV2 of the lower surface 31b) of the wirings substrate 31 via the gap part 15 (and the gap 18), the resin material MR easily fills also the gap 19 between the side surface 12b of the convex part 12 of the heat-releasing plate 4 and the inside wall of the through-hole 3. As a result, the adhesion of the heat-releasing plate 4 with the wiring substrate 2 (31) can be increased. Therefore, the reliability of the semiconductor device 1 can be improved.

Figure 67:
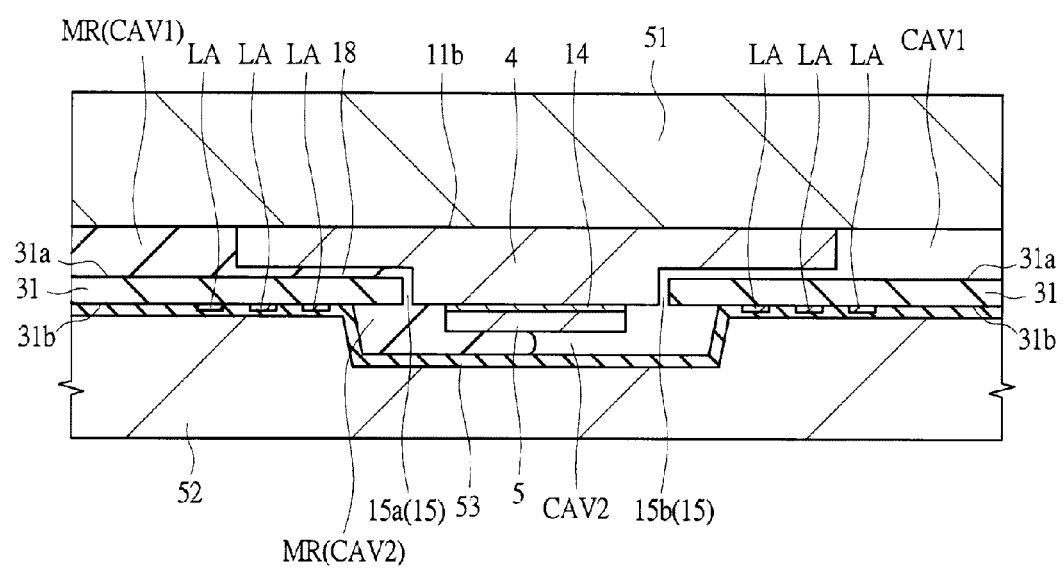
FIG. 67 illustrates the step of molding.

The gap part 15 is formed at least one to each semiconductor device region 32 (or to a single heat-releasing plate 4). The number of the gap parts 15 is, however, preferably more than one. FIG. 67 is a cross-sectional view illustrating the stage of filling the cavity CAV2 with the resin material MR.

The resin material MR injected into the cavity CAV1 from the resin gate 56 passes through the gap 18 and the gap part 15 to enter the cavity CAV2. At this moment, if the number of the gap parts 15 is more than one in each semiconductor device region 32 (the cavity CAV2 of the semiconductor device region 32), the resin material MR is introduced into the cavity CAV2 from a gap part 15a which is closer than others to the resin gate 56, and the air in the cavity CAV2 is discharged to the cavity CAV1 from other gap part 15b (a gap part close to the air vent 57), and further is vented outside the dies 51 and 52 via the air vent 57.

Accordingly, if more than one gap part 15 are located in each semiconductor device region 32 (or to a single heat-releasing plate 4), these gap parts 15 secure at least one for each functioning as the resin-injection opening (resin gate) to the cavity CAV2 and functioning as the gas-vent opening (air vent) from the cavity CAV2. As a result, the resin material MR injected into the cavity CAV1 can surely be supplied to the cavity CAV2 via the gap part 15, and the sealing portion 8 can surely be formed.

The gap parts 15 located in each semiconductor device region 32 (or to a single heat-releasing plate 4) preferably have almost the same size as each other because the resin material MR which is supplied from the gap part 15 (gap part 15a in this embodiment) to the cavity CAV2 returns to the cavity CAV1 from other gap part 15 (the gap part 15b in this embodiment) to be used for forming the sealing portion 7c and another sealing portion 8. The function allows easy formation of the sealing portions 7c and 8. In injecting the resin material MR into the cavity CAV2, the size of the gap part 15 (the gap part 15a in the embodiment 1) functioning as the resin injection opening (the resin gate) and the size of the gap part 15 (the gap part 15b in the embodiment 1) functioning as the gas-vent opening (the air vent in the embodiment 1) are almost equal with each other, and the sealing portion 8 is formed by the through-molding. On the other hand, the resin gate 56 allows the resin material MR to pass therethrough. Since, however, the air vent 57 is for venting, the air vent 57 (the gap of the air vent 57) is smaller than that of the resin gate 56, the gap part 15, and the gap part 18 to allow only very few amount of the resin material MR to pass therethrough.

It is preferable that the planar shape of the through-hole 3 of the wiring substrate 31 (2) and the planar shape of the convex part 12 of the heat-releasing plate 4 are formed in a rectangle, and that the gap part 15 is formed at each of four corners of the rectangle (at the positions of four corners 17). The structure allows supplying the resin material MR injected into the cavity CAV1 to the cavity CAV2 through the gap part 15 in a well-balanced state, and thus the sealing portion 8 can be more accurately formed.

Embodiment 2

According to the manufacturing process described in the embodiment 1, the semiconductor chip 5 is mounted over the convex part 12 of the heat-releasing plate 4, and then the heat-releasing plate 4 with the mounted semiconductor chip 5 is placed in the through-hole 3 of the wiring substrate 31. According to the embodiment 2, however, the heat-releasing plate 4 is placed in the through-hole 3 of the wiring substrate 31 before mounting the semiconductor chip 5 over the convex part 12 of the heat-releasing plate 4, and then the semiconductor chip 5 is mounted over the convex part 12 of the heat-releasing plate 4, positioned in the through-hole 3. The case will be described below referring to FIGS. 68 to 74.

Figure 68:
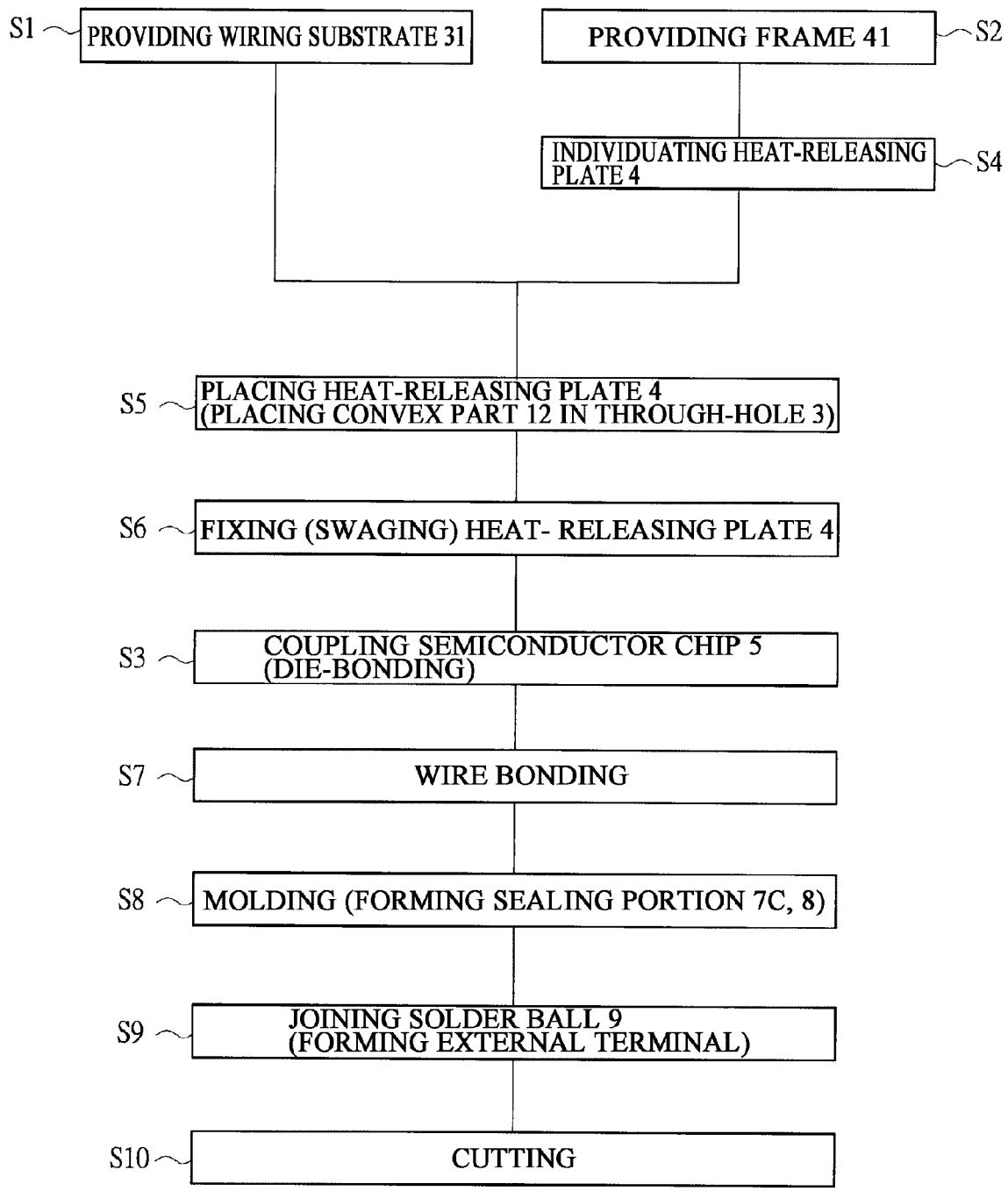
FIG. 68 illustrates a flow diagram of manufacturing process of semiconductor device in other embodiments of the present invention.
Figure 73:
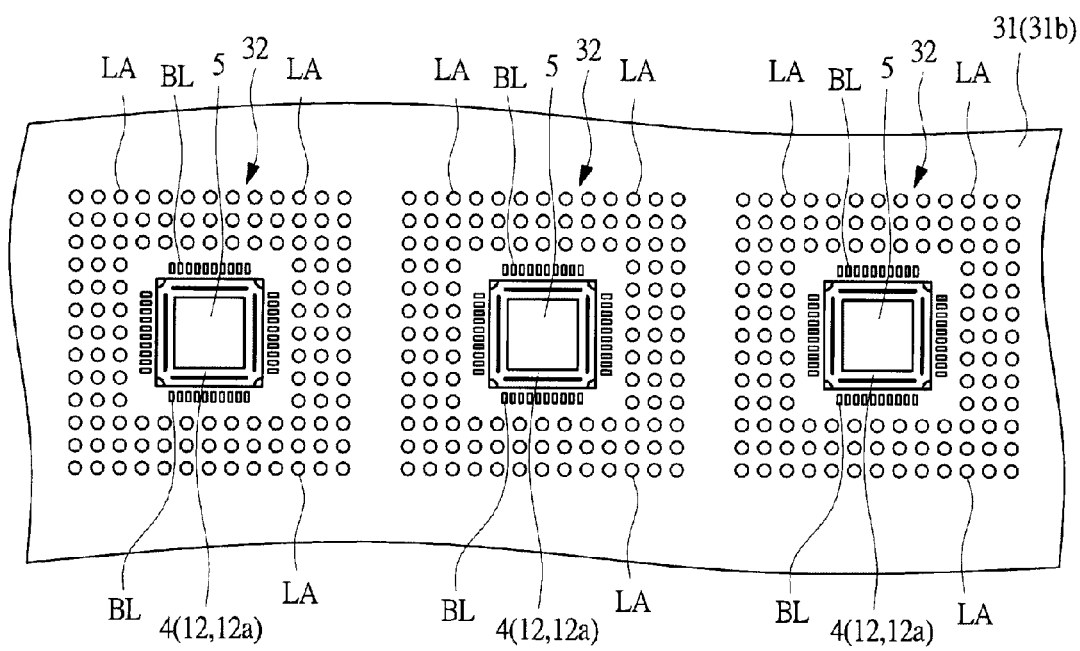
FIG. 73 is a plan view of the semiconductor device in the next step of FIG. 71, during manufacturing process.
Figure 74:
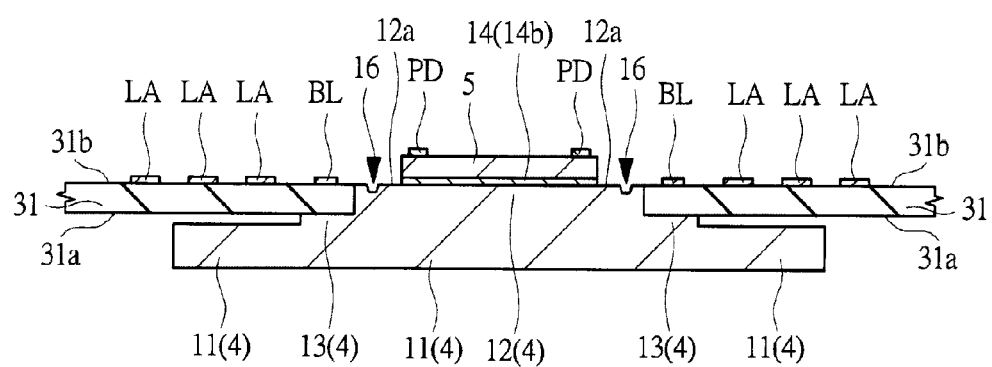
FIG. 74 is a cross-sectional view of the semiconductor device, which is the same as in FIG. 73, during manufacturing process.

FIG. 68 illustrates the flow diagram of another manufacturing process of semiconductor device 1 according to the embodiment 2, which flow diagram corresponds to that of FIG. 22 of the embodiment 1. FIGS. 69 to 74 are plan views and cross-sectional views during the manufacturing process of the semiconductor device 1 in the embodiment 2. Among FIGS. 69 to 74, FIG. 69, FIG. 71, and FIG. 73 are the plan views, and FIG. 70, FIG. 72, and FIG. 74 are the cross-sectional views.

In the beginning, the steps S1 and S2 provide the wiring substrate 31 and the frame 41, respectively. The wiring substrate 31 may be provided in advance, the frame 41 may be provided in advance, or the wiring substrate 31 and the frame 41 may be provided simultaneously.

The embodiment 2 does not conduct the step of die-bonding, and applies the step S4 to separate the heat-releasing plates 4 from the frame 41 by cutting at the frame rim 42 of the frame 41, and thus the heat-releasing plates 4 are singlated.

Figure 69:
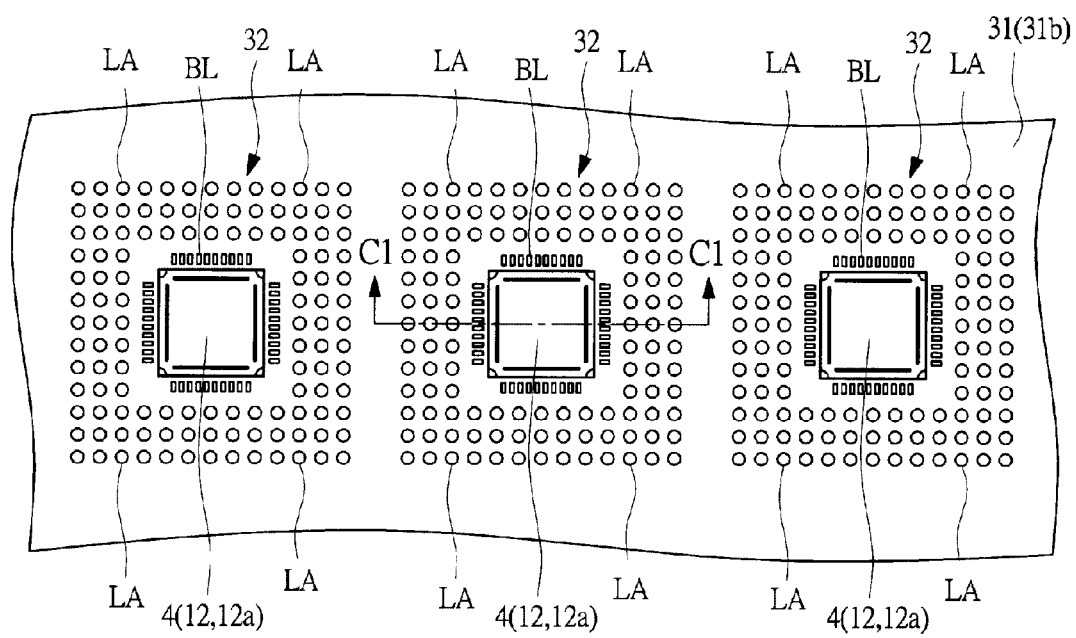
FIG. 69 is a plan view of semiconductor device during manufacturing process in other embodiments of the present invention.
Figure 70:
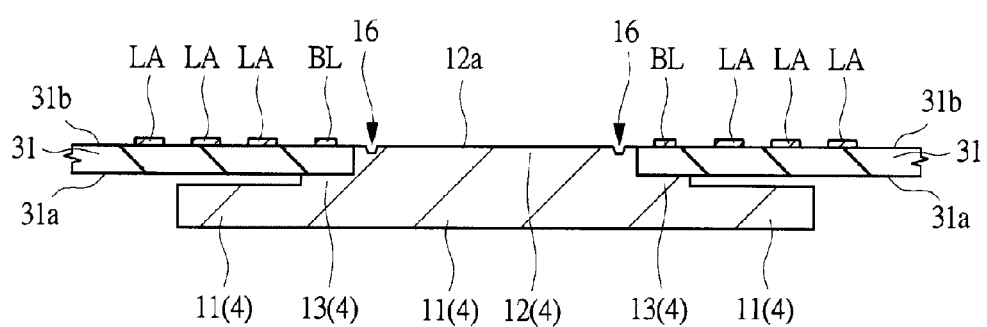
FIG. 70 is a cross-sectional view of the semiconductor device, which is the same as in FIG. 69, during manufacturing process.

Then, as illustrated in FIG. 69 and FIG. 70, the step S5 is conducted to place (insert) the convex part 12 of the heat-releasing plate 4 (the heat-releasing plate 4 not mounting the semiconductor chip 5 in the embodiment 2) in the through-hole 3 of each semiconductor device region 32 of the wiring substrate 31. After that, the step S6 is conducted to swage each heat-releasing plate 4 (the convex part 12 of the heat-releasing plate 4) to the wiring substrate 31 (each through-hole 3 of the wiring substrate 31) to fix each heat-releasing plate 4 to the wiring substrate 31. FIG. 69 and FIG. 70 are the plan view and the cross-sectional view, respectively, illustrating the stage completed up to the step S6. FIG. 69 shows the same region as that of FIG. 35, (or three semiconductor device regions 32), giving the lower surface 31b side of the wiring substrate 31. FIG. 70 shows the cross section corresponding to FIG. 37, (or the cross section along the C1-C1 line of FIG. 69).

The step S5 of placing the heat-releasing plate 4 and the step S6 of fixing (swaging) the heat-releasing plate 4 are conducted in the same way as that described in the embodiment 1 except that the semiconductor chip 5 is not mounted over the heat-releasing plate 4. Therefore, the detail description of these steps is omitted here. At the stage in which the step S6 of fixing (swaging) the heat-releasing plate 4 has been completed, the semiconductor chip 5 is not mounted over the convex part 12 of each heat-releasing plate 4 swaged and fixed to the wiring substrate 31.

Next is the step S3 of die-bonding, where the semiconductor chip 5 is mounted to join the main surface 12a of the convex part 12 of each heat-releasing plate 4 being fixed (swaged) to the wiring substrate 31 via the joining material 14. In the embodiment 2, the step S3 of die-bonding can be conducted in the following procedure.

Figure 71:
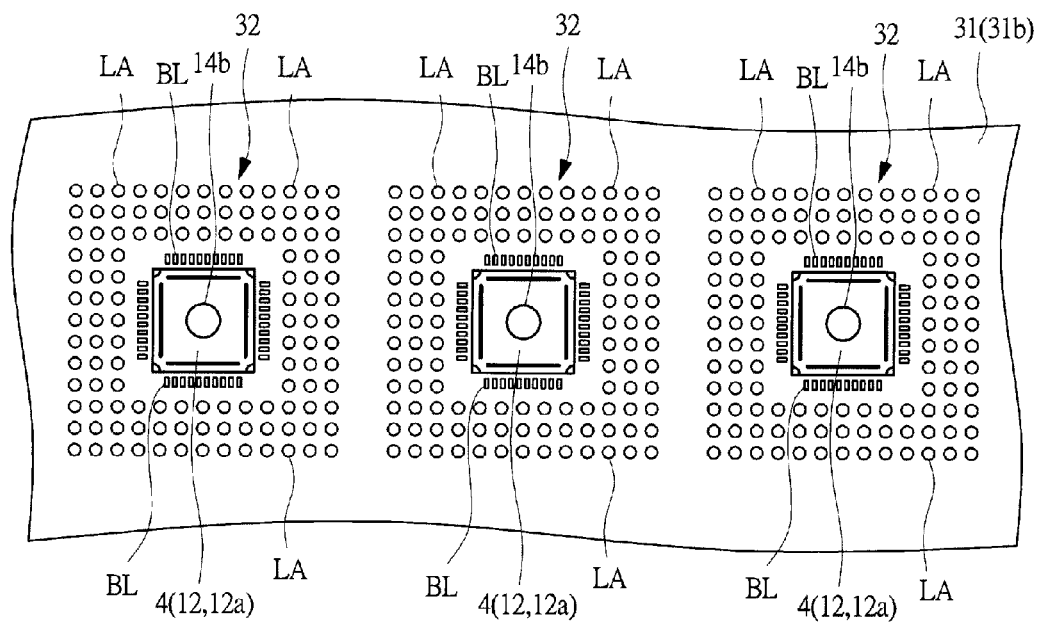
FIG. 71 is a plan view of the semiconductor device in the next step of FIG. 69, during manufacturing process.
Figure 72:
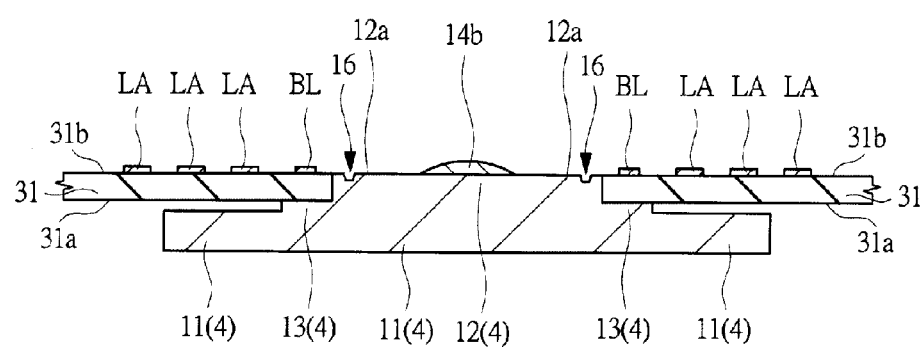
FIG. 72 is a cross-sectional view of the semiconductor device, which is the same as in FIG. 71, during manufacturing process.

As illustrated in FIG. 71 (plan view of the same region as that of FIG. 69) and FIG. 72 (cross-sectional view corresponding to FIG. 70), a conductive paste, preferably a silver paste 14b, is applied directly on the main surface 12a of the convex part 12 of each heat-releasing plate 4 placed and fixed to inside the through-hole 3 of each semiconductor device region 32 of the wiring substrate 31. Then, as illustrated in FIG. 73 (plan view of the same region as those of FIG. 69 and FIG. 71) and FIG. 74 (cross-sectional view corresponding to FIG. 70 and FIG. 72), the semiconductor chip 5 is mounted over the main surface 12a of the convex part 12 of each heat-releasing plate 4 placed and fixed to the through-hole 3 of each semiconductor device region 32 of the wiring substrate 31 via the silver paste 14b. After that, heat-treatment or the like is performed to harden the silver paste 14b. The silver paste 14b which was in paste form at the time of mounting the semiconductor chip 5 is hardened, which hardened silver paste 14b then joins the semiconductor chip 5 with the convex part 12 of the heat-releasing plate 4 to fix them together. The hardened silver paste 14b is the joining material 14. As can be seen in FIGS. 71 to 74, the step S5 of die-bonding is conducted in a state in which the lower surface 31b of the wiring substrate 31 faces upward.

The succeeding steps are the same as those of the manufacturing process described in the embodiment 1. That is, the step S7 of wire-bonding is conducted, the step S8 of molding is conducted, the step S9 of joining solder-ball 9 is conducted, and then the step S10 of cutting is conducted. Through these steps, the semiconductor device 1 illustrated in FIGS. 1 to 10 is manufactured.

The wiring substrate 31 composed of the resin substrate has poor durability towards high-temperature treatment compared with the frame 41 (heat-releasing plate 4) made of a metallic material. In the manufacturing process described in the embodiment 1, the step S3 is conducted to join the semiconductor chip 5 with the heat-releasing plate 4 before conducting the steps S5 and S6 to place and fix the heat-releasing plate 4 to the wiring substrate 31. Consequently, the heat-treatment in the step S3 of joining the semiconductor chip 5 does not heat the wiring substrate 31. As a result, the high-temperature heat treatment can be performed in the step S3 of joining the semiconductor chip irrespective of the heat-resistance of the wiring substrate 31. Accordingly, when a high-temperature heat treatment is performed in the step S3 of joining the semiconductor chip 5, or for example when the semiconductor chip 5 is joined with the heat-releasing plate 4 by using the solder 14a having higher melting point than that of the solder used for the external terminal (the solder ball 9 in the embodiment 2) formed over the bump land LA, use of the manufacturing process described in the embodiment 1 is suitable because the wiring substrate 31 is not damaged during the solder reflow in the step S3 of joining the semiconductor chip 5.

When a lead-fee solder is used for the solder ball 9, the temperature of solder reflow in mounting the semiconductor device 1 (mounting over the substrate 21 and the like) is for example about 220° C., and when a lead-containing solder is used for the solder ball 9, the temperature of solder reflow in mounting the semiconductor device 1 (mounting over the substrate 21 and the like) is for example about 180° C. On the other hand, when a high-temperature solder is used for the solder 14a, the solder reflow temperature in the step S3 is preferably in a region from about 350° C. to about 400° C. The wiring substrate 31, however, may not endure towards that high temperature. Regarding this point, the manufacturing process described in the embodiment 1 raises no durability problem of the wiring substrate 31 during solder reflow because the step S3 joins the semiconductor chip 5 with the heat-releasing plate 4 before conducting the steps S5 and S6 to place and fix the heat-releasing plate 4 to the wiring substrate 41.

Compared with the case of using a silver paste, the use of solder as the joining material 14 increases the thermal conduction of the joining material 14, which further increases the thermal conduction from the semiconductor chip 5 to the heat-releasing plate 4 and thus further improves the heat-releasing performance of the semiconductor device 1.

According to the manufacturing process described in the embodiment 2, the step S3 is conducted to join the semiconductor chip 5 with the heat-releasing plate 4 before conducting the steps S5 and S6 to place and fix the heat-releasing plate 4 to the wiring substrate 31. Consequently, the wiring substrate 31 is heated during the heat-treatment of the step S3 of joining the semiconductor chip 5. As a result, when the manufacturing process described in the embodiment 2 is conducted, the heat treatment in the step S3 of joining the semiconductor chip 5 is preferably performed at not so high temperature. As described above, it is preferable that the silver paste 14b is used to join the semiconductor chip 5 with the heat-releasing plate 4 to avoid damage of the wiring substrate 31 during the heat treatment to harden the joining material (silver paste 14b) in the step S3 of joining the semiconductor chip 5.

(Embodiment 3)

Figure 75:
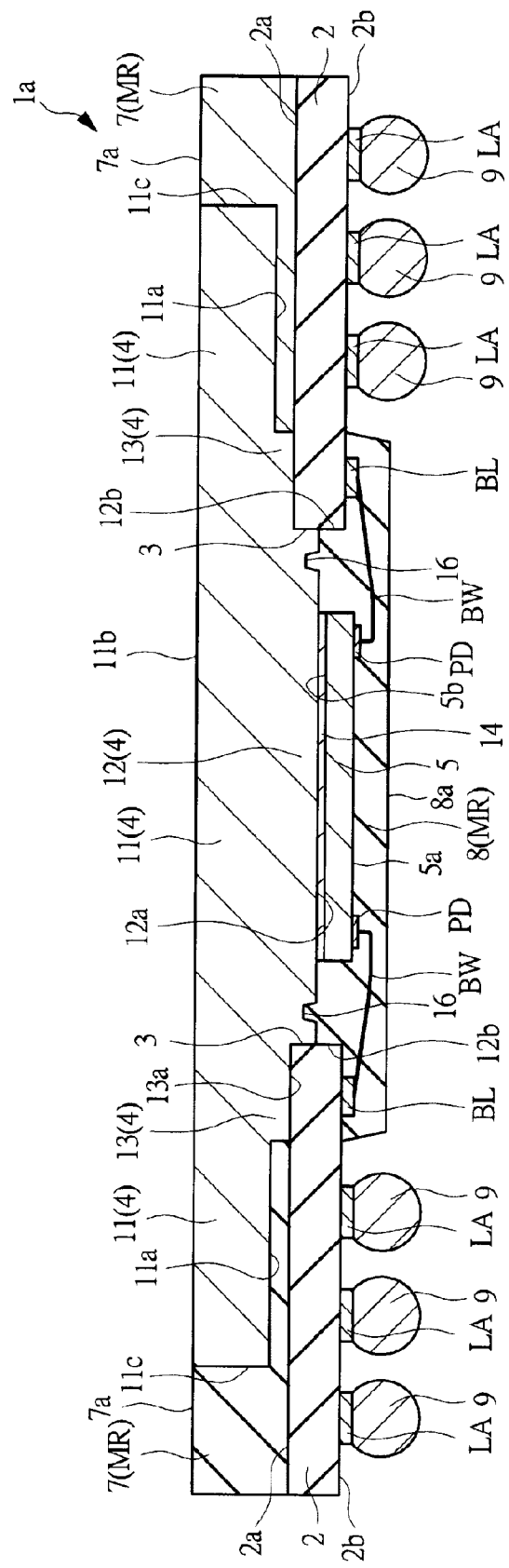
FIG. 75 is a cross-sectional view of a semiconductor device in further embodiment of the present invention.
Figure 76:
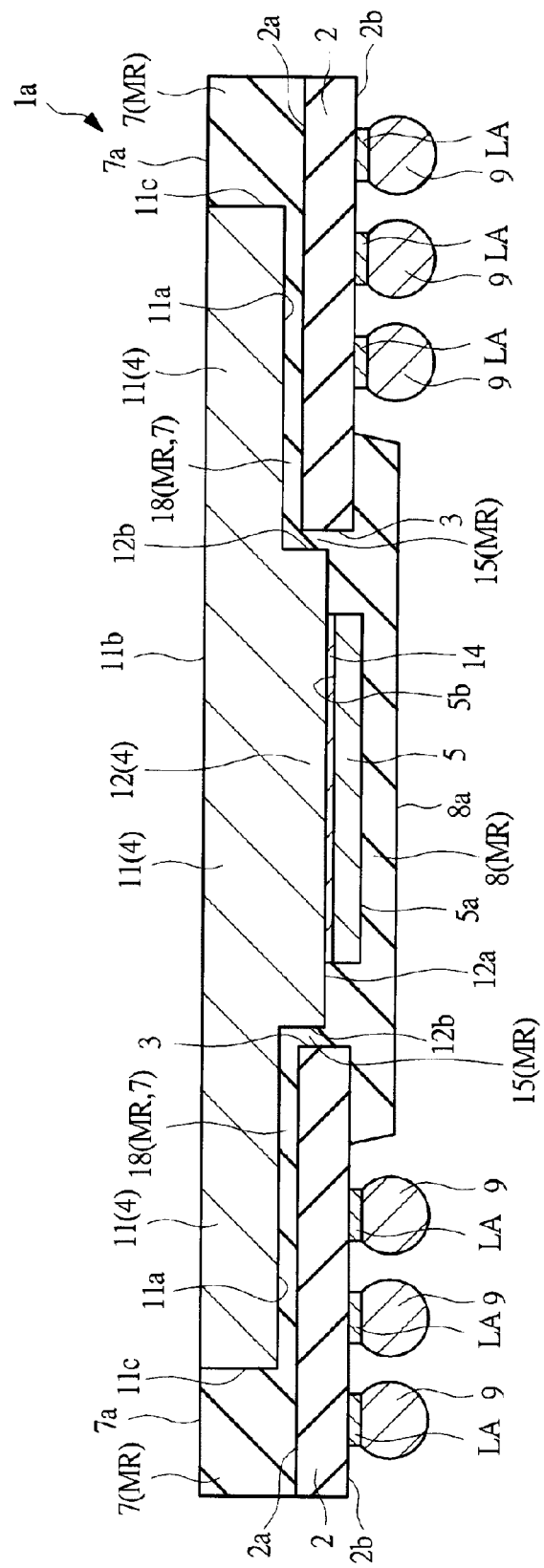
FIG. 76 is another cross-sectional view of the semiconductor device of FIG. 75.

FIG. 75 and FIG. 76 are cross-sectional views (side surface cross-sectional views) of a semiconductor device 1a of the embodiment 3, corresponding to FIG. 1 and FIG. 2 of the embodiment 1, respectively.

According to the semiconductor device 1 of the embodiment 1, the main surface 12a of the convex part 12 of the heat-releasing plate 4 is in almost the same plane as that of the lower surface 2b of the wiring substrate 2, and the height of the main surface 12a of the convex part 12 of the heat-releasing plate 4 is almost the same as the height of the lower surface 2b of the wiring substrate 2.

In contrast, according to the semiconductor device 1a of the embodiment 3, the main surface 12a of the convex part 12 of the heat-releasing plate 4 is not in the same plane as that of the lower surface 2b of the wiring substrate 2, positioned (height position) between the lower surface 2b and the upper surface 2a of the wiring substrate 2. That is, according to the semiconductor device 1a of the embodiment 3, the height position of the main surface 12a of the convex part 12 of the heat-releasing plate 4 is not the same as the height position of the lower surface 2b of the wiring substrate 2, and is not the same as the height position of the upper surface 2a of the wiring substrate 2, positioning between the lower surface 2b and the upper surface 2a of the wiring substrate 2. The condition can be obtained by making the height difference (difference in height) between the supporting surface 13a of the supporting part 13 and the main surface 12a of the convex part 12 thinner than the thickness of the wiring substrate 2 (or the height difference between the upper surface 2a and the lower surface 2b of the heat-releasing plate 2) in the heat-releasing plate 4. The height position of the main surface 12a of the convex part 12 of the wiring substrate 2, the height position of the lower surface 2b of the wiring substrate 2, and the height position of the upper surface 2a of the wiring substrate 2 signify the height position in the vertical direction to the main surface 12a, to the lower surface 2b, and to the upper surface 2a, respectively.

According to the semiconductor device 1a of the embodiment 3, the height position of the main surface 12a of the convex part 12 of the heat-releasing plate 4 is between the lower surface 2b and the upper surface 2a of the wiring substrate 2. Consequently, compared with the semiconductor device 1 of the embodiment 1 in which the height position of the main surface 12a of the convex part 12 of the heat-releasing plate 4 agrees with the height position of the lower surface 2b of the wiring substrate 2, the semiconductor device 1a of the embodiment 3 gives a low position of the top surface 5a of the semiconductor chip 5. The above description is given based on the definition that the position of upper surface 2a of the wiring substrate 2 is selected to be the reference height, and that the position of lower surface 2b of the wiring substrate 2 is the higher position. Owing to the structure, the semiconductor device 1a of the embodiment 3 can reduce the thickness of the sealing portion 8 compared with that of the semiconductor 1 of the embodiment 1 described above.

Since the structures of other components of the semiconductor device 1a of the embodiment 3 are almost equal to those of the semiconductor device 1 of the embodiment 1, the description thereof is not given here. The manufacturing process of the semiconductor device 1a of the embodiment 3 is almost the same as that of the semiconductor device 1. Therefore, the semiconductor device 1a of the embodiment can be manufactured by a similar process of the embodiment 1 or the embodiment 2.

The semiconductor device 1a of the embodiment 3 makes the height position of the main surface 12a of the convex part 12 of the heat-releasing plate 4 lower than the height of the lower surface 2b of the wiring substrate 2 (the description is given based on the definition that the position of upper surface 2a of the wiring substrate 2 is selected to be the reference height, and that the position of lower surface 2b of the wiring substrate 2 is the higher position). The structure lowers the height position of the top surface 5a of the semiconductor chip 5 to make the height position of the top surface 5a of the semiconductor chip 5 near to the height position of the lower surface 2b of the wiring substrate 2. Since the step of wire bonding is easily conducted at small difference in height between the electrode pad PD of the semiconductor chip 5 and the bonding lead BL of the wiring substrate 2, the semiconductor device 1a of the embodiment 3 makes the height position of the top surface 5a of the semiconductor chip 5 near to the height position of the lower surface 2b of the wiring substrate 2, which makes the step S7 of wire-bonding easy.

According to the embodiment 3, since the height position of the top surface 5a of the semiconductor chip 5 becomes close to the height position of the lower surface 2b of the wiring substrate 2, the thickness of the sealing portion 8 can be reduced, which is advantageous in thickness reduction of the semiconductor device.

On the other hand, as in the case of the semiconductor device 1 of the embodiment 1, when the main surface 12a of the convex part 12 of the heat-releasing plate 4 is set to be almost the same height position as that of the lower surface 2b of the wiring substrate 2, the volume of the convex part 12 of the heat-releasing plate 4, (further the volume of the heat-releasing plate 4), can be increased, and thus the heat-releasing performance (heat-release properties) of the semiconductor device can further be improved.

(Embodiment 4)

Figure 77:
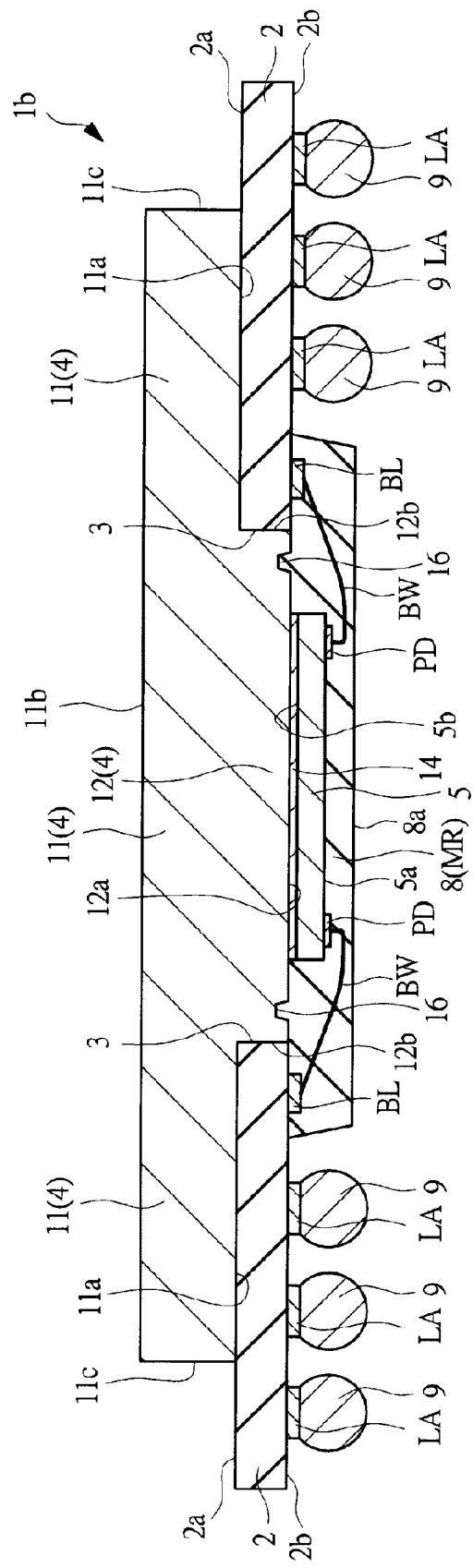
FIG. 77 is a cross-sectional view of a semiconductor device in other embodiment of the present invention.
Figure 78:
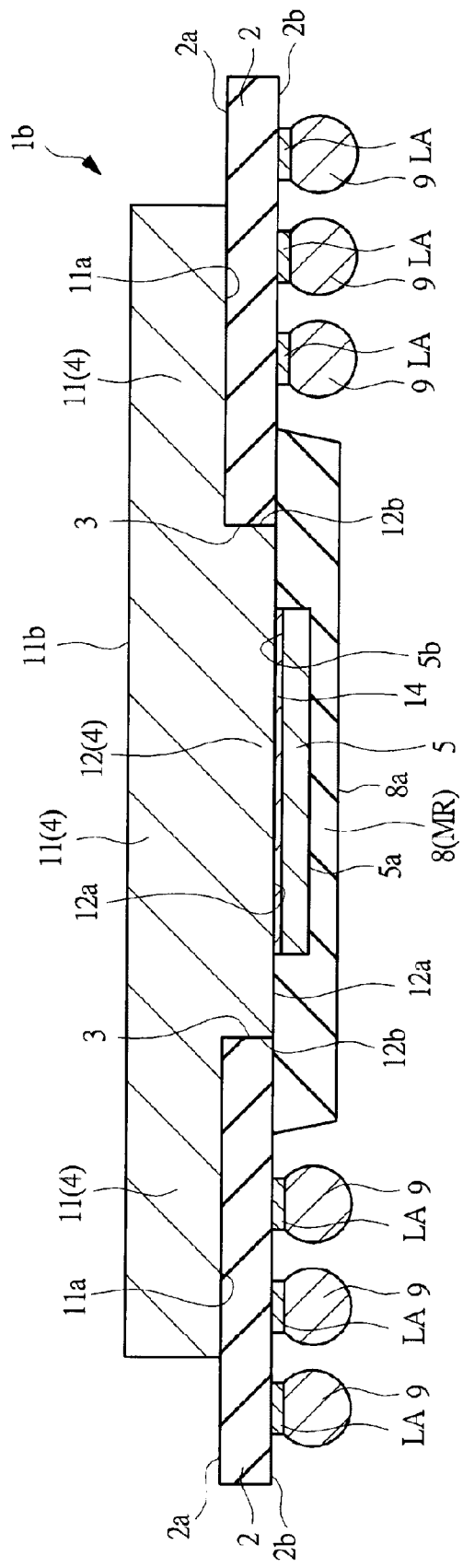
FIG. 78 is another cross-sectional view of the semiconductor of FIG. 77.
Figure 79:
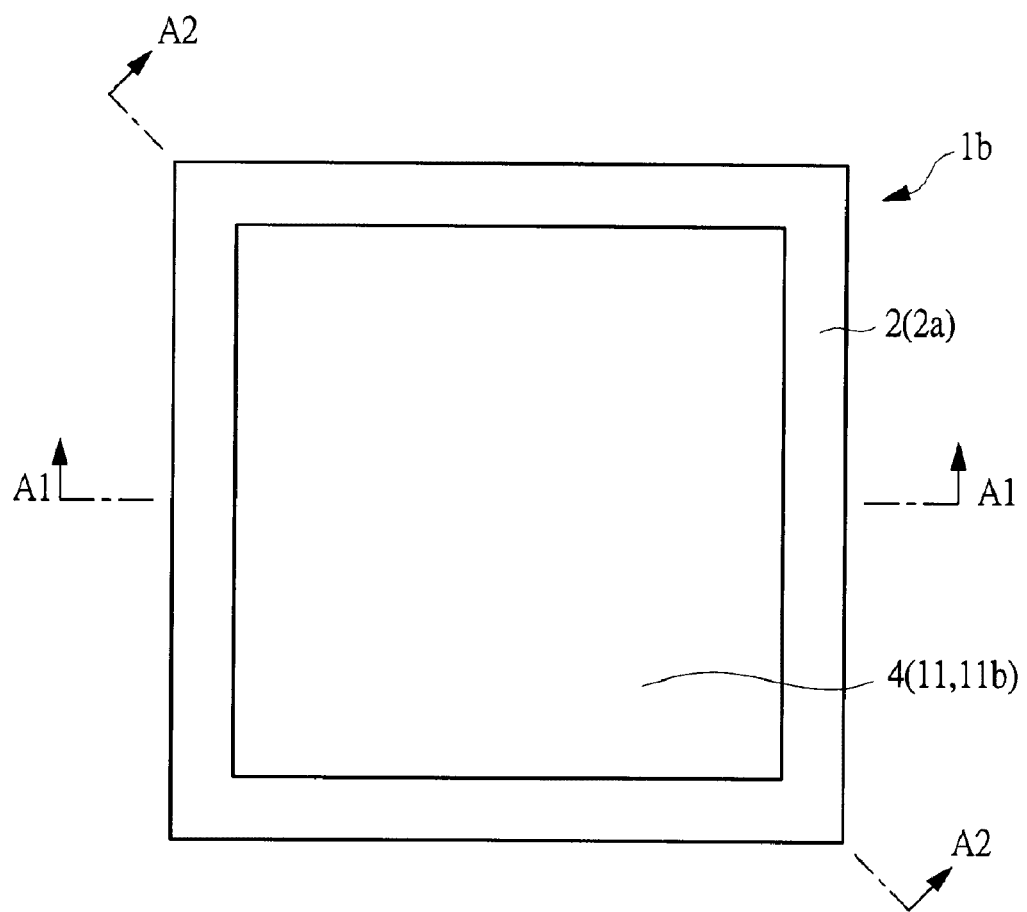
FIG. 79 is an upper surface view of the semiconductor device of FIG. 77.
Figure 80:
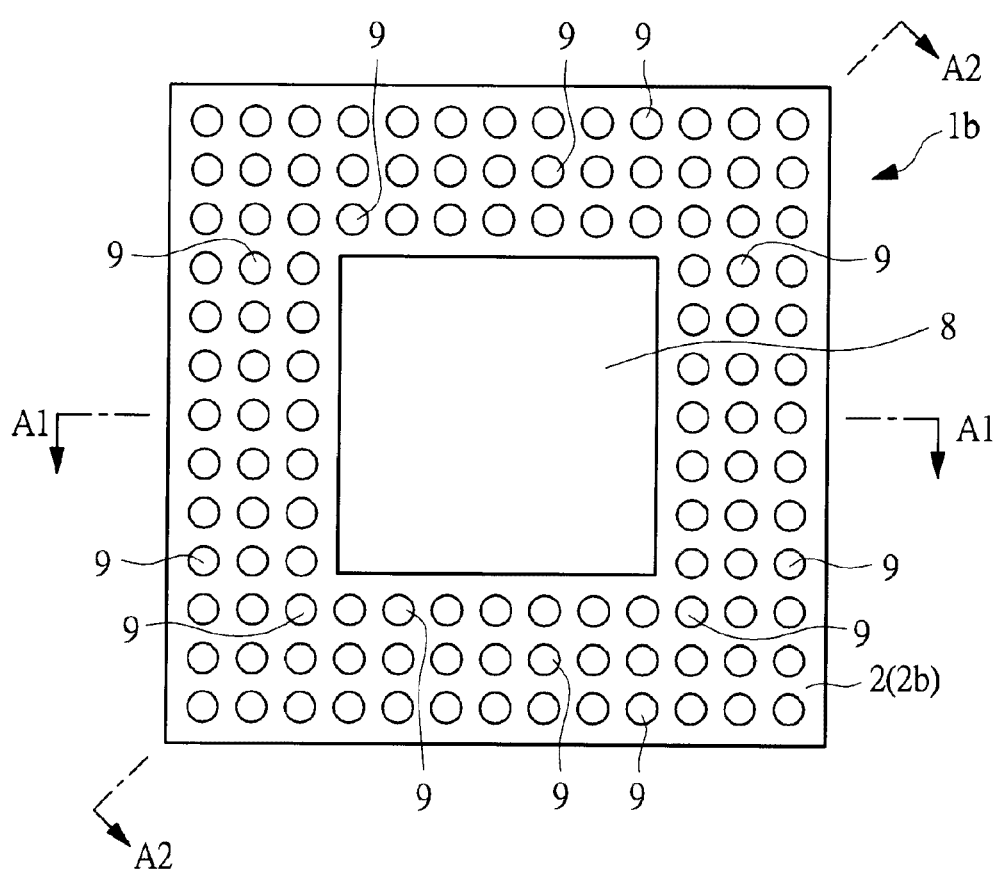
FIG. 80 is a lower surface view of the semiconductor device of FIG. 77.
Figure 81:
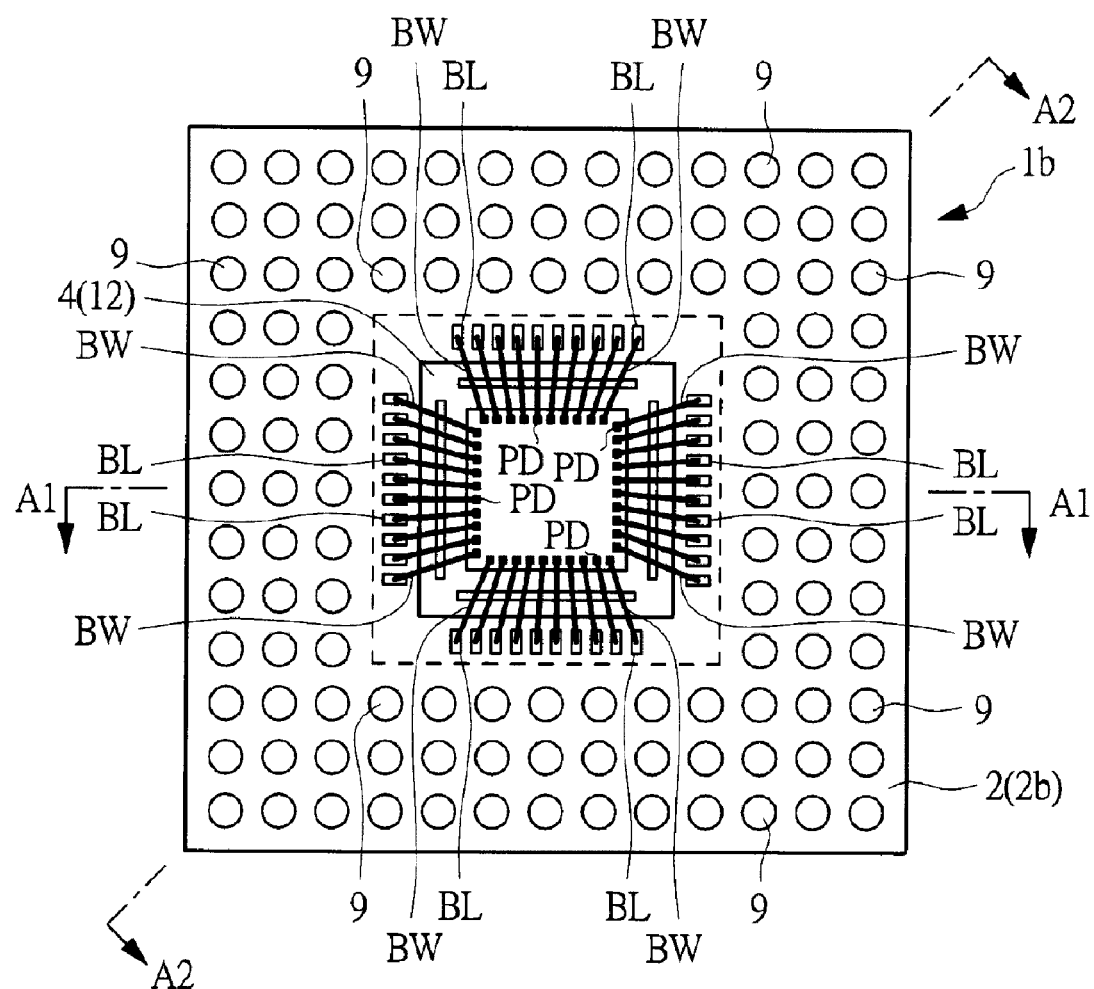
FIG. 81 is a plane perspective view (lower surface view) of the semiconductor device of FIG. 77.
Figure 82:
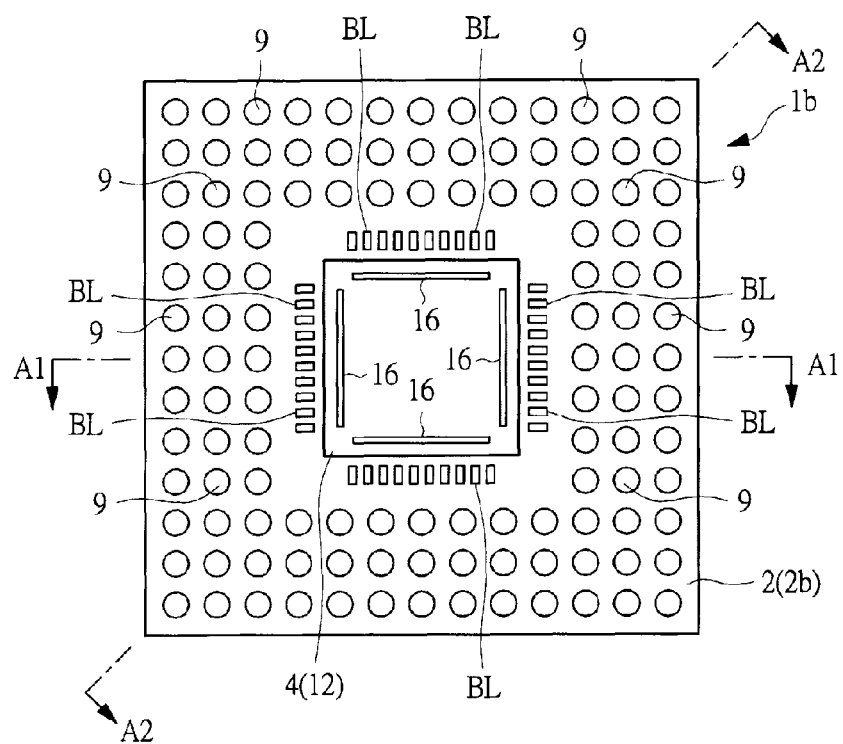
FIG. 82 is a plane perspective view (lower surface view) of the semiconductor device of FIG. 77.

FIG. 77 and FIG. 78 are the cross-sectional views (side surface cross sectional views) of a semiconductor device 1b of the embodiment 4, corresponding to FIG. 1 and FIG. 2 of the embodiment 1, respectively. FIG. 79 is the upper surface view of the semiconductor device 1b of the embodiment 4, corresponding to FIG. 5 of the embodiment 1. FIG. 80 is the lower surface view of the semiconductor device 1b of the embodiment 4, corresponding to FIG. 6 of the embodiment 1. FIG. 81 is the plane perspective view (lower surface view) of the semiconductor device 1b, illustrating the lower surface side of the semiconductor device 1b when seen through the sealing portion 8, corresponding to FIG. 8 of the embodiment 1. FIG. 82 is the plane perspective view (lower surface view) of the semiconductor device 1 in a state in which, in FIG. 81, the bonding wire BW and the semiconductor chip 5 are further removed (seen through), corresponding to FIG. 10 of the embodiment 1. The cross section along the A1-A1 line in FIGS. 79 to 82 almost corresponds to FIG. 77. The cross section along the A2-A2 line in FIGS. 79 to 82 almost corresponds to FIG. 78. For the convenience of understanding, FIG. 81 shows the outer periphery of the sealing portion 8 seen through, by a broken line.

In the semiconductor device 1 of the embodiment 1, the sealing portion 7 is formed at upper surface 2a side of the wiring substrate 2, and the sealing portion 8 is formed at lower surface 2b side of the wiring substrate 2. In contrast, in the semiconductor device 1b of the embodiment 4, shown in FIGS. 77 to 82, although the sealing portion 8 is formed at the lower surface 2b side of the wiring substrate 2, no sealing portion corresponding to the sealing portion 7 is formed above the upper surface 2a of the wiring substrate 2. Consequently, in the semiconductor device 1b of the embodiment 4, not only the rear surface 11b of the base material part 11 of the heat-releasing plate 4 but also the side surface 11c of the base material part 11 is exposed.

Since the embodiment 4 does not form the one corresponding to the sealing portion 7, there is no need of the gap part 15 which functions as the flow passage of the resin material MR from the upper surface 31a to the lower surface 31b of the wiring substrate 31. Accordingly the embodiment 4 does not form the gap part 15 between the inside wall of the through-hole 3 of the wiring substrate 2 and the side surface 12b of the convex part 12 of the heat-releasing plate 4. Although in the embodiment 1, the gap 18 between the main surface 11a of the base material part 11 of the heat-releasing plate 4 and the upper surface 2a of the wiring substrate 2 also functioned as the flow passage of the resin material MR to the gap part 15, the embodiment 4 needs neither gap 18 nor the gap part 15. In the embodiment 4, therefore, the supporting part 13 is not needed in the heat-releasing plate 4, and it is preferable that the main surface 11a (the region having no convex part 12) of the base material part 11 of the heat-releasing plate 4 contacts with the upper surface 2a of the wiring substrate 2. To do this, the resin material MR is not filled between the main surface 11a (the region having no convex part 12) of the base material part 11 of the heat-releasing plate 4 and the upper surface 2a of the wiring substrate 2. Since the semiconductor device 1b of the embodiment 4 has basically the same structure as that of the semiconductor device 1 of the embodiment 1 except for the above structure, the description thereof is not given here.

The manufacturing process of the semiconductor device 1b of the embodiment 4 will be described below. FIGS. 83 to 86 illustrate the manufacturing process of the semiconductor device 1b of the embodiment 4, showing the cross section corresponding to FIG. 77.

Regarding the manufacturing process of the semiconductor device of the embodiment 4, steps before the step S8 of molding are basically the same as those of the embodiment 1 or the embodiment 2. Since, however, the gap part 15 is not necessary, the shape of the convex part 12 of the heat-releasing plate 4 (planar shape), and the shape of the through-hole 3 of the wiring substrate 31 (planar shape), are in a shape not forming the gap part 15. For example, the planar shape of the through-hole 3 of the wiring substrate and the planar shape of the convex part 12 of the heat-releasing plate 4 may be a quadrangle having a near-right angle at each corner. With the configuration, when the steps S5 and S6 are conducted to fix the heat-releasing plate 4 to the wiring substrate 31, the inside wall of the through-hole 3 of the wiring substrate 31 and the side surface 12b of the convex part 12 of the heat-releasing plate 4 become close to each other in almost entire region, and thus the gap part 15 is not formed. Above the main surface 11a of the base material part 11 of the heat-releasing plate 4, although the convex part 12 is formed, the supporting part 13 is not formed, and it is preferable that the main surface 11a (entire region in which the convex part 12 is not formed) of the base material part 11 of the heat-releasing plate 4 contacts with the lower surface 31b of the wiring substrate 31. With the structure, the main surface 11a (entire region in which the convex part 12 is not formed) of the base material part 11 functions as the supporting part 13.

Figure 83:
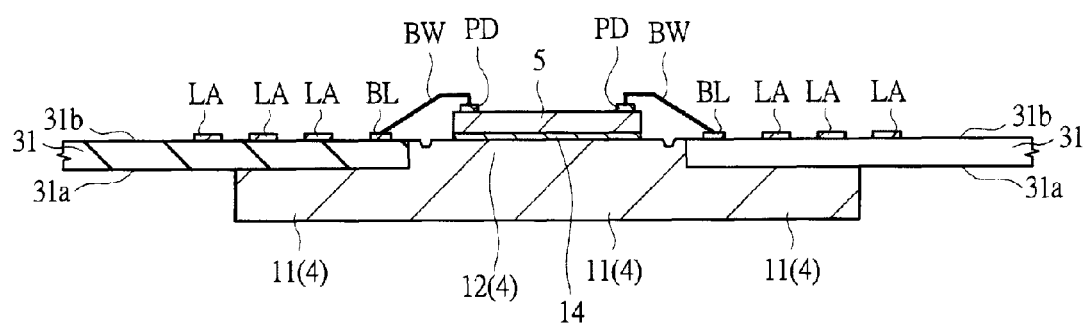
FIG. 83 illustrates the process of manufacturing semiconductor device in further embodiment of the present invention.

In the same as the embodiment 1 or the embodiment 2, the steps until the step S7 of wire bonding are conducted to prepare the structure of FIG. 83 corresponding to that of FIG. 39, and then the step of molding is carried out to conduct resin sealing to form the resin sealing portion 8. The method of molding differs from the methods in the embodiments 1 and 2. The step of molding (forming the sealing portion 8) of the embodiment 4 is described below.

Figure 84:
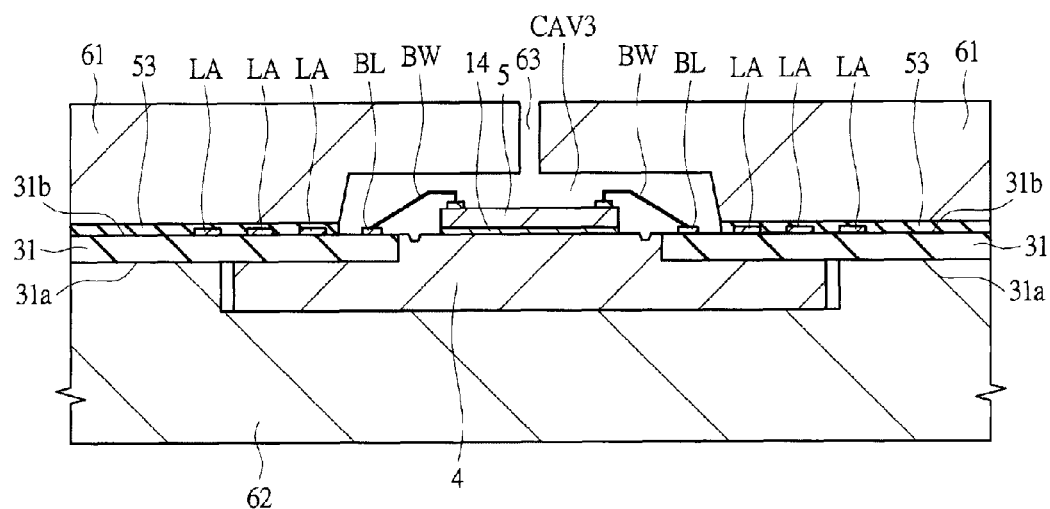
FIG. 84 illustrates the process of manufacturing semiconductor device in the further embodiment of the present invention.

As illustrated in FIG. 84, the wiring substrate 31 in a state in which the steps S1 to S7 were applied and the heat-releasing plate 4 was fixed (swaged) is placed between a die 61 and a die 62 as the upper die and the lower die, respectively, and then the wiring substrate 31 is sandwiched to be clamped (fixed) therebetween.

In the embodiment 1, the wiring substrate 31 is sandwiched to clamp thereof between the dies 51 and 52 so that the upper surface 31a of the wiring substrate 31 faces upward against the upper die (the die 51), and so that the lower surface 31b of the wiring substrate 31 faces against the lower die (the die 52). In contrast, according to the embodiment 4, the wiring substrate 31 is sandwiched to clamp thereof between the dies 61 and 62 so that the lower surface 31b of the wiring substrate 31 faces upward against the upper die (the die 61), and so that the upper surface 31a of the wiring substrate 31 faces against the lower die (the die 62).

When the wiring substrate 31 is clamped between the dies 61 and 62, as illustrated in FIG. 84, a cavity CAV3 is formed between the lower surface 31b of the wiring substrate 31 and the die (upper die) 61. The cavity CAV3 is a cavity (a hollow space) for forming the sealing portion 8, and the cavity CAV3 is formed in each semiconductor device region 32.

In clamping the wiring substrate 31 between the dies 61 and 62, it is preferable that the sheet 53 is attached to the face of the die (upper die) 61 contacting with the lower surface 31b of the wiring substrate 31, and that the sheet 53 exists between the die (upper die) 61 and the wiring substrate 31 to avoid direct contact of the die (upper die) 61 with the lower surface 31b of the wiring substrate 31. In this state, an opening is formed in the sheet 53 at a position corresponding to the cavity for forming the sealing portion 8. With the opening, the resin can fill in the cavity CAV3 through the resin gate 63 formed at upper part (bottom face of the cavity) of the cavity CAV3. The sheet 53 has higher elasticity than that of the die (upper die) 61, and has a heat resistance durable to the temperature of the step of molding. The sheet 53 can be prepared by a resin sheet such as a polyimide resin sheet. The use of the sheet 53 prevents the contact of the bump lands LA in each semiconductor device region 32 above the lower surface 31b of the wiring substrate 31 with the die 61, though the bump lands LA contact with the sheet 53. Accordingly, the bump lands LA above the lower surface 31b of the wiring substrate 31 can be prevented from being damaged by the die 61 having high rigidity. If, however, the flaws generated in the bump land LA are not at a magnitude of raising problem in connecting with the solder ball as the external terminal, the sheet 53 is not necessarily used.

Figure 85:
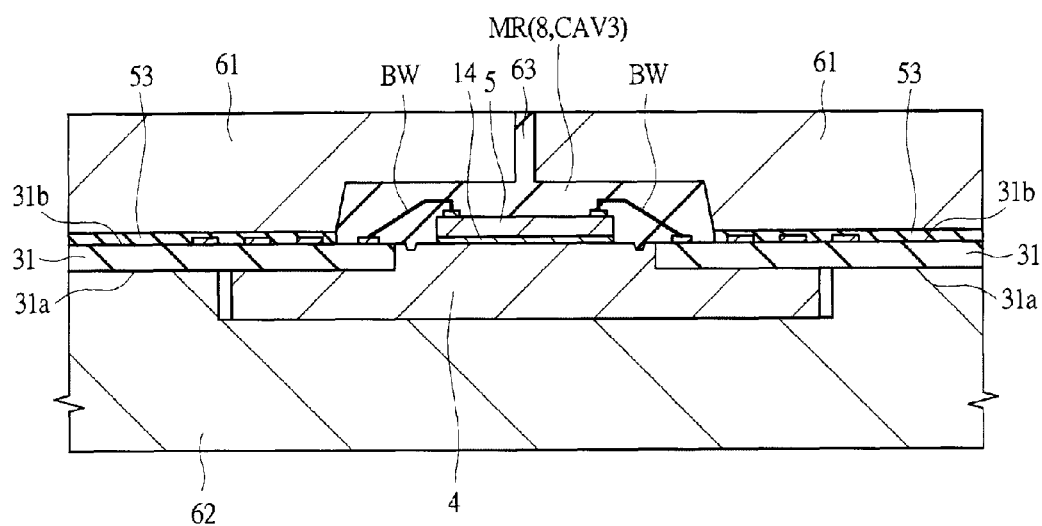
FIG. 85 illustrates the process of manufacturing semiconductor device in the further embodiment of the present invention.

After clamping the wiring substrate 31 by the dies 61 and 62, as illustrated in FIG. 85, the resin material MR for forming the sealing portion 8 is injected (supplied) to the cavity CAV3 formed between the lower surface 31b of the wiring substrate 31 and the die (upper die) 61 from the resin gate 63 (the resin gate opening, the resin injection opening). Here, the resin gate 63 is positioned at upper part of the cavity CAV3, and the dies 61 and 62 are top-gate type molding dies.

Figure 86:
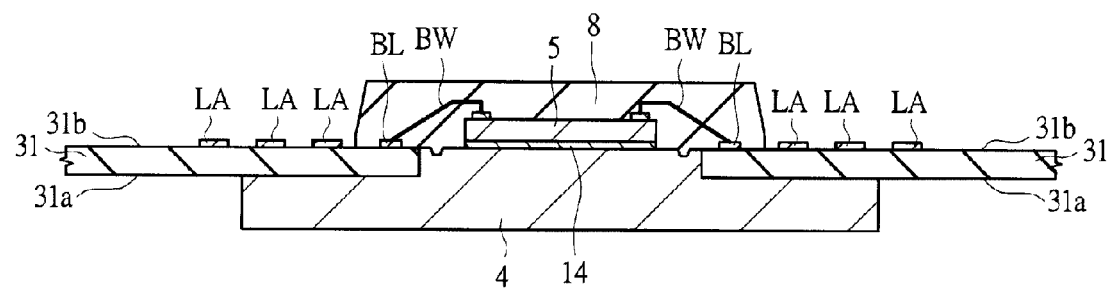
FIG. 86 illustrates the process of manufacturing semiconductor device in the further embodiment of the present invention.

After filling the cavity CAV3 with the resin material MR, the resin material MR in the cavity CAV3 is hardened by heating and the like. The resin material MR in the cavity CAV3 is hardened to become the sealing portion 8. Then, the dies 61 and 62 are released, and as illustrated in FIG. 86, the wiring substrate 31 mounting the sealing portion 8 thereon is taken out.

The sealing portion 8 is formed so as to cover the semiconductor chip 5 and the bonding wire BW in each of the semiconductor device regions 32 of the lower surface 31b of the wiring substrate 31, and the sealing portions 8 formed in the respective semiconductor device regions 32 are separated from each other. In each semiconductor device range 32 of the lower surface 31b of the wiring substrate 31, the sealing portion 8 is not formed in the region in which the bump lands LA are arranged, and is formed at a position close to the center than the region in which the bump lands LA are arranged. Consequently, in each semiconductor device region 32 of the lower surface 31b of the wiring substrate 31, the sealing portion 8 is formed so as to cover the semiconductor chip 5, the main surface 12a of the convex part 12 of the heat-releasing plate 4, the bonding wire BW, and the bonding lead BL, but so as not to cover the bump land LA.

After that, the step S9 of connecting the solder ball and the step S10 of cutting the wiring substrate 31 are performed. The step S9 of connecting the solder ball 9 in the embodiment 4 can be performed in the same manner as that of the embodiment 1. As for the step S10 of cutting the wiring substrate 31, the embodiment 1 cuts also the sealing portion 8 together with the wiring substrate 31. Since, however, in the embodiment 4, the sealing portion 7c is not formed, the wiring substrate 31 may be cut.

The embodiment 4 describes the case of forming the sealing portion 8 by the top-gate method (the method of introducing the resin material MR to the cavity CAV3 from the resin gate 63 at upper part of the cavity CAV3). As another embodiment, the potting method can be applied to form the sealing portion 8. Also in the case of applying the potting method to form the sealing portion 8, the adhesion of the resin material MR to the bump land LA at lower surface 31b of the wiring substrate 31 is avoided to be prevented from covering the bump land LA by the sealing portion 8.

In the same way as the embodiment 3, in the embodiment 4, the height position of the main surface 12a of the convex part 12 of the heat-releasing plate 4 can be set as the height position between the lower surface 2b and the upper surface 2a of the wiring substrate 2.

Since in the embodiment 4, the seal resin part is not formed at the upper surface 2a (31a) side of the wiring substrate 2 (31), the resin material (such as resin burr) does not adhere to the rear surface 11b and the side surface 11c of the base material part 11 of the heat-releasing plate 4, and the heat-releasing plate 4 is easily exposed. As a result, the heat-releasing plate 4 of the semiconductor device 1b can easily be connected with heat-releasing fins (not shown), the casing 24, and the like.

As described above, in the semiconductor devices 1 and 1a in above embodiments 1 to 3, the resin material MR supplied to the upper surface 31a side (the cavity CAV1 of the upper surface 31a) of the wiring substrate 31 is also supplied to the lower surface 31b side (the cavity CAV2 of the lower surface 31b) of the wiring substrate 31 through the gap 18 and the gap part 15. As a result, in the embodiments 1 to 3, the resin material MR fills also the gap 18 between the main surface 11a of the base material part 11 of the heat-releasing plate 4 and the upper surface 2a (31a) of the wiring substrate 2 (31), and also fills the gap part 15 between the side surface 12b of the convex part 12 of the heat-releasing plate 4 and the inside wall of the through-hole 3. As a result, the heat-releasing plate 4 can be firmly fixed to the wiring substrate 2, and thus the reliability of the semiconductor devices 1 and 1a can be further improved. Therefore, the semiconductor devices 1 and 1a in the embodiments 1 to 3 are advantageous in view of increasing the holding power of the heat-releasing plate 4 in the semiconductor devices 1, 1a, and 1b.

According to the embodiments 1 to 3 and to the embodiment 4, as described above, since the heat-releasing plate 4 is swaged (fixed) to the wiring substrate 31 by forcibly widening the groove 16 in the convex part 12 of the heat-releasing plate 4, a region close to the main surface 11a, in the side surface 12b of the convex part 12, as illustrated in FIG. 54 and FIG. 60, contacts with the inside wall of the through-hole 3 of the wiring substrate 31. However, in a region close to the main material part 11, there is a slight gap 19 from the inside wall of the through-hole 3 of the wiring substrate 31. The gap 19 can be filled with the resin material MR in forming the sealing portions 7c and 8 in the embodiments 1 to 3, or in forming the sealing portion 8 in the embodiment 4. Thus, the contact (adhesion) of the heat-releasing plate 4 with (to) the wiring substrate 2 is improved, and the holding power of the heat-releasing plate 4 is increased. However, the gap 19 is formed at the base material part 11 side of the side surface 12b of the convex part 12, and the region close to the main surface 11a contacts with the inside wall of the through-hole 3 of the wiring substrate 31. Therefore, to fill the gap 19 with the resin material MR, the embodiments 1 to 3 of supplying the resin material from the upper surface 31a side of the wiring substrate 31 are more advantageous than the embodiment 4 of supplying the resin material MR to the lower surface 31b side of the wiring substrate 31. That is, the filling rate of the resin material MR in the gap 19 tends to be higher in the embodiments 1 to 3 than in the embodiment 4. Also from this point of view, the semiconductor devices 1 and 1a of the embodiments 1 to 3 can increase the holding power of the heat-releasing plate 4 more than the semiconductor device 1b of the embodiment 4.

(Embodiment 5)

The embodiment 5 is a modified example of the embodiment 1.

Figure 87:
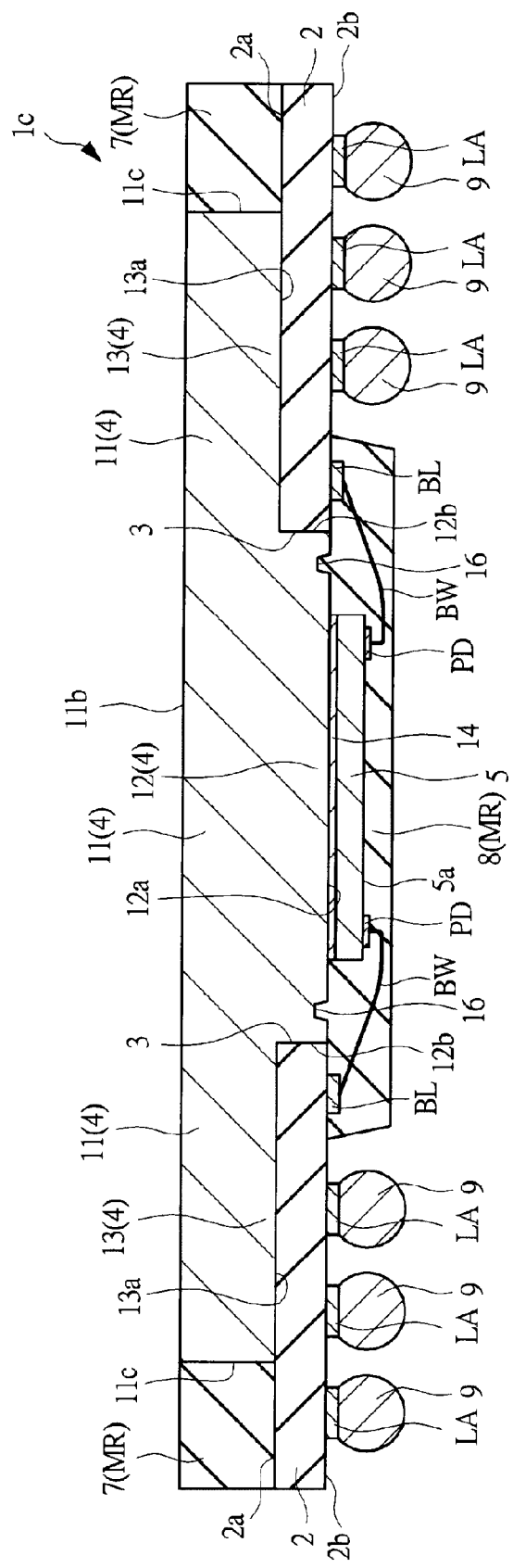
FIG. 87 is a cross sectional view of semiconductor device in still further embodiment of the present invention.
Figure 88:
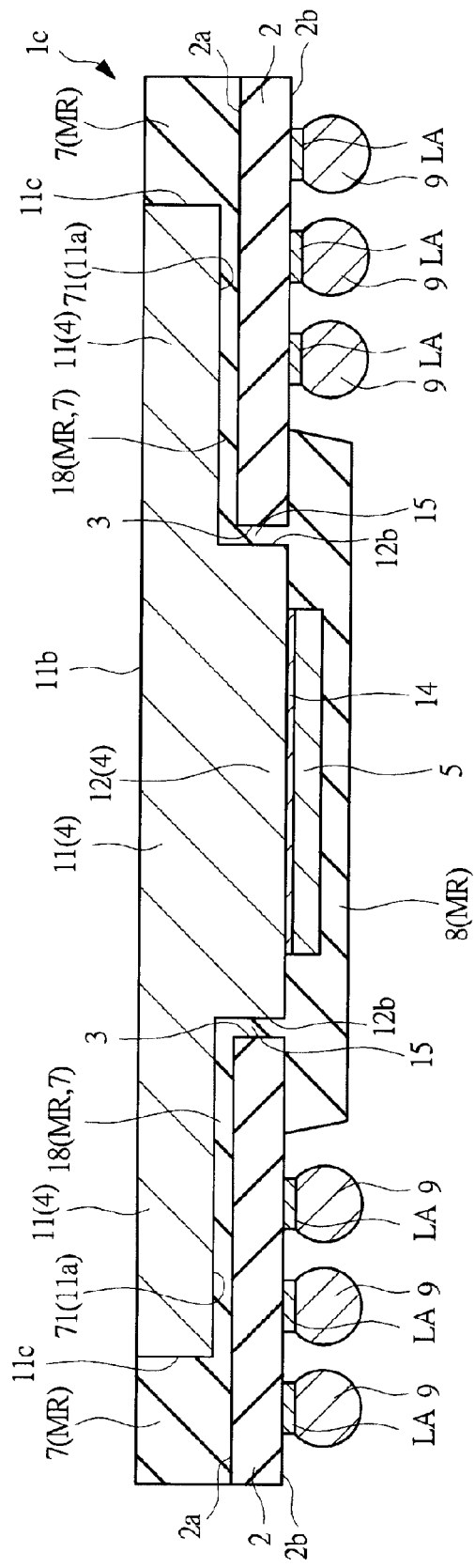
FIG. 88 is another cross-sectional view of the semiconductor device of FIG. 87.
Figure 89:
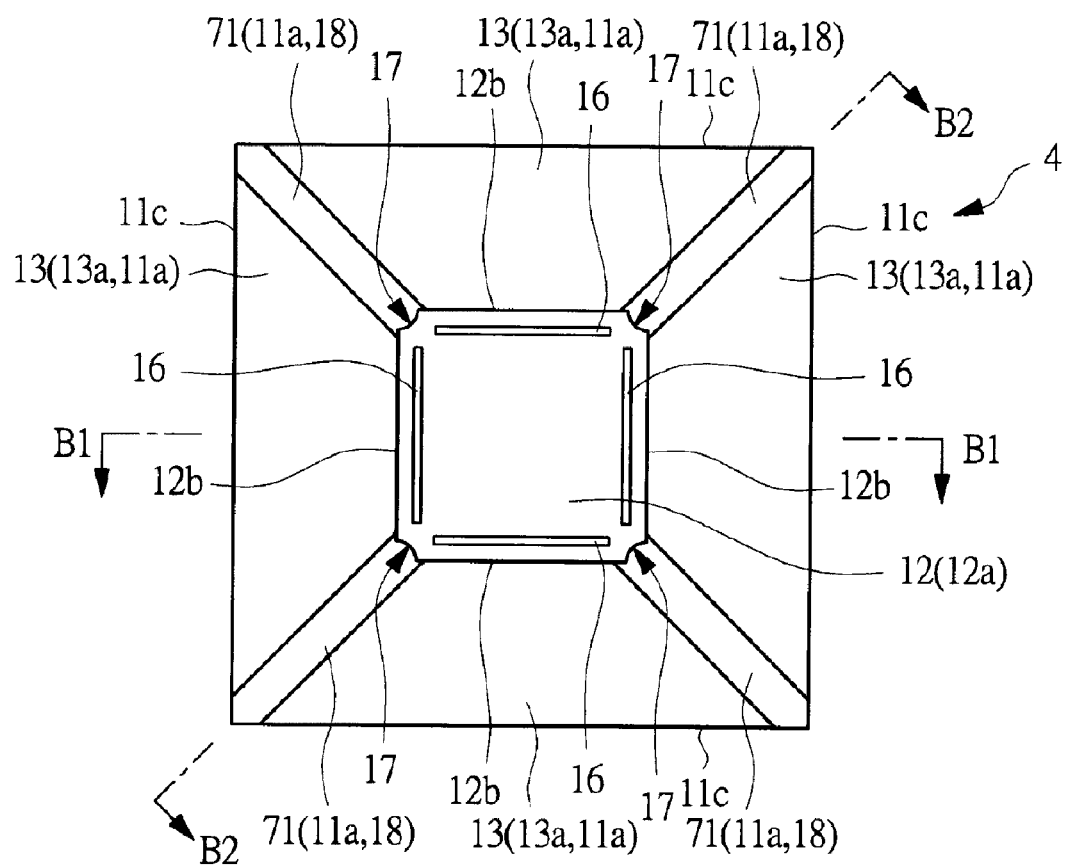
FIG. 89 is a plan view of the heat-releasing plate used in the semiconductor device of FIG. 87.

FIG. 87 and FIG. 88 are the cross-sectional views (side surface cross-sectional views) of a semiconductor device 1c of the embodiment 5, corresponding to FIG. 1 and FIG. 2 of the embodiment 1. FIG. 89 is a lower surface view (plan view) of the heat-releasing plate 4 used in the semiconductor device 1c of the embodiment 5, corresponding to FIG. 14 of the embodiment 1. The cross section of FIG. 87 is the one (the cross section along the A1-A1 line) corresponding to FIG. 1, and in view of the heat-releasing plate 4, the cross section corresponds to the one along the B1-B1 line of FIG. 89. The cross section of FIG. 88 is the one corresponding to FIG. 2 (the cross section along the A2-A2l line), and in view of the heat-releasing plate 4, the cross section corresponds to the one along the B2-B2 line of FIG. 89.

As described in the embodiment 1, the heat-releasing plate 4 integrally has: the base material part 11 having the main surface 11a facing the upper surface 2a of the wiring substrate 2; the convex part 12 positioned at central part of the main surface 11a of the base material part 11 and located in the through-hole 3 of the wiring substrate 2, protruding from the base material part 11; and the supporting part 13, formed above the main surface 11a of the base material part 11 and contacting with the upper surface 2a of the wiring substrate 2. In the heat-releasing plate 4, the convex part 12 is inserted in the through-hole 3 from the upper surface 2a side of the wiring substrate 2, and both of the base material part 11 and the supporting part 13 are located at the upper surface 2a side of the wiring substrate 2 and at the outside of the through-hole 3. The supporting part 13 is provided in order to separate the main surface 11a of the base material part 11 from the upper surface 2a of the wiring substrate 2, (or forms the gap 18), by the contact of the supporting surface 13a of the supporting part 13 with the upper surface 2a of the wiring substrate 2. The gap 18 functions as the flow passage of the resin material MR together with the gap part 15 between the side surface 12b of the convex part 12 of the heat-releasing plate 4 and the inside wall of the through-hole 3 in the step S8 of molding. To do this, the gap part 15 between the side surface 12b of the convex part 12 of the heat-releasing plate 4 and the inside wall of the through-hole 3 is necessary to connect to the side surface 11c of the base material part 11 via the gap 18 between the main surface 11a of the base material part 11 of the heat-releasing plate 4 and the upper surface 2a of the wiring substrate 2. This structure is common to that of the embodiment 1.

As seen in comparison with FIG. 89 and FIG. 14, there is a difference between the embodiment 5 and the embodiment 1 in the layout of the supporting part 13 at the main surface 11a of the base material part 11 of the heat-releasing plate 4. Other than the layout of the supporting part 13 of the main surface 11a of the base material part 11 of the heat-releasing plate 4, the semiconductor device 1c of the embodiment 5 has almost the same structure as that of the semiconductor device 1 of the embodiment 1.

That is, as illustrated in FIG. 14, the embodiment 1 locates the supporting part 13 for the main surface 11a of the base material part 11 of the heat-releasing plate 4 at a position adjacent to each of the four side surfaces 12b of the convex part 12 and at a position of avoiding the gap part 15, (the position of avoiding the four corners 17), while neither supporting part 13 nor convex part 12 is located in the outer peripheral area of the main surface 11a of the base material part 11. As a result, compared with the area of the supporting part 13, the area of the main surface 11a of the base material part 11, (the region in which neither supporting part 13 nor convex part 12 is located), becomes large, and the area of the plane region in which the gap 18 is formed, (corresponding to the plane region viewed in a plane parallel with the upper surface 2a of the wiring substrate 2), becomes larger than the area of the supporting surface 13a of the supporting part 13 contacting with the upper surface 2a of the wiring substrate 2. Owing to the structure, the step S8 of molding allows the resin material MR supplied to the upper surface 31a side (the cavity CAV1 of the upper surface 31a) of the wiring substrate 31 to easily flow, through the gap 18, to the gap part 18 between the side surface 12b of the convex part 12 of the heat-releasing plate 4 and the inside wall of the through-hole 3. Therefore, the layout of FIG. 14 is highly preferable.

Since, however, the gap 18 between the main surface 11a of the base material part 11 of the heat-releasing plate 4 and the upper surface 2a of the wiring substrate 2 is formed as the flow passage of the resin material MR, the function as the flow passage of the resin material MR, at the minimum, can be secured if only the gap part 15 between the side surface 12b of the convex part 12 of the heat-releasing plate 4 and the inside wall of the through-hole 3 is connected to the side surface 11c of the base material 11 through the gap 18 between the main surface 11a of the base material part 11 of the heat-releasing plate 4 and the upper surface 2a of the wiring substrate 2. Consequently, the layout of the supporting part 13 of the main surface 11a of the base material part 11 of the heat-releasing plate 4 can be varied in many ways. That is, the layout of the supporting part 13 can be designed so that the gap part 15 between the side surface 12b of the convex part 12 of the heat-releasing plate 4 and the inside wall of the through-hole 3 connects with the side surface 11c of the base material part 11 through the gap 18 between the main surface 11a of the base material part 11 of the heat-releasing plate 4 and the upper surface 2a of the wiring substrate 2.

For example, as illustrated in FIG. 89, in the main surface 11a (the region in which the convex part 12 is formed) of the base material part 11 of the heat-releasing plate 4, the design can be given so as to locate a region 71 (the region not contacting with the upper surface 2a of the wiring substrate 2a) sunken below the level of the supporting part 13, extending radially from the four corners 17 of the convex part 12 to the four corners of the base material part 11, thus fixing the gap 18, and so as to make use of the entire main surface 11a other than the concave region 71 as the supporting part 13 to bring into contact with the upper surface 2a of the wiring substrate 2. In this case, as seen in FIGS. 87 to 89, since the gaps 18 are formed at the four corners 17 of the convex part 12 to extend radially from the gap part 15 toward the four corners of the base material part 11, the resin material MR supplied to the upper surface 31a side (the cavity CAV1 of the upper surface 31a) of the wiring substrate 31 can be supplied to the lower surface 31b side (the cavity CAV2 of the lower surface 31b) of the wiring substrate 31 through the gap 18 and the gap part 15 is the step S8 of molding.

The present invention made by the inventor is described above in detail referring to the embodiments. The present invention is, however, not limited to these embodiments, and can be changed or modified without departing from the spirit and the scope of the invention.

The present invention is useful in being applied to the semiconductor device of the semiconductor package type and to the method of manufacturing thereof.

What is claimed is:

1. A method of manufacturing a semiconductor device, comprising the steps of:
   (a) providing a wiring substrate including a first main surface, a first rear surface opposite to the first main surface, a through-hole penetrating the wiring substrate from the first main surface to the first rear surface, a plurality of bonding leads formed over the first rear surface and formed around the through-hole in plan view, and a plurality of bump lands formed over the first rear surface and respectively coupled with the bonding leads;
   (b) providing a heat-releasing plate including a base material part having a second main surface and a second rear surface opposite to the second main surface, a convex part of the heat-releasing plate being positioned at a central part of the second main surface of the base material part and protruding from the base material part, and a supporting part formed over the second main surface of the base material part;
   (c) mounting a semiconductor chip, including a third main surface having a plurality of electrode pads, over the convex part of the heat-releasing plate;
   (d) placing the heat-releasing plate with respect to the first main surface of the wiring substrate such that the second main surface of the base material part faces the first main surface of the wiring substrate, such that the convex part is positioned in the through-hole, and such that the supporting part contacts with the first main surface of the wiring substrate;
   (e) after the step (d), fixing the heat-releasing plate to the wiring substrate;
   (f) after the step (e), coupling the electrode pads of the semiconductor chip with the bonding leads of the wiring substrate via respective conductive coupling members; and
   (g) after the step (f), sealing the semiconductor chip and the conductive coupling members with a resin material,
   wherein the convex part of the heat-releasing plate provided in the step (b) has a fourth main surface having a groove formed therein and a side surface positioned between the fourth main surface and the second main surface of the base material part, wherein the supporting part has a supporting surface positioned between the fourth main surface of the convex part and the second main surface of the base material, and a side surface positioned between the supporting surface and the second main surface of the base material, wherein, in the step (c), the semiconductor chip is mounted over the fourth main surface of the convex part, wherein, in the step (d), the heat-releasing plate is positioned with respect to the first main surface of the wiring substrate such that the side surface of the convex part positioned in the through-hole faces an inside wall of the through-hole, and wherein, in the step (e), a portion of the side surface of the convex part is brought into contact with the inside wall of the through-hole by forcibly widening the groove in the fourth main surface of the convex part, and the heat-releasing plate is thus fixed to the wiring substrate.

2. The method of manufacturing a semiconductor device according to claim 1, wherein, in the step (e), the groove in the fourth main surface of the convex part is widened forcibly by using a jig.

3. The method of manufacturing a semiconductor device according to claim 2, wherein the convex part of the heat-releasing plate has the groove in a peripheral area of the fourth main surface.

4. The method of manufacturing a semiconductor device according to claim 3, wherein, in the step (c), the semiconductor chip is mounted over the fourth main surface of the convex part at a position closer to a center of the convex part than the groove.

5. The method of manufacturing a semiconductor device according to claim 4, further comprising the step (h), after the step (g), of forming a plurality of external terminals above the bump leads directly on the wiring substrate.

6. The method of manufacturing a semiconductor device according to claim 5, wherein, after the step (e), a first gap part exists at least at one position between the side surface of the convex part and the inside wall of the through-hole, which gap part separates the side surface of the convex part from the inside wall of the through-hole and penetrates from the first main surface to the first rear surface of the wiring substrate, and wherein, in the step (g), the resin material is supplied to the first main surface side of the wiring substrate and also to the first rear surface side of the wiring substrate through the first gap part.

7. The method of manufacturing a semiconductor device according to claim 6, wherein, in the step (g), a first sealing portion is formed at the first rear surface side of the wiring substrate, and a second sealing portion is formed at the first main surface side of the wiring substrate by using the resin material, and wherein the semiconductor chip and the conductive coupling members are sealed by the first sealing portion.

8. The method of manufacturing a semiconductor device according to claim 7, wherein, after the step (e), the first gap part exists at more than one position between the side surface of the convex part and the inside wall of the through-hole.

9. The method of manufacturing a semiconductor device according to claim 8, wherein, after the step (e), the supporting part contacts with the first main surface of the wiring substrate, and a gap is formed between the second main surface of the base material part and the first main surface of the wiring substrate, and wherein, in the step (g), the resin material supplied to the first main surface side of the wiring substrate is supplied to the first rear surface side of the wiring substrate through the gap and the first gap part.

10. The method of manufacturing a semiconductor device according to claim 9, wherein, in the step (g), the resin material also fills the gap and the first gap part.

11. The method of manufacturing a semiconductor device according to claim 10, wherein the second rear surface of the base material part of the heat-releasing plate is exposed from the first sealing portion.

12. The method of manufacturing a semiconductor device according to claim 11, wherein, in the step (g), the resin material fills between the side surface of the convex part not directly contacting with the inside wall of the through-hole and the inside wall of the through-hole.

13. The method of manufacturing a semiconductor device according to claim 12, wherein a plan shape of the through-hole of the wiring substrate provided in the step (a) and a plan shape of the convex part of the heat-releasing plate provided in the step (b) are each a rectangle, and a corresponding first gap part is formed at each of the four corners of the respective rectangles.

14. The method of manufacturing a semiconductor device according to claim 13, wherein the fourth main surface of the convex part of the heat-releasing plate fixed to the wiring substrate in the step (e) is positioned at a height between the first main surface of the wiring substrate and the convex part.

15. The method of manufacturing a semiconductor device according to claim 13, wherein the fourth main surface of the convex part of the heat-releasing plate fixed to the wiring substrate in the step (e) is positioned at substantially a same height as that of the position of the first main surface of the wiring substrate.

16. The method of manufacturing a semiconductor device according to claim 1, wherein the step (d) is conducted after the step (c), and the step (d) places the heat-releasing plate with respect to the first main surface of the wiring substrate such that the convex part over which the semiconductor chip is mounted is positioned in the through-hole.

17. The method of manufacturing a semiconductor device according to claim 16, wherein, in the step (c), the semiconductor chip is mounted over and joined with the fourth main surface of the convex part of the heat-releasing plate via a solder.

18. The method of manufacturing a semiconductor device according to claim 1, wherein the step (d) is conducted before the step (c).

19. The method of manufacturing a semiconductor device according to claim 18, wherein, in the step (c), the semiconductor chip is mounted over and joined with the fourth main surface of the convex part of the heat-releasing plate via a silver paste.

* * * * *